US011435672B2

(12) United States Patent
Shibazaki

(10) Patent No.: US 11,435,672 B2
(45) Date of Patent: *Sep. 6, 2022

(54) MEASUREMENT DEVICE, LITHOGRAPHY SYSTEM AND EXPOSURE APPARATUS, AND CONTROL METHOD, OVERLAY MEASUREMENT METHOD AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,963

(22) Filed: May 20, 2020

(65) Prior Publication Data
US 2020/0285160 A1    Sep. 10, 2020

Related U.S. Application Data

(60) Division of application No. 15/673,333, filed on Aug. 9, 2017, now Pat. No. 10,698,326, which is a
(Continued)

(30) Foreign Application Priority Data

Feb. 23, 2015    (JP) .................................. 2015-032910

(51) Int. Cl.
*G03F 9/00*      (2006.01)
*G01B 11/00*     (2006.01)
(Continued)

(52) U.S. Cl.
CPC ............ *G03F 9/7046* (2013.01); *G01B 11/00* (2013.01); *G01B 11/002* (2013.01);
(Continued)

(58) Field of Classification Search
CPC .. G01B 11/00; G01B 11/002; G01D 5/34746; G03F 7/70633; G03F 7/70775;
(Continued)

(56) References Cited

U.S. PATENT DOCUMENTS 4,734,746 A    3/1988    Ushida et al.
4,780,617 A    10/1988   Umatate et al.
(Continued)

FOREIGN PATENT DOCUMENTS

CN    101364049 A    2/2009
EP    1 420 298 A2   5/2004
(Continued)

OTHER PUBLICATIONS

Oct. 1, 2020 Office Action issued in U.S. Appl. No. 16/864,250.
(Continued)

*Primary Examiner* — Deoram Persaud
(74) *Attorney, Agent, or Firm* — Oliff PLC

(57) ABSTRACT

A measurement device has: a slider which holds a substrate and is movable parallel to the XY plane; a drive system that drives the slider; a position measurement system which emits beams from a head section to a measurement surface in which grating section are provided on the slider, which receives respective return beams of the beams from the measurement surface, and which is capable of measuring position information in at least directions of three degrees of freedom including the absolute position coordinates of the slider; a mark detection system that detects a mark on the substrate; and a controller which detects the marks on the substrate using the mark detection system while controlling the drive of the slider, and which obtains the absolute position coordinates of each mark based on the detection result of each mark and measurement information by the position measurement system at the time of detection.

48 Claims, 13 Drawing Sheets

Related U.S. Application Data continuation of application No. PCT/JP2016/055132, filed on Feb. 23, 2016.

(51) Int. Cl.
  *G03F 7/20* (2006.01)
  *G01D 5/347* (2006.01)

(52) U.S. Cl.
  CPC ..... *G01D 5/34746* (2013.01); *G03F 7/70633* (2013.01); *G03F 7/70775* (2013.01)

(58) Field of Classification Search
  CPC .. G03F 9/7046; G03F 7/70725; G03F 7/7085; G03F 9/7088; G03F 9/7092
  See application file for complete search history.

(56) References Cited

U.S. PATENT DOCUMENTS

| | | |
|---|---|---|
| 5,448,332 A | 9/1995 | Sakakibara et al. |
| 5,461,237 A | 10/1995 | Wakamoto et al. |
| 5,493,403 A | 2/1996 | Nishi |
| 5,610,715 A | 3/1997 | Yoshii et al. |
| 5,646,413 A | 7/1997 | Nishi |
| 5,684,565 A | 11/1997 | Oshida et al. |
| 5,969,441 A | 10/1999 | Loopstra et al. |
| 6,208,407 B1 | 3/2001 | Loopstra |
| 6,590,634 B1 | 7/2003 | Nishi et al. |
| 6,698,944 B2 | 3/2004 | Fujita |
| 6,876,946 B2 | 4/2005 | Yasuda et al. |
| 6,952,253 B2 | 10/2005 | Lof et al. |
| 7,161,659 B2 | 1/2007 | Van Den Brink et al. |
| 7,212,286 B2 | 5/2007 | Hoshi |
| 7,238,931 B2 | 7/2007 | Nabeshima et al. |
| 7,362,446 B2 | 4/2008 | Van Der Pasch et al. |
| 7,408,642 B1 | 8/2008 | DiBiase |
| 7,561,280 B2 | 7/2009 | Schluchter et al. |
| 7,602,489 B2 | 10/2009 | Van Der Pasch et al. |
| 7,728,953 B2 | 6/2010 | Suzuki et al. |
| 7,817,242 B2 | 10/2010 | Kawakubo et al. |
| 7,838,858 B2 | 11/2010 | Okita |
| 7,892,712 B2 | 2/2011 | Shih et al. |
| 7,941,232 B2 | 5/2011 | Ishii et al. |
| 7,948,616 B2 | 5/2011 | Miyashita |
| 7,982,852 B2 | 7/2011 | Arita |
| 7,999,918 B2 | 8/2011 | Shibazaki |
| 8,027,021 B2 | 9/2011 | Shibazaki |
| 8,134,688 B2 | 3/2012 | Shibazaki |
| 8,208,128 B2 | 6/2012 | Makinouchi |
| 8,243,257 B2 | 8/2012 | Kanaya |
| 8,278,616 B2 | 10/2012 | Sato |
| 8,319,940 B2 | 11/2012 | Butler et al. |
| 8,472,008 B2 | 6/2013 | Ichinose |
| 8,566,756 B2 | 10/2013 | Okita |
| 8,599,387 B2 | 12/2013 | Hidaka |
| 8,625,072 B2 | 1/2014 | Sato |
| 8,665,455 B2 | 3/2014 | Kanaya |
| 8,711,327 B2 | 4/2014 | Shibazaki |
| 8,760,622 B2 | 6/2014 | Makinouchi |
| 8,786,829 B2 | 7/2014 | Kanaya |
| 8,902,402 B2 | 12/2014 | Shibazaki |
| 8,903,156 B2 | 12/2014 | Van De Mast et al. |
| 9,207,549 B2 | 12/2015 | Shibazaki |
| 9,470,988 B2 | 10/2016 | Van Der Pasch et al. |
| 9,703,214 B2 | 7/2017 | Miyazaki |
| 9,804,506 B2 | 10/2017 | Arai |
| 9,857,701 B2 | 1/2018 | Shibazaki |
| 9,891,531 B2 | 2/2018 | Shibazaki |
| 9,958,254 B2 | 5/2018 | de Groot et al. |
| 9,971,246 B2 | 5/2018 | Shibazaki |
| 9,983,486 B2 | 5/2018 | Shibazaki |
| 10,684,562 B2 | 6/2020 | Shibazaki |
| 10,775,708 B2 | 9/2020 | Shibazaki |
| 2001/0013927 A1 | 8/2001 | Itoh et al. |
| 2002/0041377 A1 | 4/2002 | Hagiwara et al. |
| 2002/0042664 A1 | 4/2002 | Kikuchi |
| 2002/0063856 A1 | 5/2002 | Inoue |
| 2002/0089655 A1 | 7/2002 | Kida et al. |
| 2002/0109823 A1 | 8/2002 | Binnard et al. |
| 2002/0109850 A1 | 8/2002 | Takai et al. |
| 2003/0020889 A1 | 1/2003 | Takahashi |
| 2003/0025890 A1 | 2/2003 | Nishinaga |
| 2003/0211410 A1 | 11/2003 | Irie |
| 2004/0130691 A1 | 7/2004 | Boonman et al. |
| 2004/0257550 A1 | 12/2004 | Kasumi |
| 2005/0002009 A1 | 1/2005 | Lee |
| 2005/0111005 A1 | 5/2005 | Eussen et al. |
| 2005/0168714 A1 | 8/2005 | Renkens et al. |
| 2005/0190375 A1 | 9/2005 | Akimoto |
| 2005/0255624 A1 | 11/2005 | Miyajima |
| 2005/0280791 A1 | 12/2005 | Nagasaka et al. |
| 2006/0023194 A1 | 2/2006 | Loopstra et al. |
| 2006/0139595 A1 | 6/2006 | Koenen et al. |
| 2006/0139660 A1 | 6/2006 | Patrick Kwan |
| 2006/0176464 A1 | 8/2006 | Morisada |
| 2006/0227308 A1 | 10/2006 | Brink et al. |
| 2006/0227309 A1 | 10/2006 | Loopstra et al. |
| 2006/0231206 A1 | 10/2006 | Nagasaka et al. |
| 2006/0238733 A1 | 10/2006 | Beems et al. |
| 2007/0052976 A1 | 3/2007 | Pril et al. |
| 2007/0058173 A1 | 3/2007 | Holzapfel |
| 2007/0127006 A1 | 6/2007 | Shibazaki |
| 2007/0159632 A1 | 7/2007 | Shibazaki |
| 2007/0188732 A1 | 8/2007 | Shibazaki et al. |
| 2007/0206169 A1 | 9/2007 | Butler |
| 2007/0223007 A1 | 9/2007 | Klaver et al. |
| 2007/0247640 A1 | 10/2007 | Magome et al. |
| 2007/0263191 A1 | 11/2007 | Shibazaki |
| 2007/0288121 A1 | 12/2007 | Shibazaki |
| 2008/0013089 A1 | 1/2008 | Ishii et al. |
| 2008/0013099 A1 | 1/2008 | Akimoto |
| 2008/0043212 A1 | 2/2008 | Shibazaki |
| 2008/0068571 A1 | 3/2008 | Kiuchi |
| 2008/0088843 A1 | 4/2008 | Shibazaki |
| 2008/0094592 A1 | 4/2008 | Shibazaki |
| 2008/0094604 A1 | 4/2008 | Shibazaki |
| 2008/0124662 A1 | 5/2008 | Yu |
| 2008/0137045 A1 | 6/2008 | Kiuchi |
| 2008/0158531 A1 | 7/2008 | Kiuchi |
| 2008/0165345 A1 | 7/2008 | Hill |
| 2008/0208499 A1 | 8/2008 | Miyashita |
| 2008/0240501 A1 | 10/2008 | Van Der Wijst et al. |
| 2008/0246936 A1 | 10/2008 | Loopstra et al. |
| 2008/0294280 A1 | 11/2008 | Okita |
| 2008/0299492 A1 | 12/2008 | Kiuchi et al. |
| 2008/0316460 A1 | 12/2008 | Loopstra et al. |
| 2009/0002651 A1 | 1/2009 | To |
| 2009/0009738 A1 | 1/2009 | Sasaki |
| 2009/0059194 A1 | 3/2009 | Kanaya |
| 2009/0073405 A1 | 3/2009 | Kanaya |
| 2009/0111060 A1 | 4/2009 | Shih et al. |
| 2009/0115987 A1 | 5/2009 | Butler et al. |
| 2009/0122285 A1 | 5/2009 | Kanaya |
| 2009/0128791 A1 | 5/2009 | Koenen et al. |
| 2009/0153817 A1 | 6/2009 | Kawakubo |
| 2009/0153822 A1 | 6/2009 | Shibazaki |
| 2009/0187379 A1* | 7/2009 | Itai ............... G03F 7/70525 702/179 |
| 2009/0190110 A1 | 7/2009 | Shibazaki |
| 2009/0208885 A1 | 8/2009 | Kiuchi |
| 2009/0225288 A1 | 9/2009 | Shibazaki |
| 2009/0233234 A1 | 9/2009 | Shibazaki |
| 2009/0284716 A1 | 11/2009 | Kanaya |
| 2010/0030360 A1 | 2/2010 | Habets et al. |
| 2010/0045961 A1 | 2/2010 | Li et al. |
| 2010/0104960 A1 | 4/2010 | Koga |
| 2010/0157276 A1 | 6/2010 | Shibazaki |
| 2010/0235127 A1 | 9/2010 | Kwan |
| 2011/0007295 A1 | 1/2011 | Ichinose |
| 2011/0053061 A1 | 3/2011 | Shibazaki |
| 2011/0058151 A1 | 3/2011 | Takenaka |
| 2011/0096318 A1 | 4/2011 | Yoshimoto |
| 2011/0116066 A1 | 5/2011 | Van Der Pasch et al. |
| 2013/0100427 A1 | 4/2013 | Koolen et al. |

(56) References Cited

U.S. PATENT DOCUMENTS

| | | |
|---|---|---|
| 2013/0183623 A1 | 7/2013 | Shibazaki |
| 2014/0132940 A1 | 5/2014 | Yoda |
| 2014/0191441 A1 | 7/2014 | Mori |
| 2014/0322654 A1 | 10/2014 | Sentoku et al. |
| 2015/0022796 A1 | 1/2015 | Yamaguchi et al. |
| 2015/0028506 A1 | 1/2015 | Sato |
| 2015/0070667 A1 | 3/2015 | Matsumoto |
| 2015/0316856 A1 | 11/2015 | Koenen |
| 2016/0313115 A1 | 10/2016 | Liu et al. |
| 2017/0052462 A1 | 2/2017 | Okuda |
| 2017/0160649 A1 | 6/2017 | Shibazaki |
| 2017/0255108 A1 | 9/2017 | Shibazaki |
| 2017/0322498 A1 | 11/2017 | Shibazaki |
| 2018/0039190 A1 | 2/2018 | Shibazaki |
| 2018/0039191 A1 | 2/2018 | Shibazaki |
| 2018/0046096 A1 | 2/2018 | Shibazaki |
| 2018/0067405 A1 | 3/2018 | Shibazaki |
| 2018/0081283 A1 | 3/2018 | Yasuda et al. |
| 2018/0129139 A1 | 5/2018 | Jiang et al. |
| 2018/0136557 A1 | 5/2018 | Sato |
| 2018/0136572 A1 | 5/2018 | Matsumoto |
| 2018/0164692 A1 | 6/2018 | Shibazaki |
| 2019/0257647 A1 | 8/2019 | Ichinose et al. |
| 2019/0287837 A1 | 9/2019 | Ichinose et al. |

FOREIGN PATENT DOCUMENTS

| | | |
|---|---|---|
| EP | 2 006 740 A1 | 12/2008 |
| JP | H07-086126 A | 3/1995 |
| JP | H09-289149 A | 11/1997 |
| JP | 2001-274073 A | 10/2001 |
| JP | 2004-031921 A | 1/2004 |
| JP | 2007-184342 A | 7/2007 |
| JP | 2007-184343 A | 7/2007 |
| JP | 2008-004581 A | 1/2008 |
| JP | 2010-186918 A | 8/2010 |
| JP | 2011-222610 A | 11/2011 |
| JP | 2012-99850 A | 5/2012 |
| JP | 2012-531032 A | 12/2012 |
| JP | 2015-505154 A | 2/2015 |
| TW | 511146 B | 11/2002 |
| TW | 200919100 A | 5/2009 |
| TW | 201341966 A | 10/2013 |
| WO | 2004/055803 A1 | 7/2004 |
| WO | 2004/057590 A1 | 7/2004 |
| WO | 2007/086511 A1 | 8/2007 |
| WO | 2010/147241 A2 | 12/2010 |

OTHER PUBLICATIONS

May 24, 2016 International Search Report issued in International Patent Application No. PCT/JP2016/055132.
May 24, 2016 Written Opinion issued in International Patent Application No. PCT/JP2016/055132.
Mar. 7, 2018 Office Action issued in Chinese Application No. 201680012129.1.
Jun. 26, 2018 Office Action issued in U.S. Appl. No. 15/673,333.
May 24, 2016 Search Report issued in International Application No. PCT/JP2016/055131.
May 24, 2016 Written Opinion issued in International Application No. PCT/JP2016/055131.
May 31, 2016 Search Report issued in International Application No. PCT/JP2016/055133.
May 31, 2016 Written Opinion issued in International Application No. PCT/JP2016/055133.
Jul. 20, 2018 Notice of Allowance issued in U.S. Appl. No. 15/673,303.
Nov. 6, 2018 Extended Search Report issued in European Application No. 16755435.1.
Nov. 6, 2018 Extended Search Report issued in European Application No. 16755436.9.
Nov. 6, 2018 Extended Search Report issued in European Application No. 16755437.7.
Dec. 26, 2018 Office Action issued in Chinese Application No. 201680011730.9.
Feb. 21, 2019 Office Action issued in U.S. Appl. No. 15/673,333.
Mar. 8, 2019 Office Action issued in U.S. Appl. No. 15/673,303.
English translation of CN 101364049 A.
Apr. 25, 2019 Office Action issued in Chinese Patent Application No. 201680011727.7.
Sep. 3, 2019 Office Action issued in U.S. Appl. No. 15/673,333.
Sep. 16, 2019 Office Action issued in U.S. Appl. No. 15/673,260.
Oct. 2, 2019 Office Action issued in U.S. Appl. No. 15/673,303.
Jul. 30, 2019 Office Action issued in Chinese Patent Application No. 201680012129.1.
Aug. 22, 2019 Office Action issued in Taiwanese Patent Application No. 105105389.
Oct. 14, 2019 Office Action issued in Chinese Patent Application No. 201680011727.7.
Sep. 25, 2019 Office Action issued in Chinese Patent Application No. 201680011730.9.
Oct. 22, 2019 Office Action issued in Taiwanese Patent Application No. 105105388.
Nov. 14, 2019 Office Action issued in Japanese Patent Application No. 2017-502363.
Feb. 24, 2020 Notice of Allowance issued in U.S. Appl. No. 15/673,333.
Jun. 17, 2020 Extended Search Report issued in European Patent Application No. 19212547.4.
Oct. 20, 2020 Extended Search Report issued in European Patent Application No. 20 179 217.3.
Oct. 23, 2020 Office Action issued in Japanese Patent Application No. 2020-003472.
Jun. 18, 2020 Notice of Allowance issued in U.S. Appl. No. 15/673,260.
Apr. 1, 2021 Office Action issued in U.S. Appl. No. 16/983,446.
May 12, 2021 Office Action issued in U.S. Appl. No. 16/864,250.
Apr. 27, 2021 Office Action issued in Japanese Patent Application No. 2020-104764.
Oct. 12, 2021 Office Action issued in Japanese Patent Application No. 2020-104764.
Sep. 15, 2021 Office Action issued in Chinese Patent Application No. 202010107488.3.
Aug. 24, 2021 Office Action issued in Taiwanese Patent Application No. 109124787.
Oct. 20, 2021 Office Action issued in U.S. Appl. No. 16/983,446.
Dec. 13, 2021 Office Action issued in Chinese Patent Application No. 202010107493.4.
May 24, 2022 Office Action issued in Chinese Patent Application No. 202010107488.3.
Jul. 22, 2022 Office Action issued in Chinese Patent Application No. 202010107493.4.

* cited by examiner

MEASUREMENT DEVICE, LITHOGRAPHY SYSTEM AND EXPOSURE APPARATUS, AND CONTROL METHOD, OVERLAY MEASUREMENT METHOD AND DEVICE MANUFACTURING METHOD

CROSS-REFERENCE TO RELATED APPLICATIONS

This is a divisional of U.S. patent application Ser. No. 15/673,333 filed Aug. 9, 2017 (now U.S. Pat. No. 10,698, 326), which in turn is a continuation of International Application No. PCT/JP2016/055132, with an international filing date of Feb. 23, 2016, and which claims priority from Japanese Application No. 2015-032910 filed in Japan on Feb. 23, 2015. The disclosure of each of the prior applications is hereby incorporated herein by reference in its entirety.

BACKGROUND OF THE INVENTION

Field of the Invention

The present invention relates to measurement devices, lithography systems and exposure apparatuses, and control methods, overlay measurement methods and device manufacturing methods, and more particularly to a measurement device that measures position information of a plurality of marks formed on a substrate, a lithography system that is equipped with an exposure apparatus having a substrate stage on which a substrate having completed measurement of position information of a plurality of marks with the measurement device is mounted and the measurement device, an exposure apparatus that is equipped with the measurement device, a control method to control change of arrangement of a plurality of divided areas on a substrate, an overlay measurement method whose measurement target is a substrate, and a device manufacturing method that uses the lithography system or the exposure apparatus.

Description of the Background Art

In a lithography process to manufacture devices such as semiconductors, multilayered patterns are overlaid and formed on a substrate such as a wafer or a glass plate (hereinafter generally referred to as a wafer), however, when the overlay accuracy between each of the layers is poor, the devices such as semiconductors will not be able to demonstrate predetermined circuit characteristics and in some cases turn out to be defective products. Therefore, normally, marks (alignment marks) are formed in advance in each of the plurality of shot areas on the wafer, and position (coordinate values) of the marks on a stage coordinate system of the exposure apparatus is detected. Thereafter, based on this mark position information and a known position information of a pattern to be formed anew (e.g. a reticle pattern), wafer alignment to align one shot area on the wafer with respect to the pattern is performed.

As a method of wafer alignment, enhanced global alignment (EGA) has become the main stream in which alignment marks of only some shot areas (referred to as sample shot areas or alignment shot areas) on the wafer are detected in balance with throughput and arrangement of shot areas on the wafer is calculated using a statistical technique.

However, in the case of performing overlay exposure on the wafer in the lithography process, the wafer having gone through the processing process such as resist coating, development, etching, CVD (chemical vapor deposition), and CMP (chemical mechanical polishing) may have distortion in arrangement of the shot areas in the previous layer induced by the process, which may be a cause that degrades overlay accuracy. In view of such points, recent exposure apparatuses have functions such as a grid correction function that corrects not only a primary component of wafer deformation, but also a nonlinear component or the like of the shot arrangement that occurs induced by the process (for example, refer to U.S. Patent Application Publication No. 2002/0042664).

Conventionally, control of change in a wafer grid caused by the apparatus is performed, for example, by performing overlay exposure on a reference wafer on which marks are formed using an exclusive reticle for grid (Grid) control. Wafer grid, here, refers to a grid which is formed by connecting the center of shot areas on the wafer arranged according to a shot map (data related to arrangement of shot areas formed on the wafer). In the description, the wafer grid will be shortly referred to as a "grid", or will also be described as an "arrangement of shot areas (or shots)".

Originally, although it is ideal to perform grid control of each shot map for all shot maps, this will require innumerable reticles and innumerable wafers; therefore, the reference wafer and the exclusive reticle are used.

However, since marks that can be formed on the reference wafer are limited and discrete no matter how fine the marks may be, it is difficult to control the wafer grid with the product shot map itself of the user of the exposure apparatus. Grid control using the reference wafer is also normally based on the following premise (assumption), with a kind of compromise.

a. Error of grid is coordinate dependent, having the same error when the place is the same. When position of a mark is measured, and the position is near a point where correction of the grid error has been performed, the error can be considered small.

b. Error of scanning speed, scanning acceleration or the like does not cause grid error. Supposing that grid error does occur, since the error is not an error that changes each time scanning is performed, only a one-time adjustment is enough and periodic maintenance is unnecessary.

SUMMARY OF THE INVENTION

According to a first aspect, there is provided a measurement device that measures position information of a plurality of marks formed on a substrate, comprising: a stage that is movable holding the substrate; a drive system that moves the stage; an absolute position measurement system that has one of a measurement surface having a grating section and a head section which irradiates a beam on the measurement surface installed at the stage, and can acquire position information of the stage by irradiating the beam from the head section on the measurement surface and receiving a return beam of the beam from the measurement surface; a mark detection system that detects the marks formed on the substrate; and a controller that controls movement of the stage by the drive system, detects each of the plurality of marks formed on the substrate using the mark detection system, and obtains an absolute position coordinate of each of the plurality of marks, based on detection results of each of the plurality of marks and position information of the stage obtained using the absolute position measurement system at the time of detection of each of the plurality of marks.

According to a second aspect, there is provided a lithography system, comprising: a measurement device according to the first aspect; and an exposure apparatus that has a substrate stage on which the substrate which has completed measurement of position information of the plurality of marks by the measurement device is mounted, the apparatus performing with respect to the substrate mounted on the substrate stage alignment measurement in which position information is measured for a part of the plurality of marks on the substrate that are selected and exposure on the substrate with an energy beam.

According to a third aspect, there is provided a device manufacturing method, comprising: exposing a substrate using the lithography system according to the second aspect; and developing the substrate that has been exposed.

According to a fourth aspect, there is provided an exposure apparatus, comprising: the measurement device according to the first aspect, wherein a substrate whose position information of a plurality of marks has been obtained using the measurement device is exposed with an energy beam.

According to a fifth aspect, there is provided a device manufacturing method, including: exposing a substrate using the exposure apparatus according to the fourth aspect; and developing the substrate that has been exposed.

According to a sixth aspect, there is provided a control method to control change of an arrangement of a plurality of divided areas placed in a matrix shape on a substrate, the method comprising: sequentially transferring a pattern and a mark formed on a mask on a substrate by an exposure apparatus, and forming a plurality of divided areas along with a plurality of the marks on the substrate; loading the substrate on which the plurality of divided areas are formed on a stage that is movable within a predetermined plane, and while measuring position information of the stage using an absolute position measurement system that can measure position information including absolute position coordinates within the predetermined plane by irradiating a beam via the head section on the measurement surface having the grating section provided at the stage and receiving a return beam of the beam from the measurement surface, detecting each of the plurality of marks corresponding to each of the plurality of divided areas on the substrate using a mark detection system and obtaining the absolute position coordinates within the predetermined plane of the plurality of marks corresponding to each of the plurality of divided areas on the substrate, based on detection results of each of the plurality of marks and measurement information of the absolute position measurement system at the time of detection of each of the plurality of marks; and obtaining arrangement information of the plurality of divided areas based on absolute position coordinates of the plurality of marks obtained.

According to a seventh aspect, there is provided an overlay measurement method in which a substrate serving as a measurement target has a set of a first mark image and a second mark image corresponding to the first mark image formed by an exposure of a first layer and an exposure of a second layer on the first layer serving as an underlayer formed in a plurality of numbers in a predetermined positional relation, the method comprising: loading the substrate serving as a measurement target on a stage that has one of a measurement surface having a grating section and a head section which irradiates a beam on the measurement surface, and while measuring position information of the stage using a position measurement system which can measure position information in at least directions of three degrees of freedom including absolute position coordinates in the predetermined plane of the stage by irradiating a plurality of beams via the head section on the measurement surface and receiving return beams of the plurality of beams from the measurement surface, detecting each of the plurality of sets of the first mark image and the second mark image, and based on detection results of each of the plurality of sets of the first mark image and the second mark image and measurement information of the position measurement system at the time of detection of each mark image, obtaining the absolute position coordinates within the predetermined plane of each of the plurality of sets of the first mark image and the second mark image, and obtaining overlay error based on the absolute position coordinates of the first mark image and the second mark image that mutually make a set.

BRIEF DESCRIPTION OF DRAWINGS

In the accompanying drawings;

FIG. 10 is a block diagram showing an input-output relation of an exposure controller that the exposure apparatus is equipped with;

DESCRIPTION OF EMBODIMENTS

First Embodiment

Figure 1:
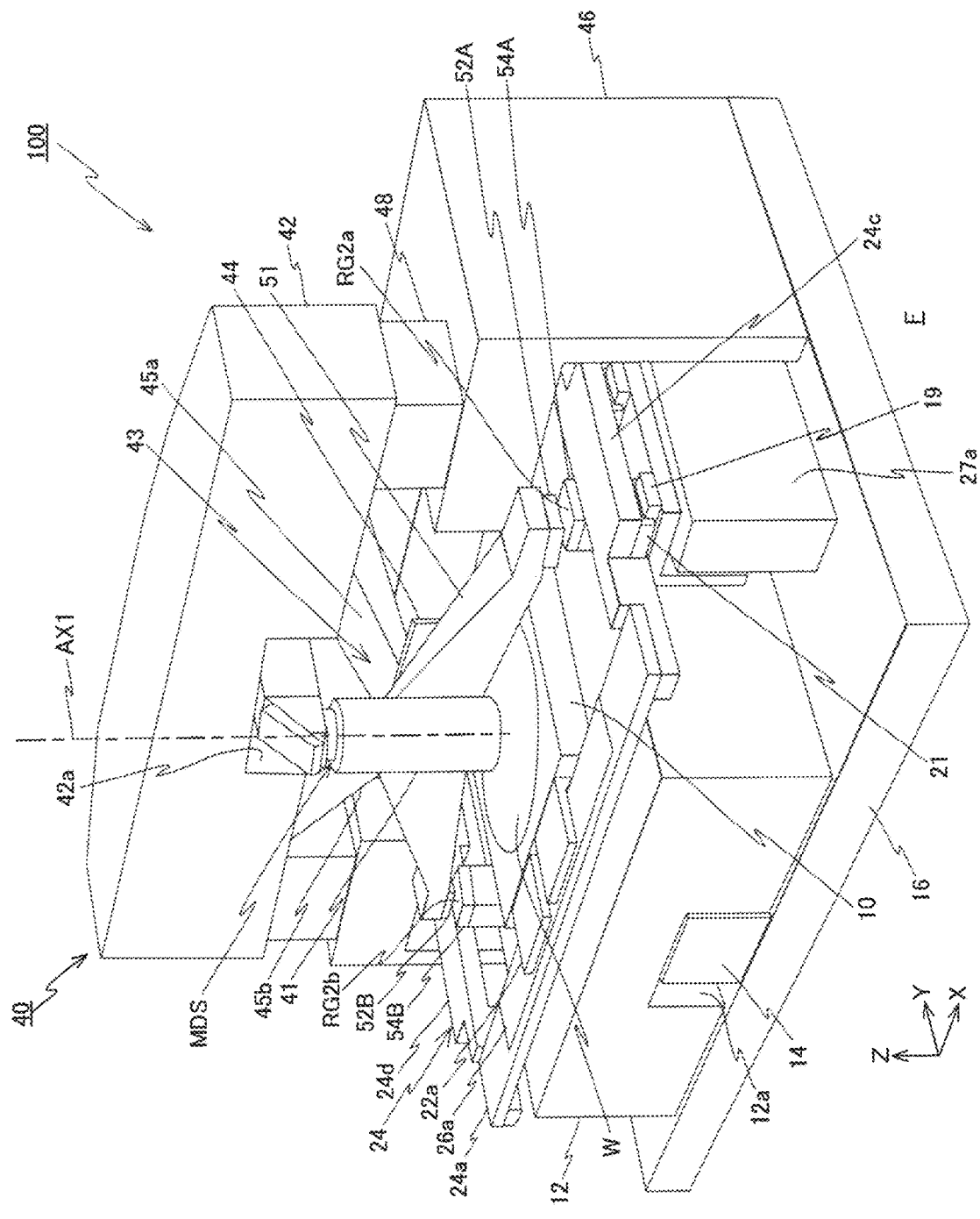
FIG. 1 is a perspective view schematically showing a structure of a measurement device according to a first embodiment.

Hereinafter, a first embodiment will be described on the basis of FIGS. 1 to 7. FIG. 1 schematically shows a structure of a measurement device 100 according to the first embodiment in a perspective view. Note that although measurement device 100 shown in FIG. 1 is actually structured by a chamber and component parts housed inside the chamber, description related to the chamber will be omitted in the embodiment. In the embodiment, a mark detection system MDS is provided as it will be described later on, and in the description below, a direction of an optical axis AX1 of mark detection system MDS will be described as a Z-axis direction, a direction in which a movable stage to be described later on moves in long strokes within a surface orthogonal to the Z-axis direction will be described as a Y-axis direction, and a direction orthogonal to the Z-axis and the Y-axis will be described as an X-axis direction, and rotation (inclination) directions around the X-axis, the Y-axis, and the Z-axis will be described as θx, θy, and θz directions, respectively. Mark detection system MDS, here, has an outer shape like a letter L when viewed from the side (e.g. when viewed from a +X direction) with a cylindrical barrel section 41 provided at the lower end (tip), and inside barrel section 41, an optical system (dioptric system) is housed consisting of a plurality of lens elements that have optical axis AX1 in the Z-axis direction. In the description, for convenience of explanation, optical axis AX1 of the dioptric system inside barrel section 41 is referred to as optical axis AX1 of mark detection system MDS.

Figure 2A:
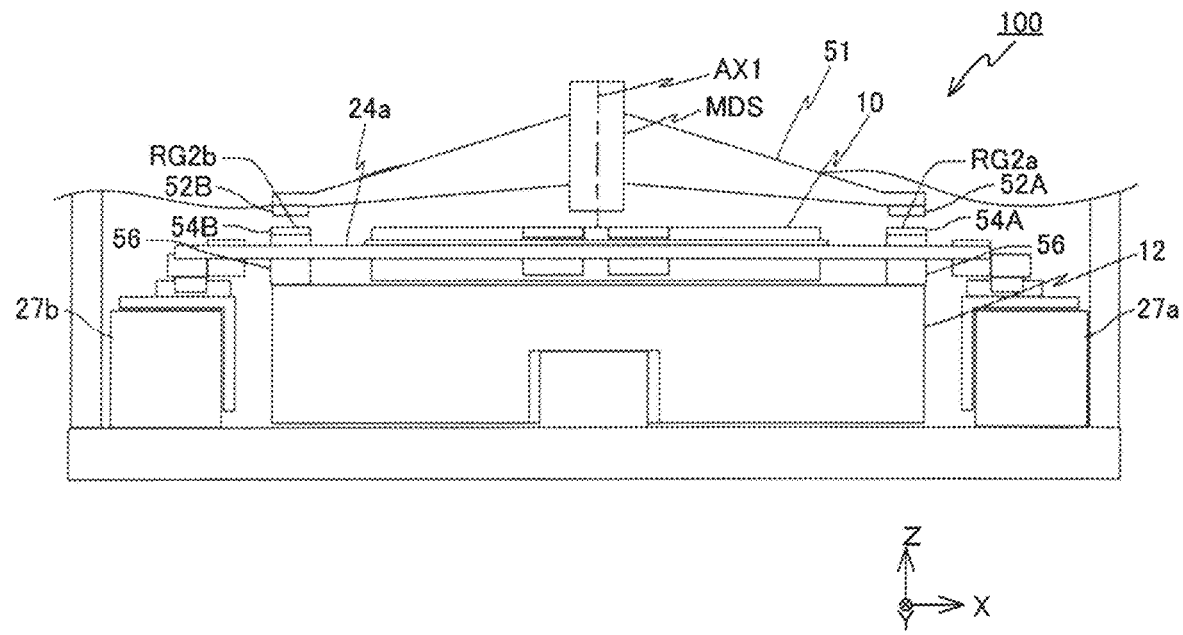
FIG. 2A is a front view of the measurement device in FIG. 1 (a view from a −Y direction) partially omitted.
Figure 2B:
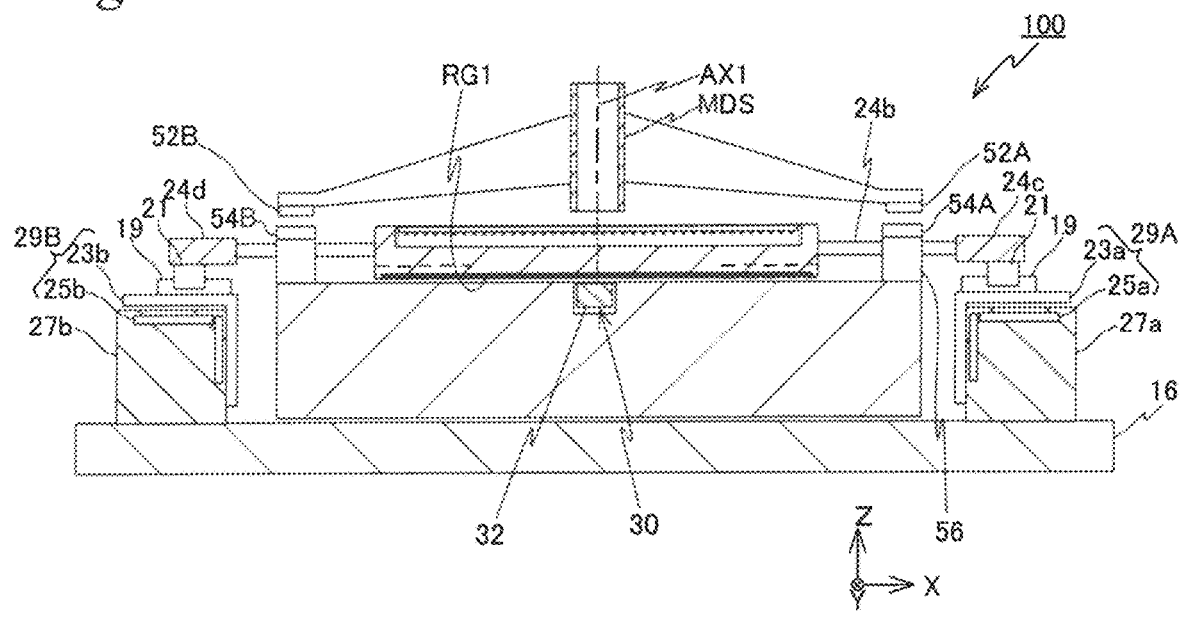
FIG. 2B is a partially omitted sectional view of the measurement device sectioned at an XZ plane that passes through an optical axis AX1.
Figure 3:
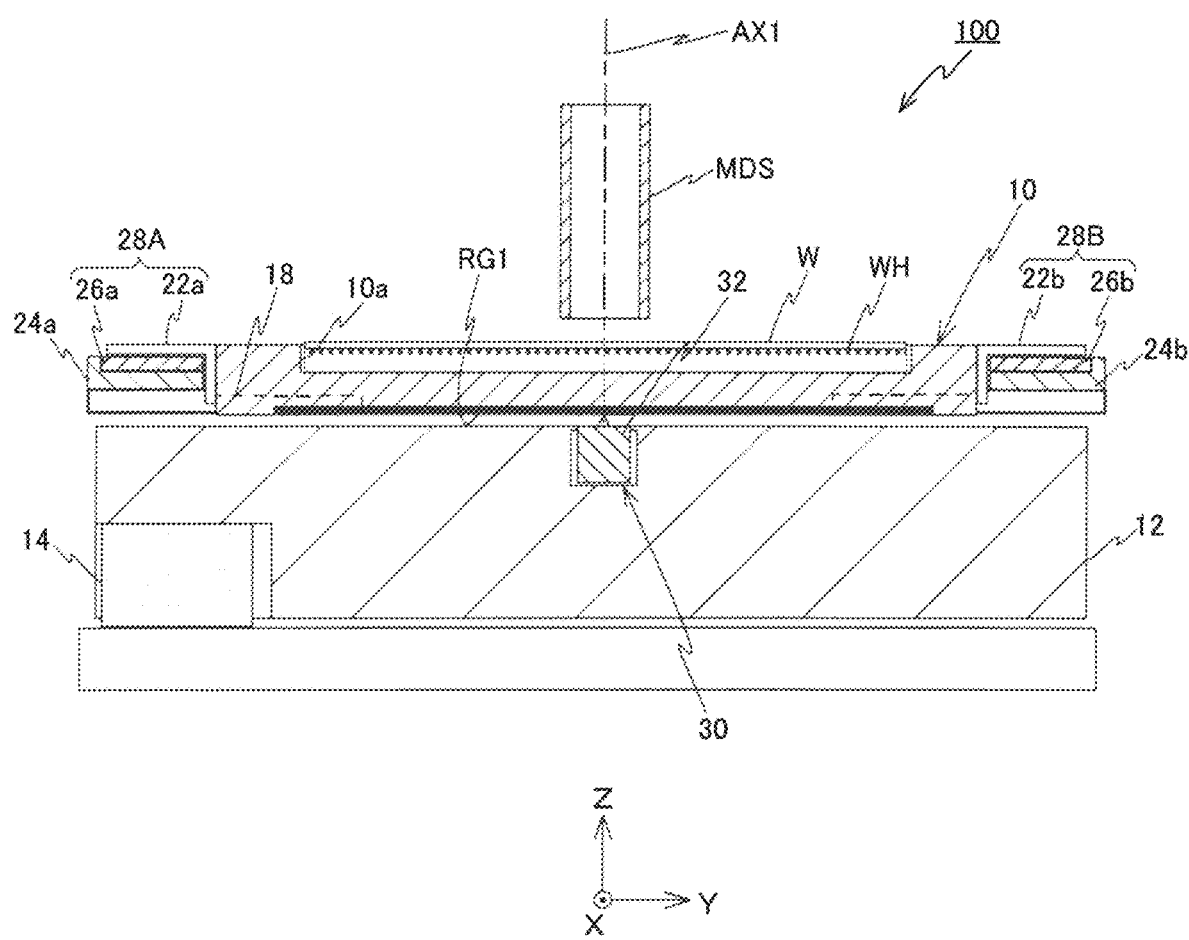
FIG. 3 shows a partially omitted sectional view of the measurement device sectioned at a YZ plane that passes through optical axis AX1 of a mark detection system.

FIG. 2A shows a front view of measurement device 100 in FIG. 1 (a view from a −Y direction) partially omitted, and FIG. 2B shows a sectional view partially omitted of measurement device 100 sectioned at an XZ plane that passes through optical axis AX1. FIG. 3 shows a sectional view partially omitted of measurement device 100 sectioned at a YZ plane that passes through optical axis AX1.

Measurement device 100, as is shown in FIG. 1, is equipped with a surface plate 12 that has an upper surface almost parallel to an XY plane orthogonal to optical axis AX, a wafer slider (hereinafter shortly referred to as a slider) 10 arranged on surface plate 12 movable in predetermined strokes in the X-axis and Y-axis directions and can also finely move (infinitesimal displacement) in the θx, θy and θz directions holding a wafer W with respect to surface plate 12, a drive system 20 that moves slider 10 (not shown in FIG. 1, refer to FIG. 6), a first position measurement system 30 (not shown in FIG. 1, refer to FIGS. 3 and 6) that measures position information of slider 10 with respect to surface plate 12 in each of the X-axis, the Y-axis, the Z-axis, the θx, the θy, and the θz directions (hereinafter described as directions of six degrees of freedom), a measurement unit 40 that has mark detection system MDS to detect a mark on wafer W loaded on (held by) slider 10, a second position measurement system 50 (not shown in FIG. 1, refer to FIG. 6) that measures relative position information between mark detection system MDS (measurement unit 40) and surface plate 12, and a controller 60 (not shown in FIG. 1, refer to FIG. 6) that acquires measurement information with the first position measurement system 30 and measurement information with the second position measurement system 50 while controlling the movement of slider 10 with drive system 20 and obtaining position information of a plurality of marks on wafer W held by slider 10 using mark detection system MDS.

Surface plate 12 consists of a rectangular solid member with a rectangular shape (or a square shape) in a planar view, and its upper surface is finished to have an extremely high flatness so that a guide surface is formed for slider 10 when the slider moves. As the material for surface plate 12, a low thermal expansion coefficient material also called a zero thermal expansion material is used such as, e.g. an invar alloy, an extremely low expansion cast steel, or an extremely low expansion glass ceramics.

Surface plate 12 has a cutout shaped space 12a whose bottom section is open formed at a total of three places; one at the center in the X-axis direction at a surface on a −Y side, and one each at both ends in the X-axis direction at a surface on a +Y side. Of the three spaces 12a, FIG. 1 shows space 12a formed at the surface on the −Y side. Inside each space 12a, a vibration isolator 14 is arranged. Surface plate 12 is supported at three points by three vibration isolators 14 on an upper surface parallel to an XY plane of a base frame 16 having a rectangular shape in a planar view installed on a floor F, so that the upper surface becomes almost parallel with the XY plane. Note that the number of vibration isolators 14 is not limited to three.

Slider 10, as is shown in FIG. 3, has a total of four air hydrostatic bearings (air bearings) 18, each attached at the four corners to the bottom surface in a state with each bearing surface almost coplanar with the lower surface of slider 10, and by static pressure (pressure in gap) between the bearing surface and the upper surface (guide surface) of surface plate 12 of pressurized air blowing out toward surface plate 12 from the four air bearings 18, slider 10 is supported by levitation via a predetermined clearance (air-gap, gap), e.g. a clearance of several μm, on the upper surface of surface plate 12. In the embodiment, slider 10 uses zero thermal expansion glass (e.g. Zerodur of Schott AG) as its material which is a kind of zero thermal expansion material.

In the upper part of slider 10, a recess section 10a of a predetermined depth is formed that has a circular shape in a planar view whose inner diameter is slightly larger than the diameter of wafer W, and inside recess section 10a, a wafer holder WH is arranged whose diameter is almost the same as the diameter of wafer W. As wafer holder WH, while a vacuum chuck, an electrostatic chuck, or a mechanical chuck can be used, a vacuum chuck of a pin chuck method is to be used as an example. Wafer W is held by suction by wafer holder WH in a state where its upper surface is almost flush with the upper surface of slider 10. In wafer holder WH, a plurality of suction ports are formed and the plurality of suction ports are connected to a vacuum pump 11 (refer to FIG. 6) via a vacuum piping system not shown. And operations such as on/off of vacuum pump 11 are controlled by controller 60. Note that one of, or both of slider 10 and wafer holder WH may be referred to as a "first substrate holding member".

Slider 10 also has a vertical movement member (not shown) which moves vertically, for example, via three circular openings formed in wafer holder WH, and loads the wafer together with a wafer carrier system 70 (not shown in FIG. 1, refer to FIG. 6) onto wafer holder WH as well as unload the wafer from wafer holder WH. A driver 13 that moves the vertical movement member is controlled by controller 60 (refer to FIG. 6).

In the embodiment, as wafer holder WH, a holder with a size that can hold by suction a 300 mm wafer having a diameter of 300 mm is to be used as an example. Note that in the case wafer carrier system 70 has a non-contact holding member that holds by suction the wafer on wafer holder WH from above in a non-contact manner such as a Bernoulli chuck, slider 10 does not require the vertical movement member and therefore the circular opening for wafer holder WH also does not have to be formed.

As is shown in FIGS. 2B and 3, on the lower surface of slider 10 in an area slightly larger than wafer W, a two-dimensional grating (hereinafter simply referred to as grating) RG1 is placed horizontally (parallel to the wafer W surface). Grating RG1 includes a reflection type diffraction grating (X diffraction grating) whose periodic direction is in the X-axis direction and a reflective diffraction grating (Y diffraction grating) whose periodic direction is in the Y-axis direction. The X diffraction grating and the Y diffraction grating have grid lines whose pitch is set, for example, to 1 μm.

Vibration isolator 14 is an active type vibration isolation system (so-called AVIS (Active Vibration Isolation System)) that is equipped with an accelerometer, a displacement sensor (e.g. a capacitive sensor), an actuator (e.g. a voice coil motor), an air mount which functions as an air damper, and the like. Vibration isolator 14 can attenuate vibration of relatively high frequency with the air mount (air damper) and can also isolate vibration (control vibration) with the actuator. Consequently, vibration isolator 14 can avoid vibration from traveling between surface plate 14 and base frame. Note that a hydraulic power damper may be used instead of the air mount (air damper).

Here, the reason why the actuator is provided in addition to the air mount is because since the internal pressure of the gas within the gas chamber of the air mount is high, control response can be secured only to around 20 Hz, therefore, when control of high response is necessary, the actuator has to be controlled according to the output of the accelerometer not shown. However, fine vibration such as floor vibration is isolated by the air mount.

The upper end surface of vibration isolator 14 is connected to surface plate 12. Air (e.g. compressed air) can be supplied to the air mount via a gas supply port not shown, and the air mount expands/contracts in predetermined strokes (e.g. around 1 mm) in the Z-axis direction according to the amount of gas (pressure change of the compressed air) filled inside the air mount. Therefore, by vertically moving individually from below the three places of surface plate 12 using the air mounts that each of the three vibration isolators 14 have, position in the Z-axis direction, the θx direction, and the θy direction of surface plate 12 and slider 10 supported by levitation on the surface plate can be adjusted arbitrarily. The actuator of vibration isolator 14 not only moves surface plate 12 in the Z-axis direction, but also can move the surface plate in the X-axis direction and the Y-axis direction. Note that movement quantity in the X-axis direction and the Y-axis direction is smaller than the movement quantity in the Z-axis direction. The three vibration isolators 14 are connected to controller 60 (refer to FIG. 6). Note that each of the three vibration isolators 14 may be equipped with an actuator that can move surface plate 12 not only in the X-axis direction, the Y-axis direction, and the Z-axis direction, but also in, e.g. directions of six degrees of freedom. Controller 60 at all times controls the actuators of the three vibration isolators 14 real time so that position in directions of six degrees of freedom of surface plate 12 to which a head section 32 of the first position measurement system 30 to be described later on is fixed maintains a desired positional relation with respect to mark detection system MDS, based on relative position information between mark detection system MDS (measurement unit 40) and surface plate 12 measured by the second position measurement system 50. Note that feedforward control can be performed on each of the three vibration isolators 14. For example, controller 60 may perform feedforward control on each of the three vibration isolators 14 based on measurement information of the first position measurement system 30. Control of vibration isolator 14 by controller 60 is to be described further later on.

Figure 6:
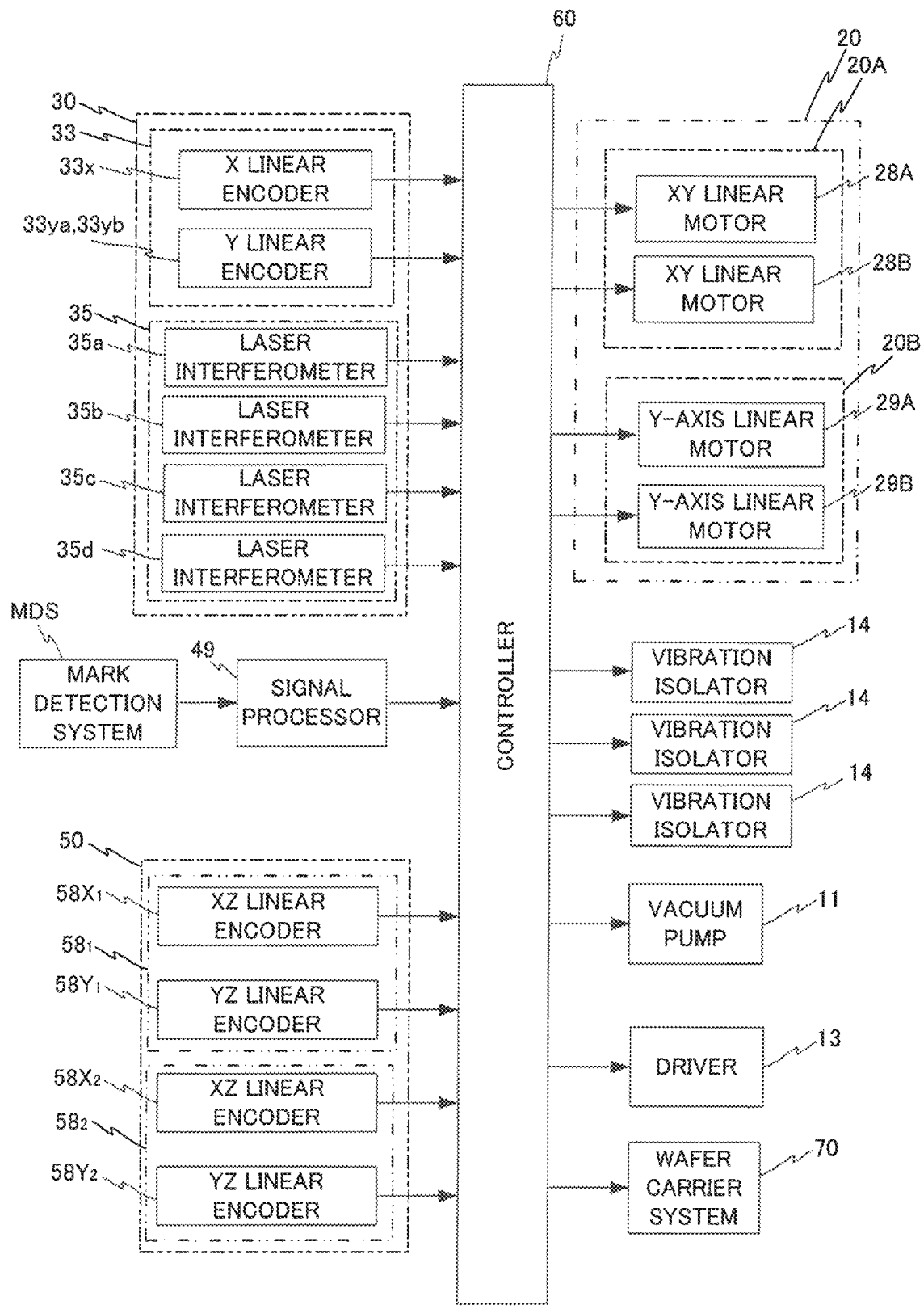
FIG. 6 shows a block diagram of an input-output relation of a controller that mainly structures a control system of the measurement device according to the first embodiment.

Drive system 20, as is shown in FIG. 6, includes a first driver 20A that moves slider 10 in the X-axis direction and a second driver 20B that moves slider 10 in the Y-axis direction integrally with the first driver 20A.

As it can be seen from FIGS. 1 and 3, on a side surface at the −Y side of slider 10, a pair of movers 22a each consisting of a magnet unit (or a coil unit) having an inverted L-shape in a side view is fixed at a predetermined spacing in the X-axis direction. On the side surface at the +Y side of slider 10, as is shown in FIG. 3, a pair of movers 22b (mover 22b at the +X side is not shown) each consisting of a magnet unit (or a coil unit) is fixed at a predetermined spacing in the X-axis direction. Although the pair of movers 22a and the pair of movers 22b are placed symmetrical, they have a structure similar to one another.

Movers 22a and 22b, as is shown in FIGS. 1 to 3, are placed a predetermined distance apart in the Y-axis direction structuring a part of movable stage 24 which has a rectangular frame shape in a planar view, and is supported in a non-contact manner on an upper surface substantially parallel to an XY plane of a pair of plate members 24a and 24b that each extend in the X-axis direction. That is, at a lower surface of movers 22a and 22b (a surface that face plate members 24a and 24b, respectively) air bearings (not shown) are provided, and by a levitation force (static pressure of pressurized air) generated to plate members 24a and 24b generated with these air bearings, movers 22a and 22ba are supported in a non-contact manner from below by movable stage 24. Note that self-weight of slider 10 to which each pair of movers 22a and 22b are fixed is supported by the levitation force that the four air bearings 18 generate with respect to surface plate 12, as is previously described.

On the upper surface of each of the pair of plate members 24a and 24b, as is shown in FIGS. 1 to 3, stators 26a and 26b consisting of a magnet unit (or a coil unit) are placed in an area excluding both ends in the X-axis direction.

Electromagnetic interaction between the pair of movers 22a and stator 26a generate a movement force (electromagnetic force) for driving the pair of movers 22a in the X-axis direction and a movement force (electromagnetic force) for driving the pair of movers 22a in the Y-axis direction, and electromagnetic interaction between the pair of movers 22b and stator 26b generate a movement force (electromagnetic force) for driving the pair of movers 22b in the X-axis direction and a movement force (electromagnetic force) for driving the pair of movers 22b in the Y-axis direction. That is, the pair of movers 22a and stator 26a structure an XY linear motor 28A that generates a movement force in the X-axis direction and the Y-axis direction, the pair of movers 22b and stator 26b structure an XY linear motor 28B that generates a movement force in the X-axis direction and the Y-axis direction, and XY linear motor 28A and XY linear motor 28B structure the first driver 20A that moves slider 10 with predetermined strokes in the X-axis direction as well as finely move the slider in the Y-axis direction (refer to FIG. 6). The first driver 20A can move slider 10 in the θz direction by making the magnitude of each of the movement forces in the X-axis direction generated by XY linear motor 28A and XY linear motor 28B different. The first driver 20A is controlled by controller 60 (refer to FIG. 6). In the embodiment, while the first driver 20A generates not only a movement force in the X-axis direction but also a movement force in the Y-axis direction from the relation of structuring a coarse/fine movement drive system that drives slider 10 in the Y-axis direction with the first driver 20A as well as the second driver to be described later on, the first driver 20A does not necessarily have to generate the movement force in the Y-axis direction.

Movable stage 24 has the pair of plate members 24a and 24b and a pair of connecting members 24c and 24d placed a predetermined distance apart in the X-axis direction each extending in the Y-axis direction. A step section is formed at both ends in the Y-axis direction of connecting members 24c and 24d. Connecting members 24c and 24d and plate member 24a are integrated in a state where one end and the other end in the longitudinal direction of plate member 24a are mounted on the step sections at the −Y side of each of the connecting members 24c and 24d. Also, connecting members 24c and 24d and plate member 24b are integrated in a state where one end and the other end in the longitudinal direction of plate member 24b are mounted on the step sections at the +Y side of each of the connecting members 24c and 24d (refer to FIG. 2B). That is, in this manner, the pair of plate members 24a and 24b is connected with the pair of connecting members 24c and 24d to structure the frame shaped movable stage 24.

As is shown in FIGS. 1 and 2A, near both ends in the X-axis direction on the upper surface of base frame 16, a pair of linear guides 27a and 27b is fixed extending in the Y-axis direction. Inside one of the linear guides 27a positioned at the +X side, a stator 25a (refer to FIG. 2B) of a Y-axis linear motor 29A consisting of a coil unit (or a magnet unit) that covers almost the total length in the Y-axis direction is housed on the upper surface and a surface near the −X side. Facing the upper surface and the surface near the −X side of linear guide 27a, a mover 23a is placed consisting of a magnet unit (or coil unit) having an L-shaped cross sectional surface that structures Y-axis linear motor 29A along with stator 25a. To the lower surface and the surface at the +X side of mover 23a that face the upper surface and the surface at the −X side of linear guide 27a, respectively, air bearings are fixed that blow out pressurized air to the opposing surface. Of the air bearings, especially as the air bearings fixed to the surface at the +X side of mover 23a, vacuum preloaded air bearings are used. The vacuum preloaded air bearings maintain a clearance (space, gap) in the X-axis direction between mover 23a and linear guide 27a at a constant value by balancing the static pressure of the pressurized air and the vacuum preload force between the bearing surface and linear guide 27a.

On the upper surface of mover 23a, a plurality of X guides 19 consisting of, for example, two rectangular solid members, are fixed spaced apart at a predetermined distance in the Y-axis direction. Each of the two X guides 19 is engaged in a non-contact manner with a slide member 21 having an inversed U sectional shape that structures a uniaxial guide device along with X guide 19. Air bearings are provided at each of the three surfaces of slide member 21 that face X guide 19.

The two slide members 21, as is shown in FIG. 1, are each fixed to the lower surface (surface at the −Z side) of connecting member 24c.

The other linear guide 27b positioned at the −X side houses inside a stator 25b of a Y-axis linear motor 29B consisting of a coil unit (or a magnet unit), and is structured similar to linear guide 27a except for being symmetric (refer to FIG. 2B). Facing the upper surface and the surface near the +X side of linear guide 27b, a mover 23b is placed consisting of a magnet unit (or coil unit) which is symmetric but has an L-shaped cross sectional surface similar to mover 23a that structures Y-axis linear motor 29B along with stator 25b. Facing each of the upper surface and the surface at the +X side of linear guide 27b, air bearings are fixed to each of the lower surface and the surface at the −X side of mover 23b, and especially as the air bearings fixed to the surface at the −X side of mover 23b, vacuum preloaded air bearings are used. By the vacuum preloaded air bearings, the clearance (void, gap) in the X-axis direction between mover 23b and linear guide 27b is maintained at a constant value.

Between the upper surface of mover 23b and the bottom surface of connecting member 24d, as is previously described, two uniaxial guide devices structured by X guide 19 and slide member 21 that engages with X guide 19 in a non-contact manner are provided.

Movable stage 24 is supported from below by movers 23a and 23b via two each of (a total of four) uniaxial guide devices on the +X side and the −X side, and is movable in the X-axis direction on mover 23a and 23b. Therefore, by the first driver 20A previously described, when slider 10 is driven in the X-axis direction, reaction force of the movement force acts on movable stage 24 in which stators 26a and 26b are provided and movable stage 24 moves in a direction opposite to slider 10 according to the momentum conservation law. That is, the movement of movable stage 24 prevents (or effectively suppresses) generation of vibration caused by the reaction force of the movement force in the X-axis direction to slider 10. That is, movable stage 24 functions as a counter mass when slider 10 moves in the X-axis direction. However, movable stage 24 does not necessarily have to function as a counter mass. Note that a counter mass may be provided to prevent (or effectively suppress) generation of vibration caused by the movement force to move slider 10 in the Y-axis direction with respect to movable stage 24, although it is not provided here in particular since slider 10 only moves finely in the Y-axis direction with respect to movable stage 24.

Y-axis linear motor 29A generates a movement force (electromagnetic force) that moves mover 23a in the Y-axis direction by electromagnetic interaction between mover 23a and stator 25a, and Y-axis linear motor 29B generates a movement force (electromagnetic force) that moves mover 23b in the Y-axis direction by electromagnetic interaction between mover 23b and stator 25b.

The movement force in the Y-axis direction that Y-axis linear motors 29A and 29B generate acts on movable stage 24 via two each of the uniaxial guide devices at the +X side and the −X side. This allows slider 10 to be moved in the Y-axis direction integrally with movable stage 24. That is, in the embodiment, movable stage 24, the four uniaxial guide devices, and the pair of Y-axis linear motors 29A and 29B structure the second driver 20B (refer to FIG. 6) that moves slider 10 in the Y-axis direction.

In the embodiment, the pair of Y-axis linear motors 29A and 29B is physically separated from surface plate 12 and is also vibrationally separated by the three vibration isolators 14. Note that linear guides 27a and 27b in which stators 25a and 25b of the pair of Y-axis linear motors 29A and 29B provided may be structured movable in the Y-axis direction with respect to base frame 16, so that the linear guides may function as a counter mass when driving slider 10 in the Y-axis direction.

Measurement unit 40, as is shown in FIG. 1, has a unit main section 42 that has a cutout shaped space 42a having an opening at a bottom section formed at a surface on the −Y side, mark detection system MDS previously described connected to unit main section 42 in a state where a base end is inserted into space 42a, and a connection mechanism 43 that connects barrel section 41 at the tip of mark detection system MDS to unit main section 42.

Connection mechanism 43 includes a support plate 44 that supports barrel section 41 from the back side (the +Y side) via a mounting member (not shown), and a pair of support arms 45a and 45b whose one end respectively supports support plate 44 and the other end is respectively fixed to the bottom surface of unit main section 42.

In the embodiment, corresponding to the point that a sensitive agent (resist) is coated on the upper surface of the wafer held on slider 10, a system using a detection beam having a wavelength that is not sensitive to the resist is used as mark detection system MDS. As mark detection system MDS, for example, an FIA (Field Image Alignment) system of an image processing method is used that irradiates a broadband detection beam which does not expose the resist coated on the wafer on a target mark, images an image of the target mark formed on a light receiving surface by the reflection light from the target mark and an image of an index (not shown) (an index pattern on an index plate provided inside) using an imaging device (such as a CCD), and outputs their imaging signals. The imaging signals from mark detection system MDS are supplied to controller 60 (refer to FIG. 7) via a signal processor 49 (not shown in FIG. 1, refer to FIG. 7). Mark detection system MDS has an alignment auto-focus function that adjusts the focal position of the optical systems.

Between barrel section 41 and support plate 44, as is shown in FIG. 1, a head mounting member 51 with a rough isosceles triangle shape is placed. In head mounting member 51, an opening section penetrating in the Y-axis direction of FIG. 1 is formed and barrel section 41 is attached to (fixed to) support plate 44 via the mounting member (not shown) inserted in the opening section. Head mounting member 51 also has its rear surface fixed to support plate 44. In this manner, barrel section 41 (mark detection system MDS), head mounting member 51, and support plate 44 are integrated with unit main section 42, via the pair of support arms 45a and 45b.

Inside unit main section 42, signal processor 49 and the like previously described are placed that performs processing on the imaging signals output as detection signals from mark detection system MDS, calculates position information of the target mark with respect to the detection center, and outputs the information to controller 60. Unit main section 42 is supported at three points from below via, e.g. three vibration isolators 48 on a support frame 46 having a portal shape when viewed from the −Y side installed on base frame 16. Each vibration isolator 48 is an active type vibration isolation system (a so-called AVIS (Active Vibration Isolation System) and is equipped with an accelerometer, a displacement sensor (e.g. a capacitive sensor or the like), an actuator (e.g. a voice coil motor or the like), a mechanical damper such as an air damper or a hydraulic damper and the like, and vibration isolator 48 can attenuate relatively high frequency vibration with the mechanical damper as well as isolate vibration (control vibration) with the actuator. Consequently, each vibration isolator 48 can avoid relatively high frequency vibration from traveling between support frame 46 and unit main section 42.

Note that mark detection system MDS is not limited to the FIA system, and for example, a diffracted light interference type alignment detection system may also be used that irradiates a coherent detection light on the subject mark, makes two diffracted lights (e.g. diffracted lights of the same order or diffracted lights diffracted in the same direction) generated from the target mark interfere with each other, and detects the interfered light and outputs the detection signals, instead of the FIA system. Or, the diffracted light interference type alignment system may be used with the FIA system and the two target marks may be detected simultaneously. Furthermore, as mark detection system MDS, a beam scan type alignment system that scans a measurement beam in a predetermined direction with respect to a target mark while slider 10 is moved in a predetermined direction may also be used. Also, in the embodiment, while mark detection system MDS has the alignment auto-focus function, instead of or in addition to this, measurement unit 40 may be equipped with a focal position detection system such as a multi-point focal position detection system of an oblique incidence method having a structure similar to the one disclosed in, for example, U.S. Pat. No. 5,448,332.

The first position measurement system 30, as is shown in FIGS. 2B and 3, is placed within a recess section formed on the upper surface of surface plate 12 and has head section 32 fixed to surface plate 12. The upper surface of head section 32 faces the lower surface of slider 10 (forming surface of grating RG1). A predetermined clearance (void, gap), e.g. a clearance of several mm, is formed between the upper surface of head section 32 and the lower surface of slider 10.

The first position measurement system 30, as is shown in FIG. 6, is equipped with an encoder system 33 and a laser interferometer system 35. Encoder system 33 can acquire position information of slider 10 by irradiating a plurality of beams from head section 32 on a measurement section (forming surface of grating RG1) on the lower surface of slider 10 as well as receiving a plurality of return beams (e.g. a plurality of diffracted beams from grating RG1) from the measurement section on the lower surface of slider 10. Encoder system 33 includes an X linear encoder $33x$ which measures position in the X-axis direction of slider 10 and a pair of Y linear encoders $33ya$ and $33yb$ which measure position in the Y-axis direction of slider 10. In encoder system 33, a head of a diffraction interference type having a structure similar to the encoder head disclosed in, for example, U.S. Pat. No. 7,238,931, U.S. Patent Application Publication No. 2007/0288121 and the like (hereinafter shortly referred to as an encoder head as appropriate) is used. Note that while a head includes a light source, a light receiving system (including a photodetector), and an optical system, in the embodiment, of these parts, only at least the optical system has to be placed inside the housing of head section 32 facing grating RG1, and at least one of the light source and the light receiving system may be placed outside of the housing of head section 32.

Figure 4A:
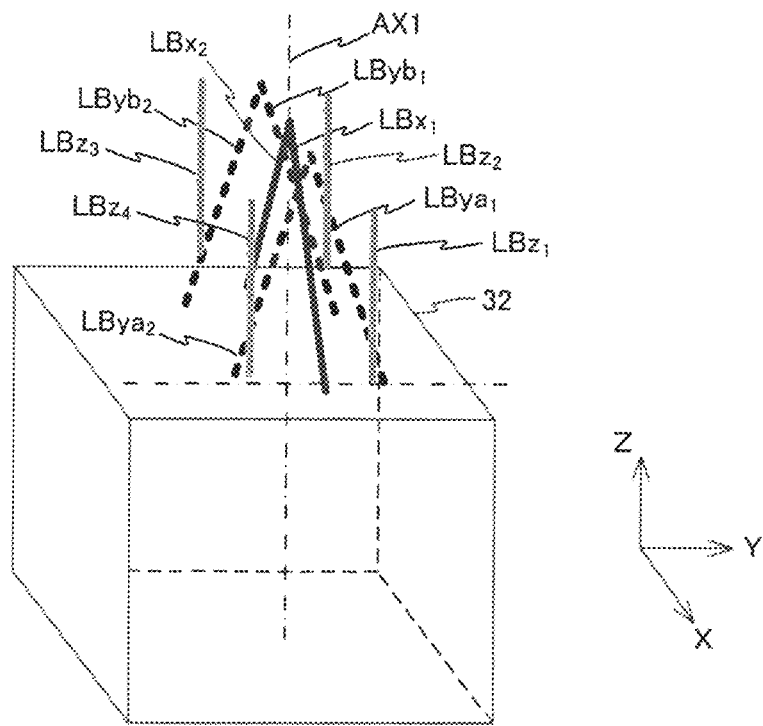
FIG. 4A is a perspective view showing a head section of a first position measurement system.
Figure 4B:
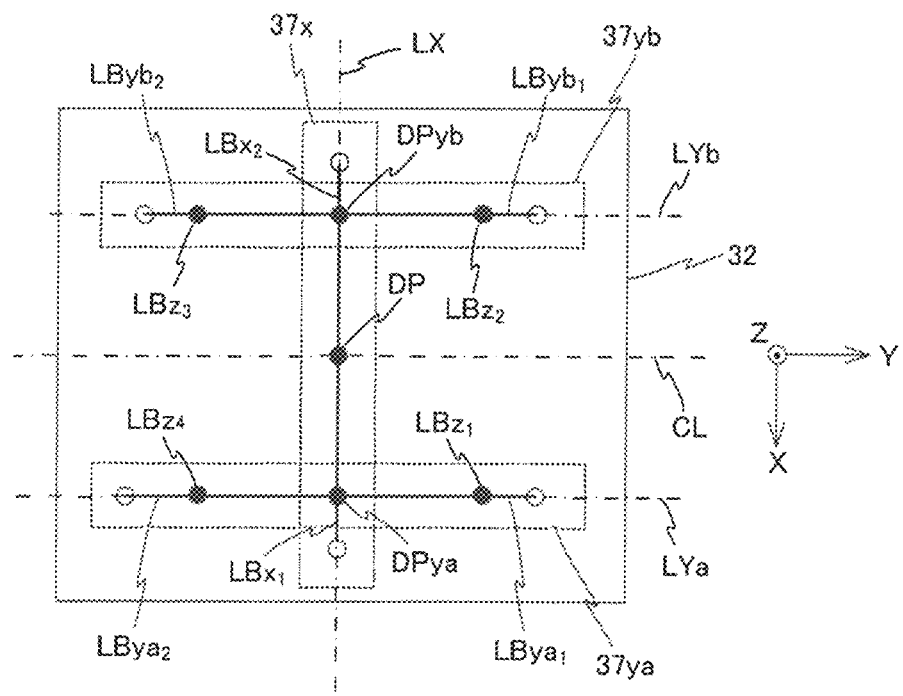
FIG. 4B is a planar view (a view from a +Z direction) of the head section of the first position measurement system.

FIG. 4A shows head section 32 in a perspective view, and FIG. 4B shows the upper surface of head section 32 in a planar view when viewed from a +Z direction. Encoder system 33 measures the position in the X-axis direction of slider 10 with one X head $37x$, and measures the position in the Y-axis direction with a pair of Y heads $37ya$ and $37yb$ (refer to FIG. 4B). That is, X linear encoder $33x$ previously described is structured by X head $37x$ which measures the position in the X-axis direction of slider 10 using an X diffraction grating of grating RG1, and the pair of Y linear encoders $33ya$ and $33yb$ is structured by the pair of Y heads $37ya$ and $37yb$ which measure the position in the Y-axis direction of slider 10 using a Y diffraction grating of grating RG1.

As is shown in FIGS. 4A and 4B, on a straight line LX which passes through the center of head section 32 and is parallel to the X-axis, X head $37x$ irradiates measurement beams $LBx_1$ and $LBx_2$ (indicated by a solid line in FIG. 4A) on the same irradiation point on grating RG1 from two points (refer to white circles in FIG. 4B) equidistant from a straight line CL which passes through the center of head section 32 and is parallel to the Y-axis. Position in the X-axis direction and the Y-axis direction of the irradiation points of measurement beams $LBx_1$ and $LBx_2$, that is, detection points of X head 37x (refer to reference code DP in FIG. 4B), coincides with the detection center of mark detection system MDS.

Here, measurement beams $LBx_1$ and $LBx_2$ are beams on which polarized beam splitting is performed by a polarized beam splitter (not shown) on a beam from a light source, and when measurement beams $LBx_1$ and $LBx_2$ are irradiated on grating RG1, diffracted beams of a predetermined order of these measurement beams $LBx_1$ and $LBx_2$ diffracted by the X diffraction grating, e.g. a first-order diffraction beam (a first diffraction beam), are each returned by a reflection mirror via a lens and a quarter wavelength plate (not shown), and by the beams passing through the quarter wavelength plate twice the polarization direction is rotated by 90 degrees which allows the beams to pass through the original optical path and re-enter the polarized beam splitter where the beams are coaxially synthesized, and then by the photodetector (not shown) receiving the interference light of the first-order diffraction beams of measurement beams $LBx_2$ and $LBx_2$, position in the X-axis direction of slider 10 is measured.

As is shown in FIG. 4B, the pair of Y heads 37ya and 37yb are placed on the +X side and the −X side of straight line CL, respectively. Y head 37ya, as is shown in FIGS. 4A and 4B, irradiates measurement beams $LBya_1$ and $LBya_2$ each indicated by broken lines in FIG. 4A on a common irradiation point on grating RG1 from two points (refer to white circles in FIG. 4B) equidistant from straight line LX on a straight line LYa. The irradiation point of measurement beams $LBya_1$ and $LBya_2$, that is, detection point of Y head 37ya is indicated by reference code DPya in FIG. 4B.

Y head 37yb irradiates measurement beams $LByb_1$ and $LByb_2$ on a common irradiation point DPyb on grating RG1 from two points (refer to white circles in FIG. 4B) symmetric to outgoing points of measurement beams $LBya_1$ and $LBya_2$ of Y head 37ya with respect to straight line CL. As is shown in FIG. 4B, detection points DPya and DPyb of each of the Y heads 37ya and 37yb are placed on straight line LX parallel to the X-axis.

Measurement beams $LBya_1$ and $LBya_2$ are also beams of the same beam split by polarization by the polarized beam splitter, and by interference light of a predetermined order of these measurement beams $LBya_1$ and $LBya_2$ diffracted by the Y diffraction grating, e.g. a first-order diffraction beam (a second diffraction beam) being photodetected by the photodetector (not shown) similar to the description above, position in the Y-axis direction of slider 10 is measured. For measurement beams $LByb_1$ and $LByb_2$ as well, position in the Y-axis direction of slider 10 is measured by interference light of a first-order diffraction beam (a second diffraction beam) being photodetected by the photodetector (not shown), similar to measurement beams $LBya_1$ and $LBya_2$.

Here, controller 60 decides the position in the Y-axis direction of slider 10 based on an average of the measurement values of the two Y heads 37ya and 37yb. Consequently, in the embodiment, the position in the Y-axis direction of slider 10 is measured with a midpoint DP of detection points DPya and DPyb serving as a substantial measurement point. Midpoint DP coincides with the irradiation point on grating RG1 of measurement beams $LBX_1$ and $LBX_2$.

That is, in the embodiment, for measuring position information in the X-axis direction and Y-axis direction of slider 10, the device has a common detection point, and controller 60 controls this detection point so that the position within the XY plane coincides with the detection center of mark detection system MDS, by controlling at all times the three vibration isolators 14 real time, based on relative position information between mark detection system MDS (measurement unit 40) and surface plate 12 measured by the second position measurement system 50. Consequently, in the embodiment, by using encoder system 33, controller 60 can always perform measurement of position information within the XY plane of slider 10 directly under (rear surface side of slider 10) the detection center of mark detection system MDS when measuring the alignment marks on wafer W mounted on slider 10. Controller 60 also measures the rotation quantity in the θz direction of slider 10, based on a difference between measurement values of the pair of Y heads 37ya and 37yb.

Laser interferometer 35 can acquire position information of slider 10, by making a measurement beam enter the measurement section (the surface on which grating RG1 is formed) on the lower surface of slider 10 along with receiving the return beam (e.g. reflection light from a surface on which grating RG1 is formed). Laser interferometer 35, as is shown in FIG. 4A, makes four measurement beams $LBz_1$, $LBz_2$, $LBz_3$, and $LBz_4$ enter the lower surface of slider 10 (the surface on which grating RG1 is formed). Laser interferometer system 35 is equipped with laser interferometers 35a to 35d (refer to FIG. 6) that irradiate the four measurement beams $LBz_1$, $LBz_2$, $LBz_3$, and $LBz_4$, respectively. In the embodiment, laser interferometers 35a to 35d structure four Z heads.

In laser interferometer system 35, as is shown in FIGS. 4A and 4B, four measurement beams $LBz_1$, $LBz_2$, $LBz_3$, and $LBz_4$ are emitted parallel to the Z-axis from four points corresponding to the four vertices of a square whose center is detection point DP and has two sides parallel to the X-axis and two sides parallel to the Y-axis. In this case, the outgoing points (irradiation points) of measurement beams $LBz_1$ and $LBz_4$ are at equal distances from straight line LX on straight line LYa, and the outgoing points (irradiation points) of the remaining measurement beams $LBz_2$ and $LBz_3$ are at equal distances from straight line LX on a straight line LYb. In the embodiment, the surface on which grating RG1 is formed also functions as a reflection surface of each measurement beam from laser interferometer system 35. Controller 60 measures information on the position in the Z-axis direction and the rotation quantity in the θx direction and the θy direction of slider 10, using laser interferometer system 35. Note that as it is obvious from the description above, although slider 10 is not positively moved by drive system 20 previously described with respect to surface plate 12 in the Z-axis, the θx and the θy directions, because slider 10 is supported by levitation on surface plate 12 by the four air bearings placed at the four corners of the bottom surface, the position of slider 10 actually changes on surface plate 12 in each of the Z-axis, the θx and the θy directions. That is, slider 10 is actually movable with respect to surface plate 12 in each of the Z-axis, the θx and the θy directions. Displacement in each of the θx and the θy directions in particular causes a measurement error (Abbe error) in encoder system 33. Taking such points into consideration, position information in each of the Z-axis, the θx and the θy directions of slider 10 is measured by the first position measurement system 30 (laser interferometer system 35).

Note that for measurement of information on position in the Z-axis direction and the rotation quantity in the θx direction and the θy direction of slider 10, since the beams only have to be incident on three different points on the surface where grating RG1 is formed, the Z heads, e.g. laser interferometers, that are necessary should be three. Note that a cover glass to protect grating RG1 can be provided on the lower surface of slider 10, and on the surface of the cover glass, a wavelength selection filter may be provided that allows each measurement beam from encoder system 33 to pass and prevents each measurement beam from laser interferometer system 35 from passing.

As it can be seen from the description so far, controller 60 can measure the position in directions of six degrees of freedom of slider 10 by using encoder system 33 and laser interferometer system 35 of the first position measurement system 30. In this case, in encoder system 33, influence of air fluctuation can almost be ignored since the optical path lengths of the measurement beams in the air are extremely short and are almost equal. Consequently, position information within the XY plane (including the θz direction) of slider 10 can be measured with high precision by encoder system 33. Also, because the substantial detection point on grating RG1 in the X-axis direction and the Y-axis direction by encoder system 33 and the detection point on the lower surface of slider 10 in the Z-axis direction by laser interferometer system 35 each coincide with the detection center of mark detection system MDS within the XY plane, generation of the so-called Abbe error which is caused by shift within the XY plane between the detection point and the detection center of mark detection system MDS can be suppressed to a level that can be ignored. Consequently, controller 60 can measure the position in the X-axis direction, the Y-axis direction, and the Z-axis direction of slider 10 without the Abbe error caused by shift in the XY plane between the detection point and the detection center of mark detection system MDS with high precision by using the first position measurement system 30.

However, for the Z-axis direction parallel to optical axis AX1 of mark detection system MDS, position information in the XY plane of slider 10 is not necessarily measured at a position at the surface of wafer W by encoder system 33, that is, the Z position of the placement surface of grating RG1 and the surface of wafer W do not necessarily coincide. Therefore, in the case grating RG1 (that is, slider 10) is inclined with respect to the XY plane, when slider 10 is positioned based on measurement values of each of the encoders of encoder system 33, as a result, a positioning error (a kind of Abbe error) corresponding to the inclination with respect to the XY plane of grating RG1 occurs due to a Z position difference ΔZ (that is, positional displacement in the Z-axis direction between the detection point by encoder system 33 and the detection center (detection point) by mark detection system MDS) between the placement surface of grating RG1 and the surface of wafer W. However, this positioning error (position control error) can be acquired by a simple calculation by using difference ΔZ, pitching quantity θx, and rolling quantity θy, and using this as an offset and by setting the position of slider 10 based on position information after correction in which measurement values of (each encoder of) encoder system 33 are corrected by the offset amount, the kind of Abbe error described above no longer affects the measurement. Or, instead of correcting the measurement values of (each encoder of) encoder system 33, one or a plurality of information for moving the slider such as a target position to where slider 10 should be positioned may be corrected, based on the above offset.

Note that in the case grating RG1 (that is, slider 10) is inclined with respect to the XY plane, head section 32 may be moved so that a positioning error due to the inclination does not occur. That is, in the case an inclination has been measured in grating RG1 (that is, slider 10) with respect to the XY plane by the first position measurement system. 30 (e.g. interferometer system 35), surface plate 12 that holds head section 32 may be moved, based on position information acquired using the first position measurement system 30. Surface plate 12, as is described above, can be moved using vibration isolators 14.

Also, in the case grating RG1 (that is, slider 10) is inclined with respect to the XY plane, position information of the mark acquired using mark detection system MDS may be corrected, based on the positioning error caused by the inclination.

The second position measurement system 50, as is shown in FIGS. 1, 2A and 2B, has a pair of head sections 52A and 52B provided at the lower surface of one end and the other end in the longitudinal direction of head mounting member 51 previously described, and scale members 54A and 54B that are placed facing head sections 52A and 52B. Scale members 54A and 54B have an upper surface which is the same height as the surface of wafer W held by wafer holder WH. On each of the upper surfaces of scale members 54A and 54B, reflection type two-dimensional gratings RG2a and RG2b are formed. Two-dimensional gratings (hereinafter shortly referred to as gratings) RG2a and RG2b both include a reflective diffraction grating (X diffraction grating) whose periodic direction is in the X-axis direction and a reflective diffraction grating (Y diffraction grating) whose periodic direction is in the Y-axis direction. Pitch of grid lines of the X diffraction grating and the Y diffraction grating is set, for example, to 1 μm.

Scale members 54A and 54B consist of a material having a low thermal expansion, e.g. a zero thermal expansion material, and are each fixed on surface plate 12 via support members 56, as is shown in FIGS. 2A and 2B. In the embodiment, dimensions of scale members 54A and 54B and support members 56 are decided so that gratings RG2a and RG2b face head sections 52A and 52B with a gap of around several mm in between.

Figure 5:
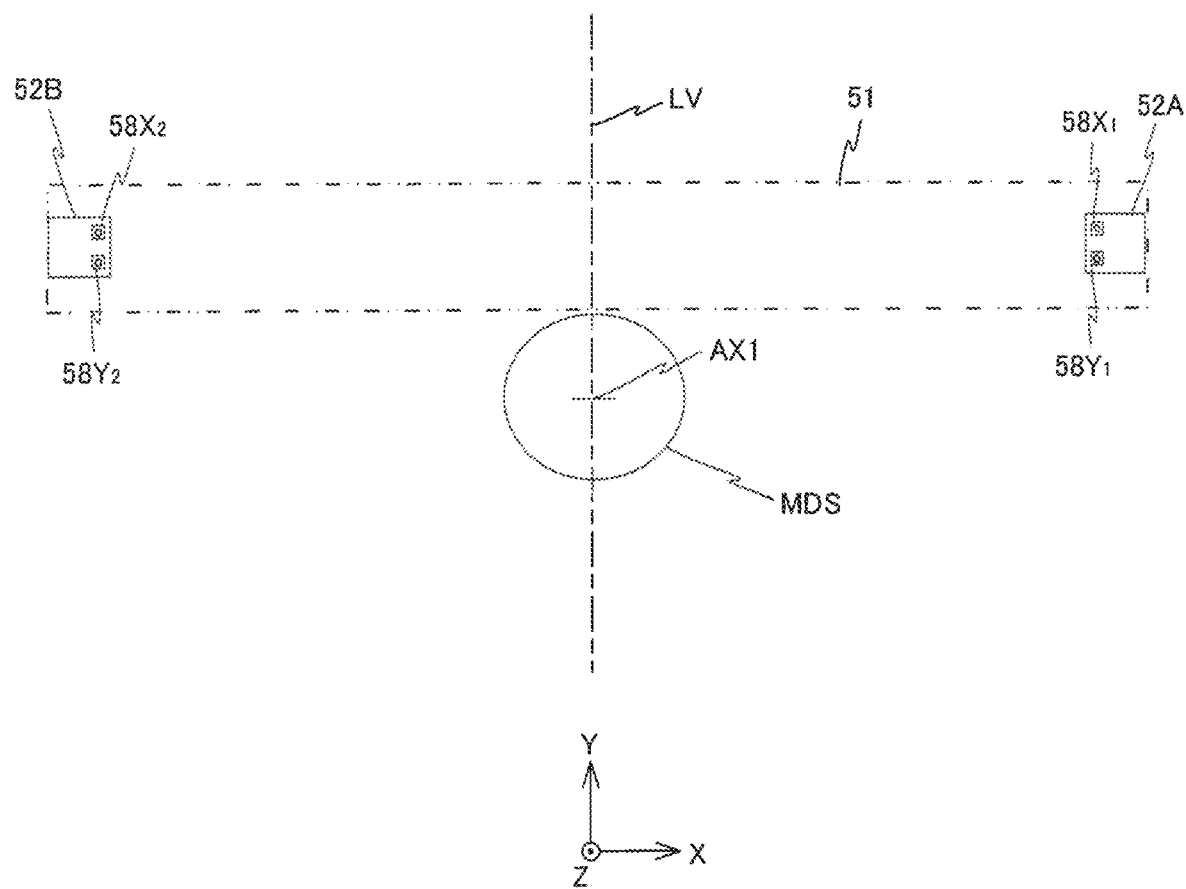
FIG. 5 is a view used to describe a structure of a second position measurement system.

As is shown in FIG. 5, one head section 52A fixed to the lower surface at the end on the +X side of head mounting member 51 includes an XZ head $58X_1$ whose measurement direction is in the X-axis and the Z-axis directions and a YZ head $58Y_1$ whose measurement direction is in the Y-axis and the Z-axis directions that are housed in the same housing. XZ head $58X_1$ (to be more accurate, an irradiation point on grating RG2a of the measurement beam emitted by XZ head $58X_1$) and YZ head $58Y_1$ (to be more accurate, an irradiation point on grating RG2a of the measurement beam emitted by YZ head $58Y_1$) are placed on the same straight line parallel to the Y-axis.

The other head section 52B is placed symmetric to head section 52A with respect to a straight line (hereinafter called a reference axis) LV which passes through optical axis AX1 of mark detection system MDS and is parallel to the Y-axis, however, the structure is similar to that of head section 52A. That is, head section 52B has XZ head $58X_2$ and YZ head $58Y_2$ placed symmetric to XZ head $58X_1$ and YZ head $58Y_1$ with respect to reference axis LV, and the irradiation points of the measurement beams irradiated on grating RG2b from each of the XZ head $58X_2$ and YZ head $58Y_2$ set on the same straight line parallel to the Y-axis. Reference axis LV, here, coincides with straight line CL previously described.

As each of the XZ heads $58X_1$ and $58X_2$ and the YZ heads $58Y_1$ and $58Y_2$, an encoder head having a structure similar to the displacement measurement sensor head disclosed in, for example, U.S. Pat. No. 7,561,280, can be used.

Head sections 52A and 52B structure an XZ linear encoder which measures position in the X-axis direction (X position) and position in the Z-axis direction (Z position) of gratings RG2a and RG2b and a YZ linear encoder which measures position in the Y-axis direction (Y position) and Z position, using scale members 54A and 54B, respectively. Gratings RG2a and RG2b, here, are formed on the upper surface of scale members 54A and 54B which are each fixed on surface plate 12 via support members 56, and head sections 52A and 52B are provided at head mounting member 51 which is integral with mark detection system MDS. As a result, head sections 52A and 52B measure the position (positional relation between mark detection system MDS and surface plate 12) of surface plate 12 with respect to mark detection system MDS. In the description below, for the sake of convenience, XZ linear encoder and YZ linear encoder will be described as XZ linear encoders $58X_1$ and $58X_2$ and YZ linear encoders $58Y_1$ and $58Y_2$ (refer to FIG. 6), using the same reference code as XZ heads $58X_1$ and $58X_2$ and YZ heads $58Y_1$ and $58Y_2$.

In the embodiment, XZ linear encoder $58X_1$ and YZ linear encoder $58Y_1$ structure a four-axis encoder $58_1$ (refer to FIG. 6) that measures position information in each of the X-axis, the Y-axis, the Z-axis, and the θx directions with respect to mark detection system MDS of surface plate 12. Similarly, XZ linear encoder $58X_2$ and YZ linear encoder $58Y_2$ structure a four-axis encoder $58_2$ (refer to FIG. 6) that measures position information in each of the X-axis, the Y-axis, the Z-axis, and the θx directions with respect to mark detection system MDS of surface plate 12. In this case, position information in the θy direction with respect to mark detection system MDS of surface plate 12 is obtained (measured), based on position information in the Z-axis direction with respect to mark detection system MDS of surface plate 12 measured by each of the four-axis encoders $58_1$ and $58_2$, and position information in the θz direction with respect to mark detection system MDS of surface plate 12 is obtained (measured), based on position information in the Y-axis direction with respect to mark detection system MDS of surface plate 12 measured by each of the four-axis encoders $58_1$ and $58_2$.

Accordingly, four-axis encoder $58_1$ and four-axis encoder $58_2$ structure the second position measurement system 50 which measures position information in directions of six degrees of freedom with respect to mark detection system MDS of surface plate 12, namely, measures information on relative position in directions of six degrees of freedom between mark detection system MDS and surface plate 12. The information on relative position in directions of six degrees of freedom between mark detection system MDS and surface plate 12 measured by the second position measurement system 50 is supplied at all times to controller 60, and based on this information on relative position, controller 60 controls the actuators of the three vibration isolators 14 real time so that the detection point of the first position measurement system 30 is in a desired positional relation with respect to the detection center of mark detection system MDS, or to be more specific, the position in the XY plane of the detection point of the first position measurement system 30 coincides with the detection center of mark detection system MDS such as at a nm level, and the surface of wafer W on slider 10 also coincides with the detection position of mark detection system MDS. In this case, for example, straight line CL previously described coincides with reference axis LV. Note that if the detection point of the first position measurement system 30 can be controlled to be in a desired positional relation with respect to the detection center of mark detection system MDS, the second position measurement system 50 does not have to measure the information on relative position in all directions of six degrees of freedom.

FIG. 6 shows a block diagram of an input output relation of controller 60 which mainly structures a control system of measurement device 100 according to the embodiment. Controller 60 includes a workstation (or a microcomputer) or the like, and has overall control over each part of measurement device 100. As is shown in FIG. 6, measurement device 100 is equipped with wafer carrier system 70 placed inside a chamber along with component parts shown in FIG. 1. Wafer carrier system 70 consists of, for example, a horizontal multi-joint arm robot.

Next, a series of operations when processing a single lot of wafers in measurement device 100 according to the embodiment having the structure described above is described based on a flowchart in FIG. 7 that corresponds to a processing algorithm of controller 60.

As a premise, wafer W serving as a measurement target of measurement device 100 is to be a 300 mm wafer, and on wafer W, by exposure performed earlier on the previous layers, a plurality of, e.g. I (as an example, I=98) divided areas called shot areas (hereinafter called shots) are formed placed in a matrix state, and on street lines surrounding each shot or street lines inside each shot (in the case a plurality of chips are made in one shot), marks of a plurality of types of marks, such as search alignment marks for search alignment, wafer alignment marks (wafer marks) for fine alignment and the like are to be provided. The marks of the plurality of types of marks are formed along with the divided areas. In the embodiment, as the search marks and the wafer marks, two-dimensional marks are to be used.

Also, with measurement device 100, a plurality of measurement modes in which mark detection conditions by mark detection system MDS are different shall be settable. As the plurality of measurement modes, as an example, the following modes shall be settable; A-mode in which one wafer mark is detected for all shots in all wafers, and B-mode in which marks of a plurality of wafer marks are detected for all shots in a predetermined number of wafers at the beginning of a lot, and according to the detection results of the wafer marks, wafer marks subject to detection for each shot are decided for the remaining wafers in the lot, and the wafer marks that have been decided are detected.

Also, information necessary for alignment measurement to wafer W is input via an input device (not shown) in advance by an operator of measurement device 100, and the information is to be stored in a memory in controller 60. The information necessary for alignment measurement, here, includes information of various types such as; information on thickness of wafer W, information on flatness of wafer holder WH, and design information on shot areas and arrangement of alignment marks on wafer W. Note that setting information of the measurement mode is to be input in advance via the input device (not shown), for example, by the operator.

Figure 7:
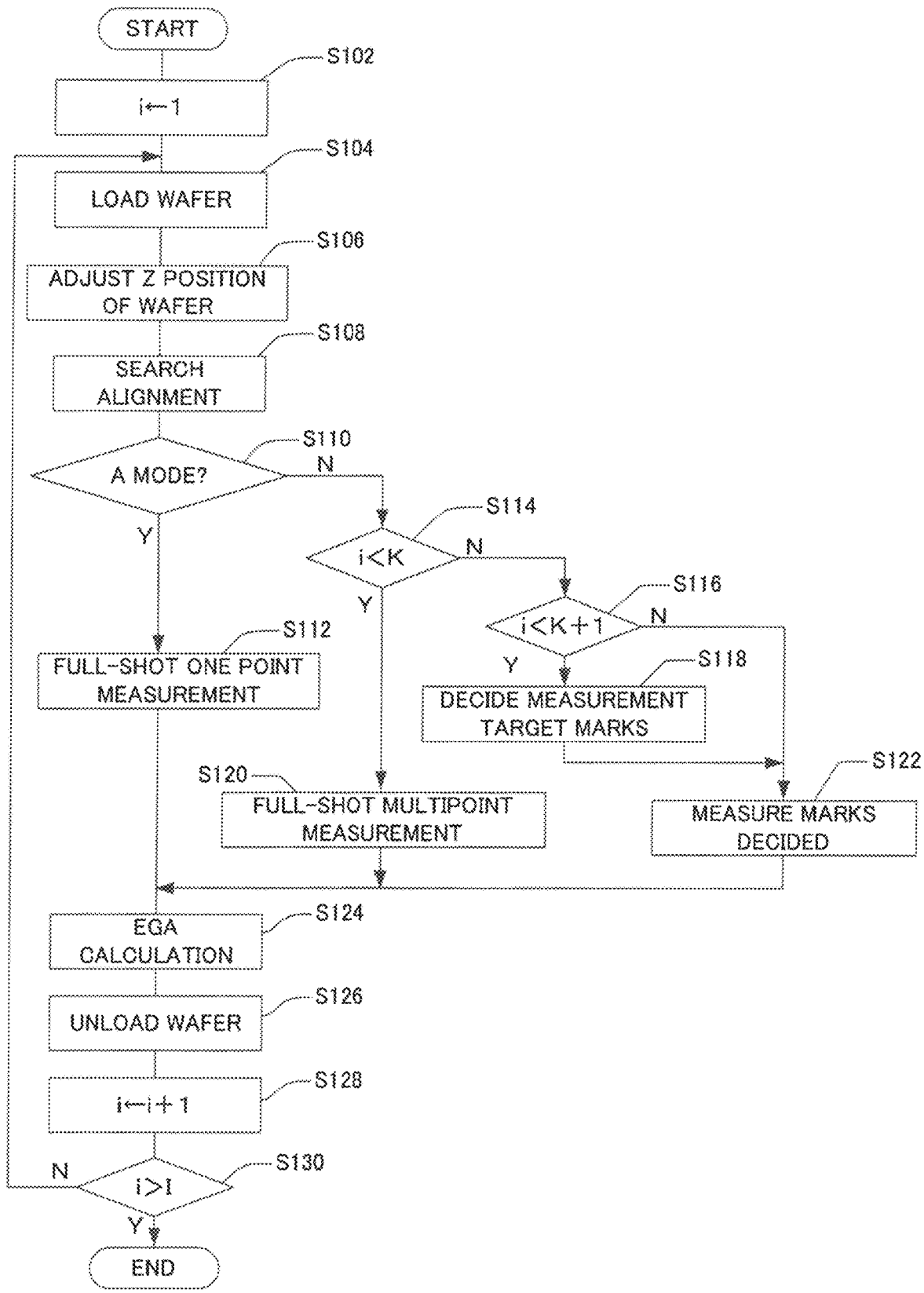
FIG. 7 is a flowchart corresponding to a processing algorithm of the controller when processing wafers of a lot.

Processing algorithm corresponding to the flowchart in FIG. 7 starts when measurement start is instructed, for example, by the operator. At this timing, wafers of one lot are to be housed within a wafer carrier located at a predetermined position. Other than this, for example, in the case where measurement device 100 is connected in-line to a substrate processing device (e.g. such as a coater developer), the processing algorithm can be started when a control system of the substrate processing device requests permission for starting carriage of the wafers of the one lot and the first wafer is delivered to a predetermined delivery position responding to the request. Note that connected in-line means that different devices are connected to one another in a state where a carrier path of the wafer (substrate) is connected, and in the description, terms "connected in-line" and "in-line connection" shall be used in this meaning.

First of all, in step S102, a count value i of a counter showing the wafer number within the lot is initialized to 1 (i←1).

In the next step S104, wafer W is loaded onto slider 10. This loading of wafer W is performed by wafer carrier system 70 and the vertical movement member on slider 10 under the control of controller 60. Specifically, wafer W is carried from the wafer carrier (or delivery position) to a position above slider 10 located at the loading position by wafer carrier system 70, and by driver 13 driving the vertical movement member upward by a predetermined amount, wafer W is delivered to the vertical movement member. Then, after wafer carrier system 70 withdraws from the position above slider 10, the vertical movement member is moved downward by driver 13 so that wafer W is mounted on wafer holder WH on slider 10. Then, vacuum pump 11 is turned on, and wafer W loaded on slider 10 is vacuum chucked by wafer holder WH. Note that when measurement device 100 is connected in-line to the substrate processing device, the wafers are carried in sequentially from a wafer carrier system of the substrate processing device side, and are mounted to the delivery position.

In the next step, S106, position in the Z-axis direction (Z position) of wafer W is adjusted. Prior to this adjustment of Z position, controller 60 controls the internal pressure (movement force in the Z-axis direction that vibration isolators 14 generate) of the air mounts of the three vibration isolators 14 based on relative position information in the Z-axis direction, the θy direction, and the θx direction between mark detection system MDS and surface plate 12 measured by the second position measurement system 50, and surface plate 12 is set so that its upper surface becomes parallel to the XY plane and the Z position becomes a predetermined reference position. Wafer W is considered to have uniform thickness. Accordingly, in step S106, controller 60, based on thickness information of wafer W stored in memory, adjusts the movement force in the Z-axis direction that the three vibration isolators 14 generate, such as for example, the internal pressure (quantity of compressed air) of the air mount, so that surface plate 12 is moved in the Z-axis direction and the Z position of the wafer W surface is adjusted, so that the wafer W surface is set to a range in which the focal position of the optical system can be adjusted by the auto-focus function of mark detection system MDS. Note that in the case measurement unit 40 is equipped with a focal position detection system, controller 60 may perform Z position adjustment of the wafer surface based on detection results (output) of the focal position detection system. For example, mark detection system MDS may be equipped with a focal position detection system that detects position in the Z-axis direction of the wafer W surface via an optical element (objective optical element) at the tip portion. Also, adjustment on the Z position of the wafer W surface based on the detection results of the focal point position detection system can be performed, by moving slider 12 using vibration isolators 14 and moving slider 10 along with surface plate 12. Note that drive system 20 having a structure that can drive slider 10 not only in directions within the XY plane but also in the Z-axis direction, the θx direction, and the θy direction may be employed, and slider 10 may be moved using drive system 20. Note that Z position adjustment of the wafer surface may include adjusting inclination of the wafer surface. When there is a possibility of an error (a kind of Abbe error) occurring due to Z position difference ΔZ between the arrangement surface of grating RG1 and the surface of wafer W by using drive system 20 to adjust the inclination of the wafer surface, at least one of the countermeasures like the ones described above should be executed.

In the next step, S108, search alignment of wafer W is performed. Specifically, for example, at least two search marks positioned in the periphery section almost symmetric with respect to the wafer W center are detected using mark detection system MDS. Controller 60 controls the movement of slider 10 by drive system 20, and while positioning each search mark within a detection area (detection field) of mark detection system MDS, acquires measurement information according to the first position measurement system 30 and measurement information according to the second position measurement system 50, and then obtains position information of each search mark based on detection signals when detecting the search mark formed on wafer W using mark detection system and measurement information according to the first position measurement system 30 (and measurement information according to the second position measurement system 50).

To be more specific, controller 60 obtains position coordinates on a reference coordinate system of the two search marks, based on detection results (relative positional relation between the detection center (index center) of mark detection system MDS obtained from the detection signals and each search mark) of mark detection system MDS output from signal processor 49, measurement values of the first position measurement system 30 and measurement values of the second position measurement system 50 at the time of detection of each search mark. The reference coordinate system, here, is an orthogonal coordinate system set by the measurement axes of the first position measurement system 30.

After this, residual rotation error of wafer W is calculated from the position coordinates of the two search marks, and slider 10 is rotated finely so that the rotation error becomes almost zero. This completes search alignment of wafer W. Note that because wafer W is actually loaded onto slider 10 in a state where pre-alignment has been performed, center position displacement of wafer W is small enough to be ignored, and the residual rotation error is extremely small.

In the next step, S110, judgment is made of whether the measurement mode set is A-mode or not. And when the judgment in step S110 is positive, that is, in the case the measurement mode set is A-mode, then the operation moves to step S112.

In step S112, alignment measurement with respect to all wafers (full-shot one point measurement, in other words, full-shot EGA measurement), that is, one wafer mark is measured for each of the 98 shots. Specifically, controller 60 obtains the position coordinates on the reference coordinate system of the wafer mark on wafer W, that is, obtains the position coordinates of the shot, similar to the measurement of position coordinates of each search mark at the time of search alignment previously described. However, in this case, on calculating the position coordinates of the shot, measurement information of the second position measurement system 50 must be used, which is different from the time of search alignment. The reason is, as is previously described, controller 60, based on measurement information of the second position measurement system 50, controls the actuators of the three vibration isolators 14 real time so that the position in the XY plane of the detection point of the first position measurement system 30 coincides with the detection center of mark detection system MDS such as at a nm level, and the surface of wafer W on slider 10 also coincides with the detection position of mark detection system MDS. However, at the time of detection of the wafer mark, since there is no guarantee that the position in the XY plane of the detection point of the first position measurement system 30 coincides with the detection center of mark detection system MDS such as at a nm level, the position coordinates of the shot has to be calculated, taking into consideration the positional displacement of both the detection point and the detection center as offsets. For example, by correcting the detection results of mark detection system MDS or the measurement values of the first position measurement system 30 using the above offsets, the position coordinates on the reference coordinate system of the wafer mark on wafer W that are calculated can be corrected.

Here, on this full-shot one point measurement, controller 60 positions the wafer mark within the detection area of mark detection system MDS by moving slider 10 (wafer W) in at least one of the X-axis direction and the Y via drive system 20. That is, the full-shot one point measurement is performed by moving slider 10 within the XY plane with respect to the mark detection system MDS using the step-and-repeat method.

Note that in case measurement unit 40 is equipped with the focal position detection system, controller 60 may perform adjustment of the Z position of the wafer surface based on detection results (output) of the focal position detection system, similar to the description in step S106.

On alignment measurement (full-shot one point measurement) to all wafer in step S112, while an offset load acts on surface plate 12 along with the movement, when slider 10 is moved within the XY plane, in the embodiment, controller 60 performs feedforward control individually on the three vibration isolators 14 according to the X, Y coordinate positions of the slider included in the measurement information of the first position measurement system 30 so that the influence of the offset load is canceled, and individually controls the movement force in the Z-axis direction that each vibration isolator 14 generates. Note that controller 60 may predict the offset load that acts on surface plate 12 and perform feedforward control individually on the three vibration isolators 14 so that the influence of the offset load is canceled, based on information on a known movement path of slider 10 without using the measurement information of the first position measurement system 30. Also, in the embodiment, since information on unevenness (hereinafter referred to as holder flatness information) of a wafer holding surface (a surface set by an upper end surface of multiple pins of a pin chuck) of wafer holder WH is obtained by experiment and the like in advance, on alignment measurement (e.g. full-shot one point measurement), when moving slider 10, controller 60, by performing feedforward control on the three vibration isolators 14 based on the holder flatness information to smoothly position an area including the wafer marks subject to measurement on the wafer W surface within a range of depth of focus of the optical system of mark detection system MDS, finely adjusts the Z position of surface plate 12. Note that one of feedforward control to cancel the offset load acting on surface plate 12 and feedforward control based on the holder flatness information described above or both of the controls do not have to be executed.

Note that in the case magnification can be adjusted in mark detection system MDS, the magnification may be set to low magnification on search alignment and to high magnification on alignment measurement. Also, in the case center position displacement and residual rotation error of wafer W loaded on slider 10 are small enough to be ignored, step S108 may be omitted.

In the full-shot one point measurement in step S112, actual values of position coordinates of a sample shot area (sample shot) in the reference coordinate system used in EGA calculation to be described later on are detected. Sample shot, of all the shots on wafer W, refers to a specific plurality of numbers of shots (at least three) determined in advance as shots used for EGA calculation to be described later on. Note that all shots on wafer W become sample shots in full-shot one point measurement. After step S112, the operation moves to step S124.

On the other hand, in the case the judgment in step S110 is negative, that is, in the case the mode set is B-mode, the operation moves to step S114 where judgment is made of whether or not count value i is smaller than a predetermined value K (K is a natural number that satisfies 1<K<I, and is a number decided in advance, e.g. 4). Note that count value i is incremented in step S128 to be described later on. And when judgment made in this step S114 is affirmative, the operation moves to step S120 where a full-shot multipoint measurement is performed on all shots. Full-shot multipoint measurement, here, means to measure each of a plurality of wafer marks for all shot areas on wafer W. The plurality of wafer marks that are to be measurement targets are decided in advance. For example, the measurement targets may be a plurality of wafer marks that are placed in an arrangement from which the shape of the shot (shape error from an ideal grating) can be obtained by statistical calculation. Since the procedure of measurement is similar to the case of full-shot one point measurement in step S112 except for the number of marks of the measurement target which is different, description in detail thereabout is omitted. After step S120, the operation moves to step S124.

On the other hand, in the case the judgment in step S114 is negative, the operation moves to step S116 where judgment is made of whether or not count value i is smaller than K+1. Here, since the judgment in step S116 is positive when count value i is both i≥K and i<k+1, accordingly, i=K.

In the case the judgment in step S116 is positive, the operation moves to step S118 where wafer marks that are to be measurement targets are decided for each shot, based on detection results of the wafer marks of wafer W to which measurement of K−1 wafers (e.g. in the case K=4, 3 wafers) has been performed so far. Specifically, the decision is made of whether detection of one wafer mark is enough, or a plurality of wafer marks should be detected for each shot. In the latter case, the wafer marks which should be subject to detection are also decided. For example, a difference (absolute value) between the actual measurement position and a design position of each of the plurality of wafer marks is to be obtained for each shot, and by judging whether or not a difference between the maximum value and the minimum value of the difference exceeds a certain threshold value, the decision is to be made of whether or not a plurality of wafer marks should be detected or detection of one wafer mark is enough for each shot. In the former case, for example, the wafer marks to be detected are decided so that the marks include a wafer mark having a maximum difference (absolute value) between the actual measurement position and the design position and a wafer mark having a minimum difference. After step S118, the operation moves to step S122.

On the other hand, in the case the judgment in step S116 is negative, the operation moves to step S122. Here, the judgment in step S116 is negative in the case count value i satisfies K+1≤i, and prior to this, count value always becomes i=K and wafer marks that are to be measurement targets are decided for each shot in step S118.

In step S122, the wafer marks that are decided to be measurement targets for each shot in step S118 are measured. Since the procedure of measurement is similar to the case of full-shot one point measurement in step S112 except for the number of marks of the measurement target which is different, description in detail thereabout is omitted. After step S122, the operation moves to step S124.

As is obvious from the description so far, in the case of B-mode, full-shot multipoint measurement is performed on wafers from the $1^{st}$ wafer within the lot to the K−$1^{th}$ wafer (e.g. the $3^{rd}$ wafer), and from the $K^{th}$ wafer (e.g. the $4^{th}$ wafer) to the $I^{th}$ wafer (e.g. the $25^{th}$ wafer), measurement is to be performed on the wafer marks decided for each shots based on results of the full-shot multipoint measurement performed on the first K−1 wafers (e.g. three wafers).

In step 124, EGA operation is performed using position information of the wafer marks measured in any one of step S112, step S120, and step S122. EGA operation refers to a statistical calculation in which after measurement (EGA measurement) of the wafer marks described above, coefficients in a model formula expressing a relation between position coordinates of a shot and correction amounts of the position coordinates of the shot are obtained using statistical calculation such as a least squares method, based on the data of the difference between the design values and the actual measurement values of the position coordinates of the sample shot.

In the embodiment, as an example, the following model formula is used for calculating correction amounts from design values of position coordinates of a shot.

$$\begin{aligned} dx &= a_0 + a_1 \cdot X + a_2 \cdot Y + a_3 \cdot X^2 + a_4 \cdot X \cdot Y + a_5 \cdot Y^2 + \\ &\quad a_6 \cdot X^3 + a_7 \cdot X^2 Y + a_8 \cdot X \cdot Y^2 + a_9 \cdot Y^3 \ldots \\ dy &= b_0 + b_1 \cdot X + b_2 \cdot Y + b_3 \cdot X^2 + b_4 \cdot X \cdot Y + b_5 \cdot Y^2 + \\ &\quad b_6 \cdot X^3 + b_7 \cdot X^2 \cdot Y + b_8 \cdot X \cdot Y^2 + b_9 \cdot Y^3 \ldots \end{aligned} \quad (1)$$

Here, dx and dy are correction amounts in the X-axis direction and the Y-axis direction from the design values of the position coordinates of the shot, and X and Y are design position coordinates of the shot in a wafer coordinate system using the center of wafer W as the origin. That is, formula (1) above is a polynomial expression related to design position coordinates X and Y for each shot in the wafer coordinate system using the center of the wafer as the origin, and is a model formula expressing a relation between position coordinates X and Y and correction amounts (alignment correction components) dx and dy of the position coordinates of the shot. Note that in the embodiment, since rotation between the reference coordinate system and the wafer coordinate system is canceled by the search alignment described earlier, in the following description, all the coordinate systems will be described as a reference coordinate system without distinguishing between the reference coordinate system and the wafer coordinate system in particular.

When using model formula (1), from position coordinates X and Y of a shot of wafer W, correction amounts of the position coordinates of the shot can be obtained. However, to calculate the correction amounts, coefficients $a_0$, $a_1$, . . . , $b_0$, $b_1$, . . . have to be obtained. After EGA measurement, based on the data of the difference between the design values and the actual measurement values of the position coordinates of the sample shot, coefficients $a_0$, $a_1$, . . . , $b_0$, $b_1$, . . . of the above formula (1) are obtained using statistical calculation such as a least squares method.

After coefficients $a_0$, $a_1$, . . . , $b_0$, $b_1$, . . . of model formula (1) have been decided, by obtaining correction amounts dx and dy of the position coordinates of each shot substituting design position coordinates X and Y of each shot (divided area) in the wafer coordinate system into model formula (1) whose coefficients are decided, true arrangement (including not only linear components but also nonlinear components as deformation components) of a plurality of shots (divided areas) on wafer W can be obtained.

Now, in the case of wafer W to which exposure has already been performed, the waveform of detection signals acquired as the measurement results is not always favorable for all wafer marks due to the influence of processing so far. When the positions of wafer marks having such defective measurement results (waveform of detection signals) are included in the above EGA operation, position error of the wafer marks having the defective measurement results (waveform of detection signals) will have adverse effects on the calculation results of coefficients $a_0$, $a_1$, . . . , $b_0$, $b_1$, . . . .

Therefore, in the embodiment, signal processor 49 only sends measurement results of the wafer marks that are favorable to controller 60, and controller 60 is to execute the EGA operation described above, using all the positions of the wafer marks whose measurement results have been received. Note that there is no limit in particular in the degree of the polynomial expression in the above formula (1). Controller 60 associates the results of EGA operation with identification information of the wafers (e.g. wafer number, lot number) along with information related to the marks used for the operation that are made into a file serving as alignment history data, and the file is stored in an internal or external memory device.

When EGA operation in step S124 is completed, then the operation moves to step S126 where wafer W is unloaded from slider 10. This unloading is performed under the control of controller 60, in a reversed procedure of the loading procedure in step S104 by wafer carrier system 70 and the vertical movement member on slider 10.

In the next step S128, after count value i of the counter has been incremented by 1 (i←i+1), the operation moves to step S130 where judgment is made of whether or not count value i is larger than the total number of wafers I in the lot. Then, when the judgment in this step S130 is negative, it is judged that processing to all the wafers in the lot is not yet complete, therefore the operation returns to step S104 and thereinafter repeats the processing (including judgment) from step S104 to step S130 until the judgment in step S130 turns positive.

Then, when the judgment in step S130 turns positive, it is judged that processing to all the wafers in the lot is complete, therefore this completes the series of processing in the present routine.

As is described in detail so far, with measurement device 100 according to the embodiment, the first position measurement system 30 that measures position information in directions of six degrees of freedom of slider 10 on which wafer W is mounted and held can continue to irradiate a measurement beam on grating RG1 from head section 32 in a range where slider 10 moves for detecting at least the wafer marks on wafer W with mark detection system MDS. Accordingly, the first position measurement system 30 can measure position information continuously in the whole range within the XY plane where slider 10 moves for mark detection. Accordingly, for example, in a making stage (including a startup stage of the device in a semiconductor manufacturing factory) of measurement device 100, by performing origin setting of an orthogonal coordinate system (reference coordinate system) set by the measurement axis of the first position measurement system 30, namely the grating of grating RG1, it becomes possible to acquire absolute coordinate positions of slider 10 within the XY plane, which in turn makes it possible to obtain absolute positions within the XY plane of marks (not limited to search marks and wafer marks, and also includes other marks such as overlay measurement marks (registration marks)) on wafer W held on slider 10 that are obtained from position information of slider 10 measured by the first position measurement system 30 and detection results of mark detection system MDS. Note that "absolute position coordinate" in the description will refer to a position coordinate in the above reference coordinate system.

Also, with measurement device 100 according to the embodiment, because position coordinates within the XY plane of marks on the wafer can be measured, by performing exposure with an exposure apparatus such as, e.g. a scanner or a stepper, on a bare wafer by the step-and-scan method or the step-and-repeat method using a product reticle on which a rectangular pattern area as well as alignment marks whose positional relation with the pattern area is known are formed, and measuring absolute coordinates of the alignment mark images on the wafer after exposure using measurement device 100, it becomes possible to control wafer grid change (e.g. change from design of the wafer grid) without using a reference wafer. Control of change in the wafer grid caused by the device will be described in detail later on.

Also, with measurement device 100 according to the embodiment, controller 60 acquires position information of slider 10 with respect to surface plate 12 and relative position information between mark detection system MDS and surface plate 12 using the first position measurement system 30 and the second position measurement system 50, as well as obtain position information on the plurality of marks formed on wafer W using mark detection system MDS, while controlling movement of slider 10 by drive system 20. Accordingly, with measurement device 100, position information on the plurality of marks formed on wafer W can be obtained with good accuracy.

Also, with measurement device 100 according to the embodiment, controller 60 acquires measurement information (relative position information between surface plate 12 and mark detection system MDS) from the second position measurement system 50 at all times, and controls the position in directions of six degrees of freedom of surface plate 12 real time via (the actuators of) the three vibration isolators 14 so that the positional relation between the detection center of mark detection system MDS and the measurement point of the first position measurement system detecting position information in directions of six degrees of freedom of slider 10 with respect to surface plate 12 is maintained in a desired relation at a nm level. Also, controller 60 acquires measurement information (position information of slider 10 with respect to surface plate 12) by the first position measurement system 30 and measurement information (relative position information between surface plate 12 and mark detection system MDS) by the second position measurement system 50 while controlling the movement of slider 10 by drive system 20, and obtains position information on the plurality of wafer marks based on detection signals at the time of detection of the marks formed on wafer W using mark detection system MDS, measurement information by the first position measurement system 30 obtained at the time of detection of the marks formed on wafer W using mark detection system MDS, and measurement information by the second position measurement system 50 obtained at the time of detection when detecting the marks formed on wafer W using mark detection system MDS. Accordingly, with measurement device 100, position information on the plurality of marks formed on wafer W can be obtained with good accuracy.

Note that, for example, in the case of performing position control of wafer W (wafer stage WST) on exposure (to be described later on) based on position information of the marks that has been measured without performing EGA operation using the position information that has been measured, the measurement information by the second position measurement system 50 described above, for example, does not have to be used to calculate the position information. However, in this case, offset should be applied to use the measurement information by the second position measurement system 50 obtained at the time of detection when detecting the marks formed on wafer W using mark detection system MDS, and information used for moving wafer W may be corrected such as, for example, a positioning target value of wafer W (wafer stage WST). Or, taking into consideration the above offset, movement of a reticle R (reticle stage RST) at the time of exposure which will be described later on may be controlled.

Also, with measurement device 100 according to the embodiment, on alignment measurement, for each of the I shots (e.g. 98 shots) on wafer W, position information is measured for at least one each of the wafer marks, and using this position information, coefficients $a_0, a_1, \ldots b_0, b_1, \ldots$ of the above formula (1) are obtained using statistical calculation such as a least squares method. Accordingly, deformation components of the wafer grid can be accurately obtained not only for linear components but also for non-linear components.

The correction amounts (coefficients $a_0, a_1, \ldots b_0, b_1, \ldots$ of the above formula (1)) of the position coordinates of the shot on wafer W obtained by measurement device 100, for example, may be considered to be used for positioning the wafer to an exposure position when exposure of wafer W is performed by an exposure apparatus. However, in order to perform exposure on wafer W whose correction amounts of the position coordinates have been measured by measurement device 100 according to the exposure apparatus, wafer W has to be unloaded from slider 10 and then be loaded on the wafer stage. Even if the same type of wafer holders were used, the holding state of wafer W differs between wafer holder WH on slider 10 and the wafer holder on the wafer stage of the exposure apparatus due to individual differences of the wafer holders. Therefore, even if the correction amounts (coefficients $a_0, a_1, \ldots b_0, b_1, \ldots$ of the above formula (1)) of the position coordinates of the shot on wafer W were obtained by measurement device 100, the coefficients $a_0, a_1, \ldots b_0, b_1, \ldots$ cannot all be used as they are. However, it is considered that the different holding state of wafer W for each wafer holder affects lower-degree components (linear components) not exceeding the first-degree of the correction amount of the position coordinates of the shot, and hardly affects higher-degree components exceeding the second-degree. The reason for this is higher-degree components exceeding the second-degree are considered to be components that occur due to deformation of wafer W due to process, and it can be considered that the components are unrelated to the holding state of the wafer by the wafer holder.

Based on such consideration, coefficients $a_3, a_4, \ldots, a_9, \ldots,$ and $b_3, b_4, \ldots b_9$ of the higher-degree components which measurement device 100 takes time to obtain for wafer W can also be used without change as coefficients of higher-degree components of the correction amounts of the position coordinates of wafer W in the exposure apparatus. Accordingly, on the wafer stage of the exposure apparatus, only a simple EGA measurement (e.g. measurement of around 3 to 16 wafer marks) has to be performed to obtain the linear components of the correction amounts of the position coordinates of wafer W. Since measurement device 100 is a device separate from the exposure apparatus, it becomes possible to obtain position information from more marks on the substrate without decreasing the throughput in the exposure process of the substrate.

Also, if alignment measurement can be performed on a different wafer with measurement device 100, concurrently with processing on the wafer by the exposure apparatus that includes the simplified EGA measurement and exposure previously described performed by the exposure apparatus, an efficient processing in which throughput of the wafer processing hardly decreases becomes possible.

Note that in the embodiment described above, for the sake of convenience, while either A-mode or B-mode was to be set as the measurement mode, the embodiment is not limited to this, and modes may also be set such as a C-mode in which a first number of wafer marks being two or more are detected for all shots on all the wafers in a lot, and a mode in which for all wafers in the lot, a second number of wafer marks being two or more are detected for a part of the shots, e.g. shots decided in advance located in the peripheral section of the wafer, and as for the remaining shots, one wafer marks is detected for each shot (referred to as a D-mode). Furthermore, an E-mode may be provided in which according to the detection results of the wafer marks of the first predetermined number of wafers in the lot, any one of A-mode, C-mode, and D-mode is selected for the remaining wafers in the lot.

Also, as a measurement mode of measurement device 100, as for all wafers in the lot, one or more wafer marks may be measured for a part of the shots, e.g. the number of shots being 90% or 80%, or as for the shots located in the center of the wafer, one or more wafer marks may be measured for shots arranged spaced apart by one spacing.

Note that in the embodiment above, while the case has been described where gratings RG1, RG2a, and RG2b each have periodic directions in the X-axis direction and the Y-axis direction, however, the embodiment is not limited to this, and the grating section (two-dimensional grating) that each of the first position measurement system 30 and the second position measurement system 50 are equipped with may have periodic directions which are in two directions that intersect each other within the XY plane.

Also, it is a matter of course that the structure and arrangement of the detection points of head section 32 of the first position measurement system 30 described above in the embodiment is a mere example. For example, the position of the detection point of mark detection system MDS and the detection center of head section 32 does not have to coincide with each other in at least one of the X-axis direction and the Y-axis direction. Also, the arrangement of the head section and grating RG1 (grating section) of the first measurement system 30 may be reversed. That is, the head section may be provided at slider 10 and the grating section may be provided at surface plate 12. Also, the first position measurement system 30 does not necessarily have to be equipped with encoder system 33 and laser interferometer system 35, and the first position measurement system 30 may be structured only with the encoder system. The first position measurement system may be structured with an encoder system that irradiates a beam on grating RG1 of slider 10 from the head section, receives the return beam (diffraction beam) from the grating, and measures the position information in directions of six degrees of freedom of slider 10 with respect to surface plate 12. In this case, the structure of the head section does not matter in particular. For example, a pair of XZ heads that irradiates detection beams on two points the same distance apart in the X-axis direction with respect to a predetermined point on grating RG1 and a pair of YZ heads that irradiates detection beams on two points the same distance apart in the Y-axis direction with respect to the predetermined point may be provided, or a pair of three-dimensional heads that irradiates detection beams on two points distanced apart in the X-axis direction on grating RG1 and an XZ head or a YZ head that irradiates a detection beam on a point whose position in the Y-axis direction differs from the two points described above may be provided. The first position measurement system 30 does not necessarily have to be able to measure the position information in directions of six degrees of freedom of slider 10 with respect to surface plate 12, and for example, may be a system that can measure position information only in the X, the Y and the θz directions. Also, the first position measurement system may be placed in between surface plate 12 and slider 10.

Similarly, the structure of the second position measurement system 50 described in the embodiment above is a mere example. For example, head sections 52A and 52B may be fixed at the surface plate 12 side and scales 54A and 54B may be provided integral to mark detection system MDS. Also, while the example of the second measurement system 50 having the pair of head sections 52A and 52B was described, the embodiment is not limited to this, and the second measurement system 50 may only have one head section or have three or more head sections. In any case, it is preferable that the positional relation in directions of six degrees of freedom between surface plate 12 and mark detection system MDS can be measured by the second position measurement system 50. However, the second measurement system does not necessarily have to be able to measure the positional relation in all the directions of six degrees of freedom.

Note that in the embodiment above, the case has been described where drive system 20 for driving slider 10 with respect to surface plate 12 in a non-contact manner is structured, with slider 10 being supported by levitation on surface plate 12 by the plurality of air bearings 18, the system including the first driver 20A which moves slider 10 in the X-axis direction and the second driver 20B which moves slider 10 in the Y-axis direction integral with the first driver 20A. However, the embodiment is not limited to this, and as drive system 20, a drive system having a structure in which slider 10 is moved in directions of six degrees of freedom on surface plate 12 can be employed. Such a drive system, as an example, can be structured using a magnetic levitation type planar motor. In such a case, air bearings 18 will not be required. Note that measurement device 100 may be equipped with a drive system for driving surface plate 12, separately from vibration isolator 14.

Other than this, a structure may be employed in which slider 10 is drivable, for example, in the X, the Y, and the θz directions with respect to surface plate 12 by a magnetic levitation type or an air floating type planar motor, and in this case, the second position measurement system 50 previously described does not necessarily have to be provided.

Second Embodiment

Next, a second embodiment in accordance with lithography systems including measurement device 100 described above will be described based on FIGS. 8 to 10.

Figure 8:
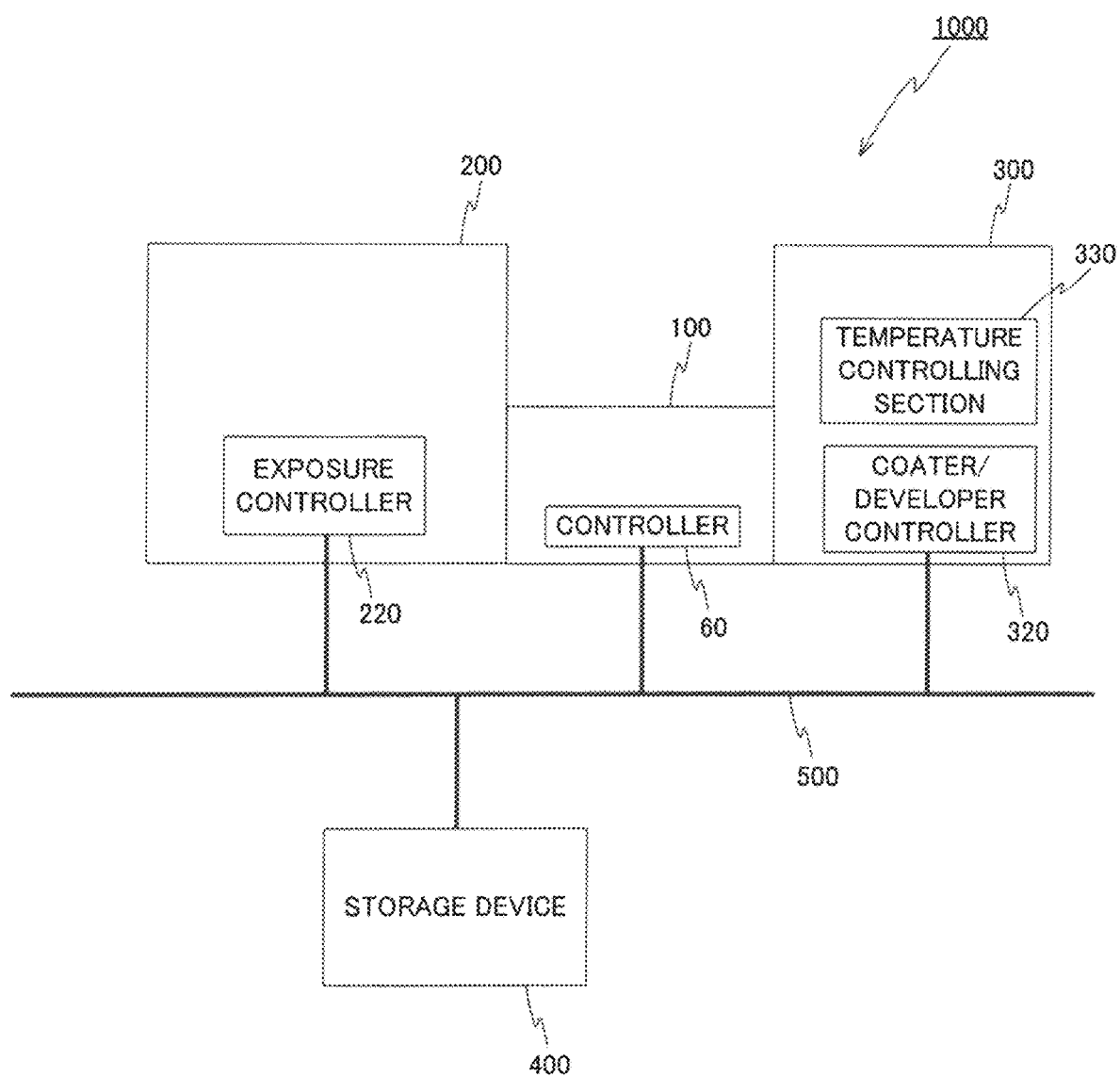
FIG. 8 is a view schematically showing an entire structure of a lithography system according to a second embodiment.

A lithography system 1000 related to the second embodiment, as is shown in FIG. 8, is equipped with an exposure apparatus 200, a measurement device 100, and a substrate processing device 300 that are in-line connected with one another. Here, as substrate processing device 300, since a coater developer (C/D) is used, hereinafter it will be described also as C/D 300, as appropriate. Lithography system 1000 is installed in a clean room.

In a general lithography system, as is disclosed in, for example, U.S. Pat. No. 6,698,944 and the like, an in-line interface section having a wafer carrier system inside a chamber for connecting in-line the exposure apparatus and the substrate processing device (C/D) is placed therebetween. Meanwhile, as it can be seen in FIG. 8, in lithography system 1000 related to the second embodiment, instead of the in-line interface section, measurement device 100 is placed in between exposure apparatus 200 and C/D 300.

Exposure apparatus 200, C/D 300 and measurement device 100 that lithography system 1000 is equipped with all have a chamber, and the chambers are placed adjacent to one another. An exposure controller 220 that exposure apparatus 200 has, a coater/developer controller 320 that C/D 300 has, and controller 60 that measurement device 100 has are connected to one another via a local area network (LAN) 500, and communication is performed between the three controllers. A storage device 400 is also connected to LAN 500.

Figure 9:
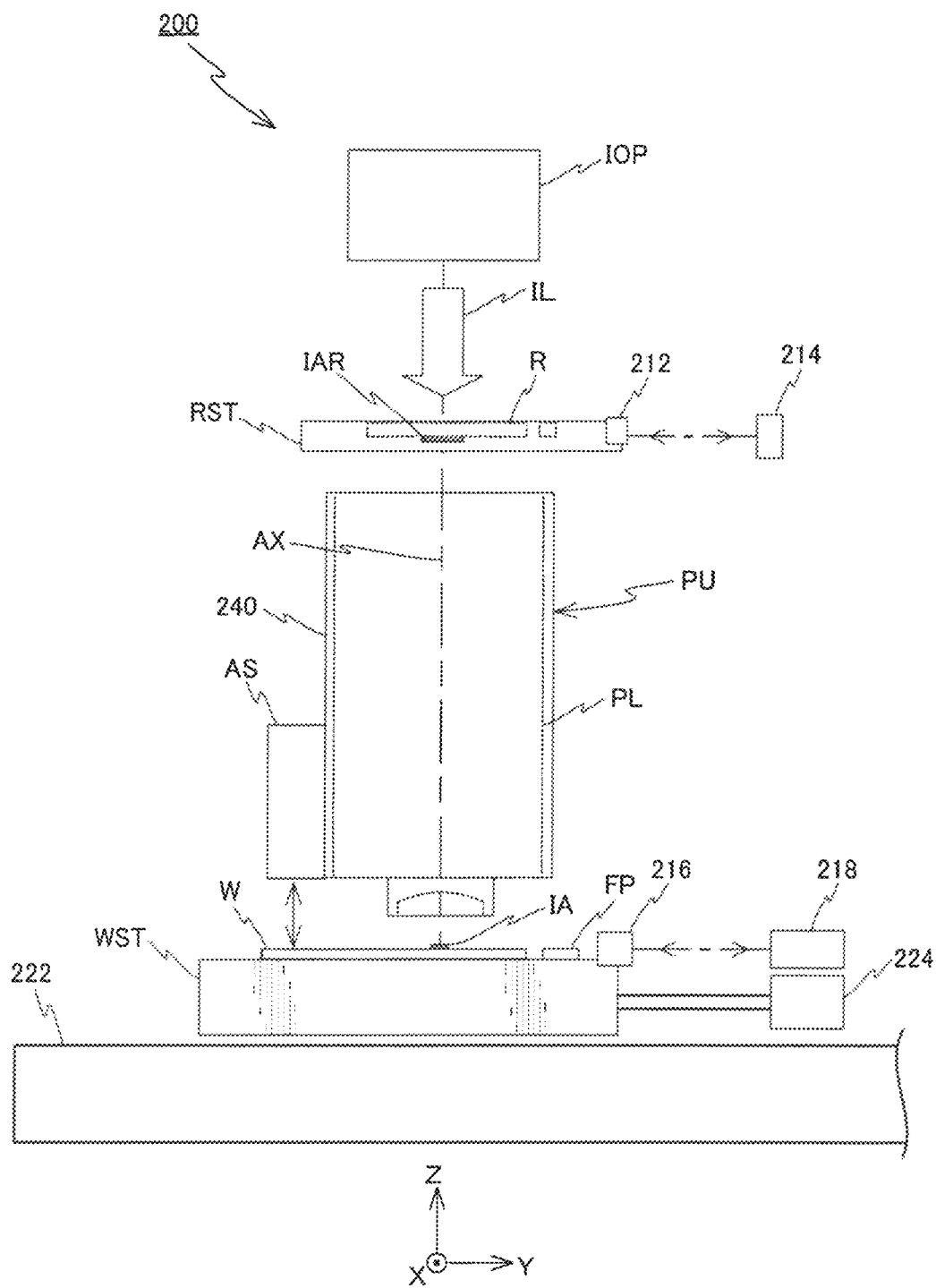
FIG. 9 is a view schematically showing a structure of an exposure apparatus in FIG. 8.

Exposure apparatus 200, as an example, is a projection exposure apparatus (scanner) of a step-and-scan method. FIG. 9 shows component parts inside the chamber of exposure apparatus 200, partly omitted.

Exposure apparatus 200, as is shown in FIG. 9, is equipped with an illumination system IOP, a reticle stage RST that holds reticle R, a projection unit PU that projects an image of a pattern formed on reticle R onto wafer W where a sensitive agent (resist) is coated, a wafer stage WST which moves within the XY plane holding wafer W, and a control system for these parts. Exposure apparatus 200 is equipped with a projection optical system PL that has an optical axis AX in the Z-axis direction parallel to optical axis AX1 of mark detection system MDS previously described.

Illumination system IOP includes a light source and an illumination optical system connected to the light source via a light-sending optical system, and illuminates a slit-shaped illumination area IAR narrowly extending in the X-axis direction (orthogonal direction of the page surface in FIG. 9) set (limited) on reticle R with a reticle blind (masking system) with an illumination light (exposure light) IL in an almost even illuminance. The structure of illumination system IOP is disclosed in, for example, U.S. Patent Application Publication No. 2003/0025890 and the like. Here, as illumination light IL, as an example, an ArF excimer laser beam (wavelength 193 nm) is used.

Reticle stage RST is arranged below illumination system IOP in FIG. 9. Reticle stage RST can be finely moved within a horizontal plane (XY plane) on a reticle stage surface plate (not shown) by a reticle stage drive system 211 (not shown in FIG. 9, refer to FIG. 10) including, e.g. a linear motor or the like, and can also be moved in a scanning direction (the Y-axis direction which is the lateral direction of the page surface in FIG. 9) in a range of predetermined strokes.

On reticle stage RST, a reticle R is mounted on which a pattern area and a plurality of marks whose positional relation with the pattern area is known are formed on a surface at the −Z side (pattern surface). Position information (including rotation information in the θz direction) within the XY plane of reticle stage RST is detected at all times by a reticle laser interferometer (hereinafter referred to as a "reticle interferometer") 214 via a movable mirror 212 (or a reflection surface formed on an edge surface of reticle stage RST) at a resolution of around, e.g. 0.25 nm. Measurement information of reticle interferometer 214 is supplied to exposure controller 220 (refer to FIG. 10). Note that the position information within the XY plane of reticle stage RST described above may be measured by an encoder instead of reticle laser interferometer 214.

Projection unit PU is arranged below reticle stage RST in FIG. 9. Projection unit PU includes a barrel 240 and projection optical system PL held in barrel 240. Projection optical system PL, for example, is double telecentric and has a predetermined projection magnification (e.g. such as ¼ times, ⅕ times, or ⅛ times). Reticle R is placed so that its pattern surface almost coincides with a first surface (object plane) of projection optical system PL, and wafer W whose surface is coated with a resist (sensitive agent) is placed at a second surface (image plane) side of projection optical system PL. Therefore, when illumination light IL from illumination optical system IOP illuminates illumination area IAR on reticle R, illumination light IL that has passed reticle R forms a reduced image of a circuit pattern of reticle R (a reduced image of a part of the circuit pattern) in illumination area IAR on an area (hereafter also called an exposure area) IA on wafer W conjugate with illumination area IAR via projection optical system PL. And by relatively moving reticle R in the scanning direction (the Y-axis direction) with respect to illumination area IAR (illumination light IL) and also relatively moving wafer W in the scanning direction (the Y-axis direction) with respect to exposure area IA (illumination light IL) in accordance with synchronous movement of reticle stage RST and wafer stage WST, scanning exposure of a shot area (divided area) on wafer W is performed, and the pattern of reticle R is transferred onto the shot area.

As projection optical system PL, as an example, a refraction system is used, consisting only of a plurality of, e.g. around 10 to 20 refraction optical elements (lens elements) arranged along optical axis AX parallel to the Z-axis direction. Of the plurality of lens elements structuring this projection optical system PL, a plurality of lens elements on the object plane side (reticle R side) are movable lenses which are shifted and moved in the Z-axis direction (optical axis direction of projection optical system PL) by driving elements (not shown) such as piezo elements and are drivable in inclination directions (that is, the θx direction and the θy direction) with respect to the XY plane. Then, based on instructions from exposure controller 220, an image forming characteristic correction controller 248 (not shown in FIG. 9, refer to FIG. 10) independently adjusts applied voltage to each driving element, which allows each movable lens to be individually moved, and various image forming characteristics of projection optical system PL (such as magnification, distortion aberration, astigmatism, coma aberration, and curvature of field) are to be adjusted. Note that instead of, or in addition to moving the movable lenses, an air tight chamber can be provided between specific lens elements that are adjacent inside barrel 240, and image forming characteristic correction controller 248 may be made to control the pressure of gas inside the air tight chamber, or image forming characteristic correction controller 248 may have the structure of being able to shift a center wavelength of illumination light IL. These structures also allow adjustment of the image forming characteristics of projection optical system PL.

Wafer stage WST is moved in predetermined strokes in the X-axis direction and the Y-axis direction on a wafer stage surface plate 222 by a stage drive system 224 (shown in a block in FIG. 9 for the sake of convenience) including a planar motor, a linear motor or the like, and is also finely moved in the Z-axis direction, the θx direction, the θy direction, and the θz direction. On wafer stage WST, wafer W is held by vacuum chucking or the like via a wafer holder (not shown). In the second embodiment, the wafer holder is to be able to hold by suction a 300 mm wafer. Note that instead of wafer stage WST, a stage device equipped with a first stage that moves in the X-axis direction, the Y-axis direction, and the θz direction and a second stage that finely moves on the first stage in the Z-axis direction, the θx direction and the θy direction may also be used. Note that one of, or both of wafer stage WST and the wafer holder of wafer stage WST may be called a "second substrate holding member".

Position information within the XY plane of wafer stage WST (including rotation information (yawing quantity (rotation quantity θz in the θz direction), pitching quantity (rotation quantity θx in the θx direction), rolling quantity (rotation quantity θy in the θy direction))) is detected at all times by a laser interferometer system (hereinafter shortly referred to as interferometer system) 218 via a movable mirror 216 (or a reflection surface formed on an edge surface of wafer stage WST) at a resolution of, for example, around 0.25 nm. Note that position information within the XY plane of wafer stage WST may be measured by an encoder system instead of interferometer system 218.

Figure 10:
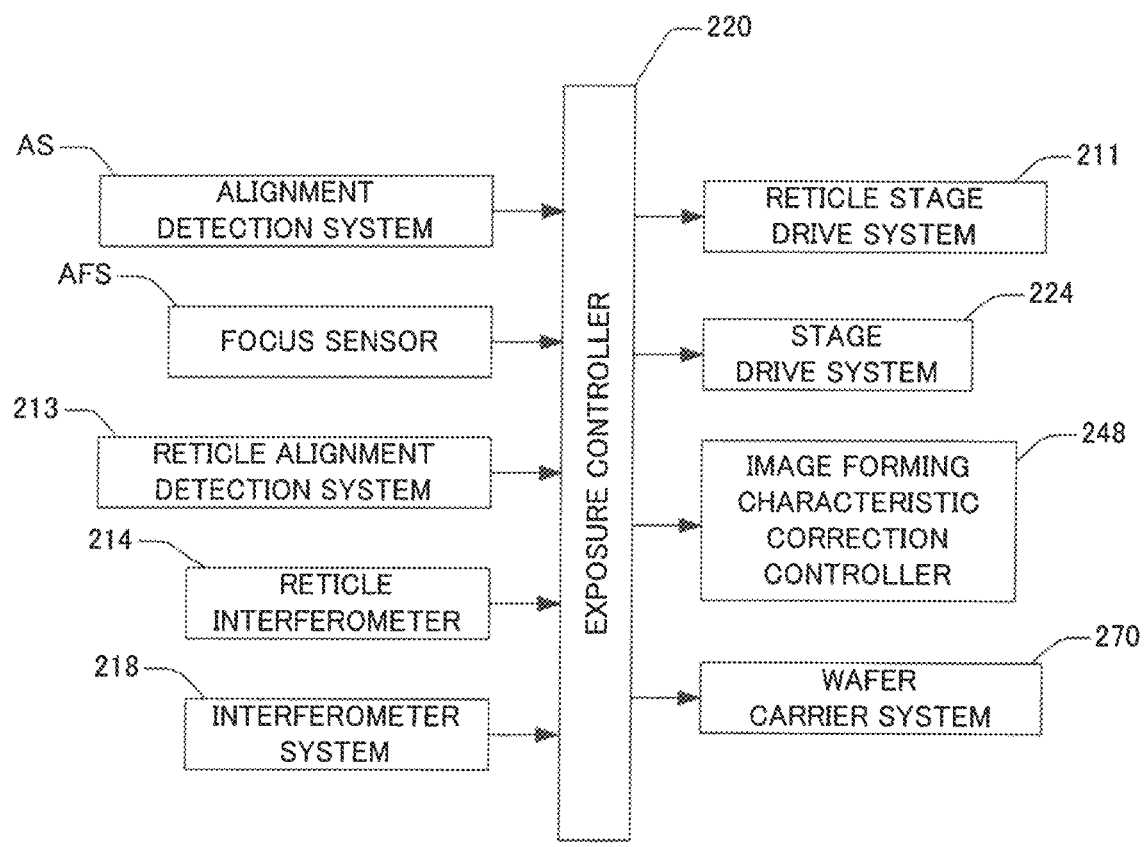

Measurement information of interferometer system 218 is supplied to exposure controller 220 (refer to FIG. 10). Exposure controller 220, based on measurement information of interferometer system 218, controls position (including rotation in the θz direction) within the XY plane of wafer stage WST via stage drive system 224.

Also, although it is not illustrated in FIG. 9, position and inclination quantity in the Z-axis direction of the surface of wafer W are measured, for example, using a focus sensor AFS (refer to FIG. 10) consisting of a multi-point focal position detection system of an oblique incidence method disclosed in, for example, U.S. Pat. No. 5,448,332 and the like. Measurement information of this focus sensor AFS is also supplied to exposure controller 220 (refer to FIG. 10).

Also, on wafer stage WST, a reference plate FP having a surface which is the same height as that of the surface of wafer W is fixed. Formed on the surface of this reference plate FP are a first reference mark used for base line measurement or the like of an alignment detection system AS and a pair of second reference marks detected by a reticle alignment detection system to be described later on.

On the side surface of barrel 240 of projection unit PU, alignment detection system AS is provided that detects alignment marks formed on wafer W or the first reference marks. As alignment detection system AS, as an example, an FIA (Field Image Alignment) system is used which is a type of image forming alignment sensor using an image processing method to measure a mark position by illuminating the mark with a broadband (wide band) light such as a halogen lamp and image processing an image of the mark. Note that instead of or along with alignment detection system AS by the image processing method, a diffracted light interference type alignment system may also be used.

In exposure apparatus 200, further above reticle stage RST, a pair of reticle alignment detection systems 213 (not shown in FIG. 9, refer to FIG. 10) that can simultaneously detect a pair of reticle marks located at the same Y position on reticle R mounted on reticle stage RST are provided arranged a predetermined distance apart in the X-axis direction. Detection results of the marks by reticle alignment detection system 213 are supplied to exposure controller 220.

FIG. 10 shows an input/output relation of exposure controller 220 in a block diagram. As is shown in FIG. 10, other than the component parts described above, exposure apparatus 200 is equipped with parts such as a wafer carrier system 270 for carrying the wafer connected to exposure controller 220. Exposure controller 220 includes a microcomputer, a workstation and the like, and has overall control over the apparatus including the component parts described above. Wafer carrier system 270, for example, consists of a horizontal multi-joint arm robot.

Referring back to FIG. 8, although it is omitted in the drawings, C/D 300 is equipped with, for example, a coating section that performs coating of a sensitive agent (resist) with respect to a wafer, a developing section that can develop a wafer, a baking section that performs pre-bake (PB) and pre-develop bake (post-exposure bake: PEB), and a wafer carrier system (hereinafter referred to as a C/D inner carrier system for the sake of convenience). C/D 300 is furthermore equipped with a temperature controlling section 330 that can control the temperature of the wafer. Temperature controlling section 330 is normally a cooling section, and is equipped, for example, with a flat plate (temperature controlling device) called a cool plate. The cool plate is cooled, for example, by circulating cooling water. Other than this, thermoelectric cooling by the Peltier effect may be used in some cases.

Storage device 400 includes a control device connected to LAN 500 and a storage device connected to the control device via a communication channel such as Small Computer System Interface (SCSI).

With lithography system 1000 according to the second embodiment, measurement device 100, exposure apparatus 200, and C/D 300 each have a bar code reader (not shown), and while the wafer is being carried by each of wafer carrier system 70 (refer to FIG. 6), wafer carrier system 270 (refer to FIG. 10), and the C/D inner carrier system (not shown), the bar code reader appropriately reads identification information of each wafer such as, e.g. wafer number, lot number and the like. Hereinafter, description related to the reading of identification information of each wafer using the bar code reader will be omitted to simplify the description.

In lithography system. 1000, exposure apparatus 200, C/D 300 and measurement device 100 (hereinafter also appropriately called three devices 100, 200, and 300) each perform processing on many wafers continuously. In lithography system 1000, the overall processing sequence is decided so that throughput of the system in total becomes maximum, that is, for example, processing time of other devices completely overlap the processing time of the device that requires the longest time for processing.

In the description below, a flow of operations performed in the case of processing many wafers continuously with lithography system 1000 will be described.

Firstly, the C/D inner carrier system (e.g. SCARA robot) takes out the first wafer (refer to as $W_1$) from a wafer carrier placed within the chamber of C/D 300 and delivers the wafer to the coating section. In accordance with the delivery, the coating section begins coating of resist. When the coating of resist is completed, the C/D inner carrier system takes out wafer $W_1$ from the coating section, and delivers the wafer to the baking section. In accordance with the delivery, the baking section begins heating processing (PB) of wafer $W_1$. Then, when PB of the wafer is completed, the C/D inner carrier system takes out wafer $W_1$ from the baking section, and delivers the wafer to temperature controlling section 330. In accordance with the delivery, cooling of wafer $W_1$ using the cool plate inside temperature controlling section 330 begins. This cooling is performed with the target temperature being a temperature which does not have any influence inside exposure apparatus 200, generally, for example, the target temperature of an air conditioning system of exposure apparatus 200 which is decided in a range of 20 to 25 degrees. Normally, at the point when the wafer is delivered to temperature controlling section 330, the temperature of the wafer is within a range of ±0.3[° C.], however, temperature controlling section 330 adjusts the temperature to a range of ±10[mK] to the target temperature.

Then, when the cooling (temperature control) inside the temperature controlling section 330 is completed, wafer $W_1$ is mounted on a first substrate delivery section provided in between C/D 300 and measurement device 100 by the C/D inner carrier system.

Inside C/D 300, a series of operations on wafers similar to the ones described above as in resist coating, PB, cooling, and carrying operation of the wafers described above that accompanies the series of operations are repeatedly performed, and the wafers are sequentially mounted on the first substrate delivery section. Note that practically by providing two or more each of the coating section and the C/D inner carrier system inside the chamber of C/D 300, parallel processing on a plurality of wafers becomes possible and the time required for pre-exposure processing can be shortened.

In measurement device 100, wafer $W_1$ before exposure sequentially mounted on the first substrate delivery section by the C/D inner carrier system is loaded on slider 10 in the procedure described earlier in the first embodiment by the cooperative work between wafer carrier system 70 and the vertical movement member on slider 10. After the loading, measurement device 100 performs alignment measurement of the wafer in the measurement mode set, and controller 60 obtains the correction amounts (coefficients $a_0, a_1, \ldots b_0, b_1, \ldots$ of the above formula (1)) of the position coordinates of the shot on wafer W.

Controller 60 correlates historical information such as the correction amounts (coefficients $a_0, a_1, \ldots b_0, b_1, \ldots$ of the above formula (1)) of the position coordinates obtained, information on the wafer marks whose position information of the marks are used to calculate the correction amounts, information on the measurement mode, and information on all wafer marks whose detection signals were favorable and identification information (wafer number, lot number) of wafer $W_1$ and makes an alignment history data (file), and stores the information in storage device 400.

Thereafter, wafer carrier system 70 mounts wafer $W_1$ that has finished alignment measurement on a loading side substrate mounting section of a second substrate delivery section provided near measurement device 100 inside the chamber of exposure apparatus 200. Here, in the second substrate delivery section, loading side substrate mounting section and an unloading side substrate mounting section are provided.

Hereinafter, in measurement device 100, to the second wafer and after in the same procedure as wafer $W_1$, alignment measurement, making of alignment history data (file), and wafer carriage are to be repeatedly performed.

Wafer $W_1$ mounted on the loading side substrate mounting section previously described is carried to a predetermined waiting position inside exposure apparatus 200 by wafer carrier system 270. However, the first wafer, wafer $W_1$ is immediately loaded onto wafer stage WST by exposure controller 220, without waiting at the waiting position. This loading of the wafer is performed in a similar manner as the loading performed by exposure controller 220 at the measurement device 100 previously described, using the vertical movement member (not shown) on wafer stage WST and wafer carrier system 270. After the loading, search alignment similar to the description earlier using alignment detection system AS and wafer alignment by the EGA method whose alignment shots are, e.g. 3 to 16 shots, are performed on the wafer on wafer stage WST. On this wafer alignment by the EGA method, exposure controller 220 of exposure apparatus 200 searches the alignment history data file stored in storage device 400, with the identification information of the wafer (target wafer) subject to wafer alignment and exposure serving as a key, and acquires the alignment history data of the target wafer. Then, after predetermined preparatory operations, exposure controller 220 performs the following wafer alignment, according to information on the measurement mode included in the alignment history data which has been acquired.

First of all, the case will be described when information of A-mode is included. In this case, a number of wafer marks corresponding to the number of alignment shots are selected as detection targets from the wafer marks whose position information are measured (marks whose position information are used for calculating the correction amount) by measurement device 100 included in the alignment history data, and the wafer marks serving as detection targets are detected using alignment detection system AS, and based on the detection results and the position (measurement information by interferometer system 218) of wafer stage WST at the time of detection, position information of each wafer mark that are detection targets are obtained, and using the position information, EGA operation is performed and each of the coefficients of the following formula (2) are obtained.

$$\left. \begin{array}{l} dx = c_0 + c_1 \cdot X + c_2 \cdot Y \\ dy = d_0 + d_1 \cdot X + d_2 \cdot Y \end{array} \right\} \quad (2)$$

Then, exposure controller 220 substitutes the coefficients $(c_0, c_1, c_2, d_0, d_1, d_2)$ obtained here to coefficients $(c_0, c_1, c_2, d_0, d_1, d_2)$ included in the alignment history data, obtains correction amounts (alignment correction components) dx and dy of the position coordinates of each shot using polynomial expressions related to the design position coordinates X and Y of each shat in a wafer coordinate system whose origin is the center of the wafer expressed by the following formula (3) which includes the coefficients after the substitution, and based on these correction amounts, decides a target position (hereinafter called a positioning target position for the sake of convenience) for positioning with respect to an exposure position (projection position of a reticle pattern) on exposure of each shot for correcting the wafer grid. Note that in the embodiment, while the exposure is performed by the scanning exposure method and not by the static exposure method, the term positioning target position is used for the sake of convenience.

$$dx = c_0 + c_1 \cdot X + c_2 \cdot Y + a_3 \cdot X^2 + a_4 \cdot X \cdot Y + a_5 \cdot Y^2 + \\ a_6 \cdot X^3 + a_7 \cdot X^2 Y + a_8 \cdot X \cdot Y^2 + a_9 \cdot Y^3 \ldots \\ dy = d_0 + d_1 \cdot X + d_2 \cdot Y + b_3 \cdot X^2 + b_4 \cdot X \cdot Y + b_5 \cdot Y^2 + \\ b_6 \cdot X^3 + b_7 \cdot X^2 \cdot Y + b_8 \cdot X \cdot Y^2 + b_9 \cdot Y^3 \ldots \quad (3)$$

Note that also in exposure apparatus 200, since rotation between the reference coordinate system (stage coordinate system) that sets the movement of wafer stage WST and the wafer coordinate system is canceled due to search alignment, there is no need to distinguish between the reference coordinate system and the wafer coordinate system in particular.

Next, the case will be described when B-mode is set. In this case, exposure controller 220 decides a positioning target position for each shot for correcting the wafer grid according to a similar procedure as the above A-mode. However, in this case, in the alignment history data, of a plurality of wafer marks for some shots and one wafer mark each for the remaining shots, wafer marks whose detection signals were favorable are included as the wafer marks whose position information of the mark are used to calculate the correction amount.

Then, in addition to deciding the positioning target position of each shot described above, exposure controller 220 selects a number of wafer marks necessary to obtain the shape of the shot from the above plurality of wafer marks for some shots, and using the position information (actual measurement values) of these wafer marks, performs statistical calculation (also referred to as in-shot multi-point EGA operation) applying a least squares method on a model formula [Mathematical 7] disclosed in, for example, U.S. Pat. No. 6,876,946, and obtains the shape of the shot. Specifically, of the 10 parameters in the model formula [Mathematical 7] disclosed in the above U.S. Pat. No. 6,876,946, chip rotation ($\theta$), chip rectangular degree error (w), and chip scaling (rx) in the x-direction and chip scaling (ry) in the y-direction are obtained. As for the in-shot multi-point EGA operation, since the details are disclosed in detail in the above U.S patent, the description thereabout will be omitted.

Then, exposure controller 220 performs exposure by the step-and-scan method on each shot on wafer $W_1$, while controlling the position of wafer stage WST according to the positioning target positions. Here, in the case the shape of the shot is also obtained by in-shot multi-point EGA measurement, during scanning exposure, at least one of a relative scanning angle between reticle stage RST and wafer stage WST, scanning speed ratio, relative position of at least one of reticle stage RST and wafer stage WST with respect to the projection optical system, image forming characteristic (aberration) of projection optical system. PL, and wavelength of illumination light (exposure light) is adjusted so that the projection image of the pattern of reticle R by projection optical system PL changes in accordance with the shape of shot obtained. Here, adjustment of the image forming characteristic (aberration) of projection optical system PL and adjustment of the center wavelength of illumination light IL are performed by exposure controller 200 via image forming characteristic correction controller 248.

In parallel with EGA wafer alignment and exposure performed on the wafer (in this case, wafer $W_1$) on wafer stage WST, measurement device 100 executes wafer alignment measurement in the mode set, making of alignment history data and the like on a second wafer (referred to as wafer $W_2$) in the procedure previously described.

Then, before exposure is completed on the wafer (in this case, wafer $W_1$) on wafer stage WST, measurement processing of measurement device 100 is completed and the second wafer $W_2$ is mounted on the loading side substrate mounting section by wafer carrier system 70, carried to a predetermined waiting position inside exposure apparatus 200 by wafer carrier system 270, and then is to wait at the waiting position.

Then, when exposure of wafer $W_1$ is completed, wafer $W_1$ and wafer $W_2$ are exchanged on the wafer stage, and to wafer $W_2$ that has been exchanged, wafer alignment and exposure similar to the previous description is performed. Note that in the case carriage to the waiting position of wafer $W_2$ cannot be completed by the time exposure on the wafer (in this case, wafer $W_1$) on the wafer stage is completed, the wafer stage is to wait near the waiting position while holding the wafer which has been exposed.

In parallel with the wafer alignment to wafer $W_2$ that has been exchanged, wafer carrier system 270 carries wafer $W_1$ that has been exposed to the unloading side substrate mounting section of the second substrate delivery section.

Hereinafter, as is previously described, wafer carrier system 70, in parallel with the alignment measurement of the wafer by measurement device 100, is to repeatedly perform the operation of carrying and mounting the wafer that has been exposed from the unloading side substrate mounting section onto the first substrate delivery section, and the operation of taking out the wafer before exposure that has completed measurement from slider 10 and carrying the wafer to the loading side substrate mounting section in a predetermined degree.

The wafer that has been exposed carried and mounted on the first substrate delivery section by wafer carrier system 70 in the manner described earlier is carried into the baking section by the C/D inner carrier system where PEB is performed on the wafer by a baking apparatus in the baking section. The baking section can simultaneously house a plurality of wafers.

Meanwhile, the wafer that has completed PEB is taken out from the baking section by the C/D inner carrier system, and then carried into the developing section where development by a developing apparatus begins inside.

Then, when developing of the wafer is completed, the wafer is taken out from the developing section by the C/D inner carrier system and delivered to a predetermined housing shelf inside the wafer carrier. Hereinafter, in C/D 300, in the procedure similar to that of wafer $W_1$, the operations of PEB, development, and wafer carriage are to be repeatedly performed on the second wafer that has been exposed and the wafers thereafter.

As is described so far, with lithography system 1000 according to the second embodiment, in parallel with the operations of exposure apparatus 200, measurement device 100 can perform alignment measurement of the wafer, and also can perform full-shot EGA in which all shots serve as sample shots in parallel with the wafer alignment and exposure operation of exposure apparatus 200. Further, since the coefficients of the higher-degree components in the model formula obtained by the full-shot EGA can be used without any changes in exposure apparatus 200, by only performing alignment measurement in which several shots serve as alignment shots and obtaining the coefficients of the lower-degree components in the above model formula in exposure apparatus 200, it becomes possible to calculate the positioning target position on exposure of each shot with good precision using the coefficients of the lower-degree components obtained and the coefficients of the higher-degree components acquired by measurement device 100, similar to the case in which coefficients of the lower-degree and higher-degree components of model formula (1) were obtained in exposure apparatus 200. Accordingly, it becomes possible to improve overlay accuracy of the image of the pattern of the reticle and the pattern formed in each shot area on the wafer on exposure, without decreasing the throughput of exposure apparatus 200.

Note that with lithography system 1000 according to the second embodiment, in exposure apparatus 200, the case has been described where coefficients of the lower-degree components of the first-degree or less of the above model formula are obtained, and the coefficients of the lower-degree components and coefficients of the higher-degree components of the second-degree or more of the above model formula acquired by measurement device 100 are used. However, the embodiment is not limited to this, and for example, coefficients of the components of the second-degree or less of the above model formula may be obtained from the detection results of the alignment marks in exposure apparatus 200, and the coefficients of the components of the second-degree or less and coefficients of the higher-degree components of the third-degree or more of the above model formula acquired by measurement device 100 may be used. Or, for example, coefficients of the components of the third-degree or less of the above model formula may be obtained from the detection results of the alignment marks in exposure apparatus 200, and the coefficients of the components of the third-degree or less and coefficients of the higher-degree components of the fourth-degree or more of the above model formula acquired by measurement device 100 may be used. That is, coefficients of the components of the $(N-1)^{th}$-degree (N is an integer of 2 or more) or less of the above model formula may be obtained from the detection results of the alignment marks in exposure apparatus 200, and the coefficients of the components of the $(N-1)^{th}$-degree and coefficients of the higher-degree components of the $N^{th}$ degree or more of the above model formula acquired by measurement device 100 may be used.

Note that in lithography system 1000, in the case measurement unit 40 of measurement device 100 is equipped with the multi-point focal position detection system previously described, measurement device 100 may perform flatness measurement (also called focus mapping) of wafer W along with the wafer alignment measurement. In this case, by using the results of the flatness measurement, focus-leveling control of wafer W at the time of exposure becomes possible without exposure apparatus 200 performing the flatness measurement.

Note that in the second embodiment above, while the target was a 300 mm wafer, the embodiment is not limited to this, and the wafer may also be a 450 mm wafer that has a diameter of 450 mm. Since measurement device 100 can also perform wafer alignment separately from exposure apparatus 200, even if the wafer is a 450 mm wafer, for example, full-point EGA measurement becomes possible without causing a decrease in the throughput of exposure processing.

Note that although it is omitted in the drawings, in lithography system 1000, exposure apparatus 200 and C/D 300 may be connected in-line, and measurement device 100 may be placed on an opposite side to exposure apparatus 200 of C/D 300. In this case, measurement device 100 can be used for alignment measurement (hereinafter referred to as pre-measurement) similar to the previous description performed on, for example, wafers before resist coating. Or, measurement device 100 can be used for positional displacement measurement (overlay displacement measurement) of overlay displacement measurement marks to wafers that have completed development, or can also be used for pre-measurement and overlay displacement measurement.

—Wafer Grid Change Control

Figure 11:
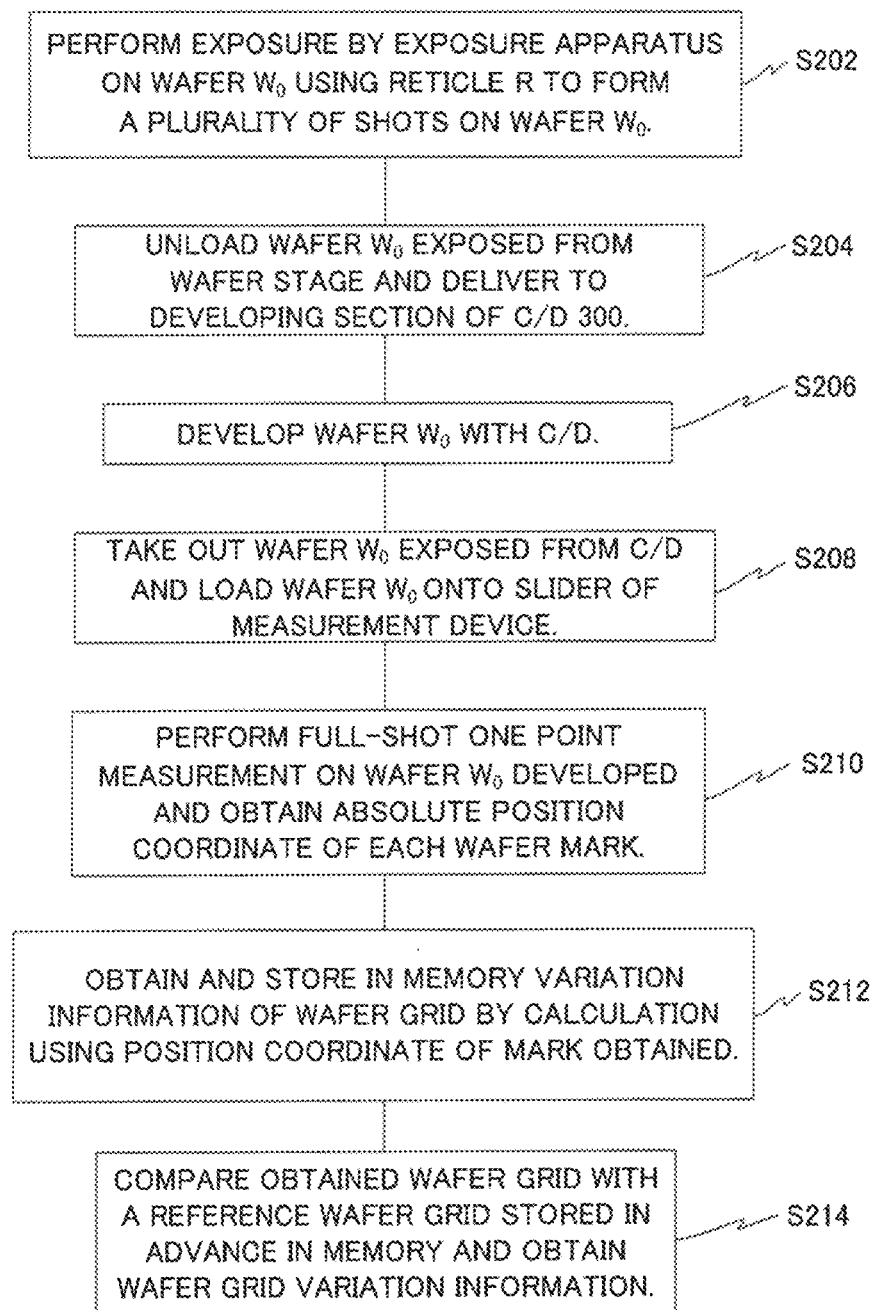
FIG. 11 is a view schematically showing a processing flow in the case of applying a control method of a wafer grid due to an exposure apparatus using a measurement device 100 to a lithography system 1000.

Next, a case when a control method of a wafer grid due to an exposure apparatus using measurement device 100 is applied to lithography system 1000 will be described as an example. FIG. 11 schematically shows a processing flow of the control method of the wafer grid in this case.

First of all, in step S202, exposure apparatus 200 performs exposure on a bare wafer (wafer $W_0$ for the sake of convenience) by the step-and-scan method using product reticle R. Here, in reticle R, on its pattern surface, marks (become wafer marks when transferred onto a wafer) or the like are to be formed on the peripheral area or inside the pattern area (in the case a plurality of chips are made in one shot), along with a rectangular pattern area. Here, wafer $W_0$ is a wafer that is not exposed yet, and its surface is coated with a resist by C/D 300. Accordingly, on exposure of wafer $W_0$, alignment is not performed and reticle stage RST and wafer stage WST are driven and controlled by exposure controller 220, based on design values. By the exposure of step S202, on the resist layer of wafer $W_0$, a transferred image (latent image) of the I (e.g. 98) rectangular pattern areas arranged in the shape of a matrix and marks corresponding to each shot whose positional relation with each shot is known designwise are formed.

Next, in step S204, wafer $W_0$ that has been exposed is unloaded from wafer stage WST, and is delivered into the developing section of C/D 300. Specifically, wafer $W_0$ is carried by wafer carrier system 270 and wafer carrier system 70 and is mounted on the first substrate delivery section provided in between C/D 300 and measurement device 100. Then, wafer $W_0$ is delivered into the developing section of C/D 300 by the C/D inner carrier system.

Next, in step S206, wafer $W_0$ is developed by the developing apparatus of the developing section of C/D 300. After this development, on wafer $W_0$, I (e.g. 98) rectangular shots arranged in the shape of a matrix and a resist image of the wafer mark (hereinafter appropriately referred to as a wafer mark) corresponding to each shot whose positional relation with each shot is known designwise are formed.

Next, in step S208, wafer $W_0$ that has been exposed is taken out from C/D 300, and is loaded onto slider 10 of measurement device 100. Specifically, wafer $W_0$ is taken out from the developing section by the C/D inner carrier system and is mounted on the first substrate delivery section. Then, wafer $W_0$ is carried to an area above slider 10 at the loading position from the first substrate delivery section by wafer carrier system 70 of measurement device 100, and then is loaded on slider 10.

Next, in step S210, controller 60 performs full-shot one point measurement previously described on wafer $W_0$ that has been developed, and absolute position coordinates are obtained for each wafer mark. That is, while measuring position information of slider 10 using the first position measurement system 30 (and the second position measurement system 50), controller 60 detects each of the I wafer marks corresponding to each of the I (e.g. 98) shots using mark detection system MDS, and based on the detection results of each of the I wafer marks and absolute position coordinates (X, Y) of slider 10 at the time of detection of each of the I wafer marks, obtains the absolute position coordinates (X, Y) of the I wafer marks corresponding to each of the I shots on wafer $W_0$. At this time, based on measurement values in the θx direction and the θy direction of slider 10 measured by the first position measurement system 30, controller 60 obtains the absolute position coordinates (X, Y) of the I wafer marks with the Abbe errors in the X-axis direction and the Y-axis direction of the first position measurement system 30 and measurement values in the X-axis direction and the Y-axis direction of the second position measurement system 50 serving as offsets.

Next, in step S212, controller 60 obtains change information of arrangement (wafer grid) of the I shots on wafer $W_0$, using the absolute position coordinates of the I marks. For example, controller 60 obtains actual measurement values of each of the absolute position coordinates (X, Y) of the I shots from the absolute position coordinates of the I wafer marks based on a known positional relation between the wafer mark and the shot center, and based on difference data between the actual measurement values of each of the absolute position coordinates (X, Y) of the I shots and design values of the position coordinates (X, Y) of each shot, obtains the coefficients $a_0, a_1, \ldots, b_0, b_1, \ldots$ of formula (1) previously described, using statistical calculation such as the least squares method. Here, the coefficients $a_0, a_1, \ldots, b_0, b_1, \ldots$ obtained are substituted into formula (1), and formula (1) after the coefficients are decided is stored in an internal memory (or storage device 400) as change information of the wafer grid.

Or, controller 60 may obtain actual measurement values of each of the absolute position coordinates (X, Y) of the I shots from the absolute position coordinates of the I wafer marks based on a known positional relation between the wafer mark and the shot center, make a map consisting of difference data between the actual measurement values of each of the absolute position coordinates (X, Y) of the I shots and design values of the position coordinates (X, Y) of each shot, and store the map in memory (or storage device 400) as change information of the wafer grid.

This allows the variation amount to be obtained from the design values of the wafer grid and the variation amount to be controlled at any time.

The next step S214 is performed when necessary. In step S214, controller 60 compares the change information obtained in step S210 from the design values of the wafer grid with the change information of the wafer grid serving as a reference stored in advance in memory (or storage device 400), and then obtains the variation amount of the wafer grid from the variation of the wafer grid serving as a reference. By this processing in step S14, it becomes possible to control shot arrangement errors occurring due to the error of stage grids between different exposure apparatus, or shot arrangement errors occurring due to the error of stage grids at a different point of time in the same exposure apparatus.

In the former case, by performing exposure similar to step S202 previously described on a bare wafer different from wafer $W_0$ using reticle R with a scanning stepper different from exposure apparatus 200 and performing processing similar to those described in steps S204 to S212 on the wafer that has been exposed prior to the processing of step S214, change information of the wafer grid serving as a reference is obtained and is stored in memory (or storage device 400).

In the latter case, by performing processing similar to those described in steps S202 to S208 on the wafer different from wafer $W_0$ prior to the processing of step S214, change information of the wafer grid serving as a reference is obtained and is stored in memory (or storage device 400).

As is obvious from the description above, in the control method according to the embodiment, variation of the wafer grid caused by the apparatus can be controlled without using a reference wafer. Therefore, inconveniences like the ones described below that occur when using a reference wafer can be avoided.

That is, the operation using the reference wafer requires a plurality of exposure apparatus to use the reference wafer which causes a conflict among the exposure apparatus. The reference wafer is normally made in a plurality of numbers and is not limited to one; therefore, individual difference among the reference wafers has to be secured. The reference wafers also may be damaged, or may deteriorate over time. Furthermore, in the wafer grid control method using the reference wafer, the surface of the reference wafer is coated with a resist and the reference wafer is exposed, and then when the processing necessary is completed the resist is removed and the reference wafer is cleaned. By repeating this process, the surface may be damaged. Also, marks of a chuck member (such as a pin chuck) that the wafer holder has are put on the rear surface of the reference wafer, and this causes an adsorption distortion of the reference wafer, distorting the wafer grid.

Meanwhile, not using the reference wafer has the following advantages.

a. Measurement (correction) can be executed when an operator wants to measure the variation (perform correction) of the wafer grid, without worrying about the availability or the serial number of the reference wafer.

b. Since a bare wafer can be used instead of the reference wafer, the quality can be controlled easily.

c. Wafer grid control can be performed using a product shot map and a product reticle. That is, wafer grid control can be performed using the overlay measurement marks and alignment marks applied on the product reticle. As a result, the reticle exclusively used for quality control will not be necessary. Also, since quality control becomes possible by the product shot map itself, and variation amount of the wafer grid occurring not only by location-dependent error but also by all error factors that occur due to scanning speed, acceleration, product exposure operation and the like can also be measured, by performing correction based on the measurement results, it becomes possible to completely eliminate the kind of compromise described earlier in the description.

In lithography system 1000 according to the second embodiment, for example, in the case throughput of wafer processing of the whole lithography system 1000 is not to be decreased more than necessary, the wafer that has been developed may be loaded on slider 10 of measurement device 100 again in the procedure similar to the wafer after PB and before exposure previously described, and measurement of positional displacement of the overlay displacement measurement mark (e.g. a box-in-box mark) formed on the wafer may be performed. That is, since measurement device 100 can measure the absolute value of the marks on the wafer (on the reference coordinate system according to the first position measurement system 30), not only is the measurement device suitable for wafer alignment measurement but also as a measurement device for performing positional displacement measurement of the overlay displacement measurement marks which is a kind of relative position measurement.

—Overlay Measurement

Figure 12:
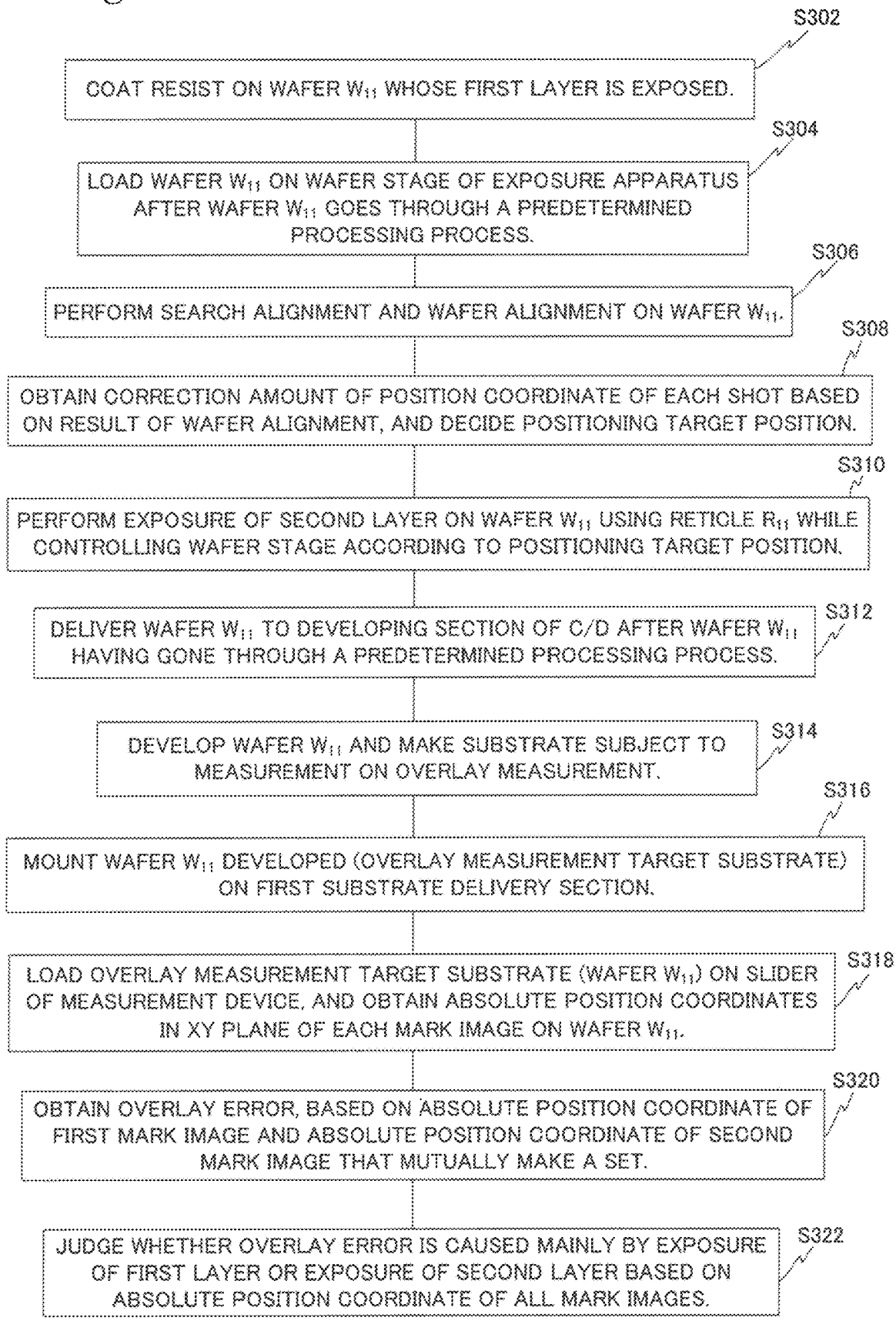
FIG. 12 is a view schematically showing a processing flow in a case overlay measurement method using measurement device 100 is applied to lithography system 1000.

Next, an example will be described in the case an overlay measurement method using measurement device 100 is applied to lithography system 1000. FIG. 12 schematically shows a processing flow of an overlay measurement method in this case.

First of all, in step S302, in the coating section of C/D 300, resist coating is performed on a wafer (to be wafer $W_{11}$) on which exposure of a first layer (underlayer) has been performed by an exposure apparatus different from exposure apparatus 200, such as a scanner or a stepper. On wafer before the resist is coated, by exposing the underlayer, with a plurality of, e.g. I (e.g. I is 98), shots, a wafer mark whose design positional relation between the shots is known and a first mark (to be precise, a resist image of the first mark (also appropriately called a first mark image)) for overlay displacement measurement are formed, corresponding to each shot. In this case, design positional relation of each of the I first mark images is also known.

Next, in step S304, wafer $W_{11}$ on which the resist is coated is loaded on wafer stage WSTS of exposure apparatus 200 after going through the predetermined processing steps similar to wafer $W_1$ previously described. Specifically, after heating processing (PB) at the baking section, temperature control at the temperature controlling section 330, and alignment measurement (A-mode measurement in this case) by measurement device 100 are performed on wafer $W_{11}$, wafer $W_{11}$ is loaded on wafer stage WST.

Next, in step S306, exposure controller 220 of exposure apparatus 200 performs search alignment similar to the one previously described using alignment detection system AS and wafer alignment by the EGA method in which for example, around 3 to 16 shots are set as alignment shots, on wafer $W_{11}$ on wafer stage WST.

Next, in step S308, exposure controller 220 obtains correction amounts (alignment correction components) dx, dy of the position coordinates of each shot expressed in formula (3) previously described, based on the results of wafer alignment, and based on the correction amounts, decides the positioning target position on exposure of each shot for correcting the wafer grid.

Next, in step S301, exposure apparatus 200 performs exposure on a second layer (an upper layer that uses the first layer as an underlayer) by the step-and-scan method on each shot on wafer $W_{11}$, while controlling the position of wafer stage WST according to the positioning target positions. At this point, exposure apparatus 200 performs exposure using a reticle (to be reticle $R_{11}$ for the sake of convenience) on which a second mark is formed corresponding to the first mark image on wafer $W_{11}$. Accordingly, by the exposure of the second layer, the pattern area of reticle $R_{11}$ is overlaid and transferred onto the I shots on wafer $W_{11}$, and I transferred images of the second marks are also formed placed in a positional relation corresponding to the positional relation of the I first marks.

Next, in step S312, wafer $W_{11}$ that has completed exposure of the second layer is delivered into the developing section of C/D 300, after going through the predetermined processing steps similar to wafer $W_1$ that has been exposed. Specifically, wafer $W_{11}$ is carried by wafer carrier system 270 to the unloading side substrate mounting section of the second substrate delivery section, then is carried by wafer carrier system 70 to the first substrate delivery section from the unloading side substrate mounting section, and then is carried into the baking section of C/D 300 by the C/D inner carrier system where PEB is performed by the baking apparatus in the baking section. Wafer $W_{11}$ that has completed PEB is taken out from the baking section by the C/D inner carrier system, and then carried into the developing section.

Next, in step S314, the developing apparatus of the developing section develops wafer $W_{11}$ on which a plurality of transferred images of the second marks is formed. By this developing, on wafer $W_{11}$, along with I shots, I sets of the first mark images and the corresponding second mark images are formed in a predetermined positional relation and the wafer becomes the substrate subject to measurement on overlay measurement. That is, the substrate (overlay measurement target substrate) subject to measurement on overlay measurement is made in the manner described above. Here, as a set of the first mark image and the corresponding second mark image, for example, a resist image of a box-in-box mark consisting of an outer box mark and an inner box mark arranged inside of the outer box mark can be used.

Next, in step S316, wafer $W_{11}$ (substrate subject to overlay measurement) that has been developed is taken out from the developing section by the C/D inner carrier system and is mounted on the first substrate delivery section.

Next, in step S318, controller 60 of measurement device 100 loads wafer $W_{11}$ (overlay measurement target substrate) that has been developed and is mounted on the first substrate delivery section on slider 10 in the procedure described earlier, and obtains absolute position coordinates within the XY plane of the I sets of the first mark image and the second mark image in the following manner. That is, controller 60, while measuring position information of slider 10 using the first position measurement system 30 (and the second position measurement system 50), detects each of the I sets of the first mark image and the second mark image on wafer $W_{11}$ using mark detection system MDS, and based on detection results of each of the I sets of the first mark image and the second mark image and absolute position coordinates (X, Y) of slider 10 at the time of detection of each of the mark images, obtains the absolute position coordinates within the XY plane of the I sets of the first mark image and the second mark image on wafer $W_{11}$. At this time, based on measurement values in the $\theta x$ direction and the $\theta y$ direction of slider 10 measured by the first position measurement system 30, controller 60 obtains the absolute position coordinates within the XY plane of the I sets of the first mark image and the second mark image, with the Abbe errors in the X-axis direction and the Y-axis direction of the first position measurement system 30 and measurement values in the X-axis direction and the Y-axis direction of the second position measurement system 50 serving as offsets.

Next, in step S320, controller 60 obtains overlay error (overlay displacement) between the first layer and the second layer, based on the absolute position coordinates of the first mark image and the absolute position coordinates of the second mark image that make a set with each other.

Next, in step S322, controller 60 judges whether the overlay error is mainly due to the exposure of the first layer or the exposure of the second layer based on the absolute position coordinates of the I first mark images and the absolute position coordinate of the I second mark images, for example, in the following manner. That is, controller 60 obtains displacement amount ($\Delta X1_i$, $\Delta Y1_i$) (i=1 to I) of the absolute position coordinate of the first mark image from the design position coordinate and displacement amount ($\Delta X2_i$, $\Delta Y2_i$) (i=1 to I) of the absolute position coordinate of the second mark image from the design position coordinate, and obtains the total sum $\Sigma X1_i$, $\Sigma X2_i$, $\Sigma Y1_i$, $\Sigma Y2_i$ when i=1 to I, for each of $\Delta X1_i$, $\Delta X2_i$, $\Delta Y1_i$, $\Delta Y2_i$. Then, controller 60 judges that when $\Sigma X1_i > \Sigma X2_i$ and $\Sigma Y1_i > \Sigma Y2_i$, the overlay error mainly occurs due to the exposure of the first layer in both the X-axis direction and the Y-axis direction, and when $\Sigma X1_i < \Sigma X2_i$ and $\Sigma Y1_i < \Sigma Y2_i$, the overlay error mainly occurs due to the exposure of the second layer in both the X-axis direction and the Y-axis direction. Also, controller 60 judges that when $\Sigma X1_i > \Sigma X2_i$ and $\Sigma Y1_i < \Sigma Y2_i$, the overlay error mainly occurs due to the exposure of the first layer for the X-axis direction and as for the Y-axis direction the overlay error mainly occurs due to the exposure of the second layer, and when $\Sigma X1_i < \Sigma X2_i$ and $\Sigma Y1_i > \Sigma Y2_i$, the overlay error mainly occurs due to the exposure of the second layer for the X-axis direction and as for the Y-axis direction the overlay error mainly occurs due to the exposure of the first layer.

Note that the judgment method described above is an example, and as long as controller 60 judges whether the overlay error is mainly due to the exposure of the first layer or the exposure of the second layer, based on the absolute position coordinates of the I first mark images and the absolute position coordinate of the I second mark images, the judgment method is not specified in particular.

As is obvious from the description so far, with the overlay measurement method according to the embodiment, an unconventionally significant effect can be obtained in which controller 60 of measurement device 100 can measure each of the absolute position coordinate of the first mark image and the absolute position coordinate of the second mark image, and based on these absolute position coordinates, can specify whether the overlay error is mainly due to the exposure of the underlayer or is mainly due to the exposure of the upper layer.

Note that while the case has been described so far where the exposure apparatus used for exposure of the underlayer and the exposure apparatus used for exposure of the upper layer were different, the embodiment is not limited to this, and for example, even if the exposure of the underlayer and the exposure of the upper layer were performed by exposure apparatus 200, by the series of processing in step S302 to S322 described above, the overlay accuracy can be controlled with high precision.

Note that since the overlay error (overlay displacement) between the first layer and the second layer is obtained in step S320 described above, step S322 is to be executed as necessary.

Note that with lithography system 1000 in FIG. 8, while only one measurement device 100 was provided, a plurality of measurement devices, such as two, may be provided as in the following modified example.

Modified Example

Figure 13:
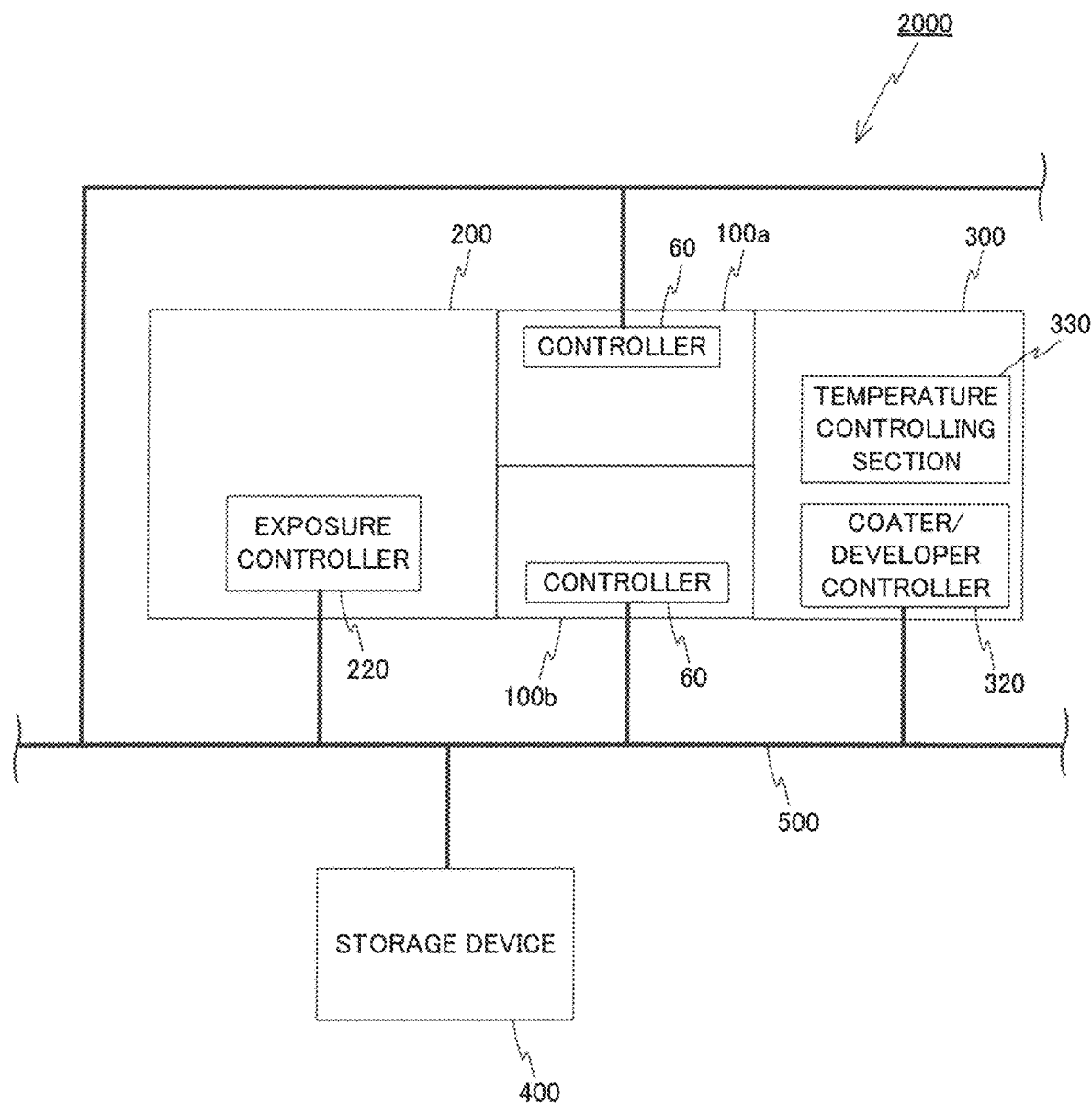
FIG. 13 is a view schematically showing an entire structure of a lithography system according to a modified example.

FIG. 13 schematically shows a structure of lithography system 2000 according to a modified example. Lithography system. 2000 is equipped with exposure apparatus 200, C/D 300, and two measurement devices 100a and 100b structured in a similar manner as measurement device 100 described earlier. Lithography system 2000 is installed in a clean room.

In lithography system 2000, two measurement devices 100a and 100b are arranged in parallel between exposure apparatus 200 and C/D 300.

Exposure apparatus 200, C/D 300, and measurement devices 100a and 100b that lithography system 2000 has are placed so that their chambers are adjacent to one another. Exposure controller 220 of exposure apparatus 200, coater/developer controller 320 of C/D 300, and controller 60 that measurement devices 100a and 100b each have are connected to one another via LAN 500, and communicate with one another. Storage device 400 is also connected to LAN.

In lithography system 2000 according to the modified example, since an operation sequence similar to lithography system 1000 described earlier can be set, an effect equivalent to that of lithography system 1000 can be obtained.

Adding to this, in lithography system 2000, a sequence can be employed in which measurement devices 100a and 100b are both used in alignment measurement (hereinafter referred to as post-measurement) subject to the wafer after PB previously described, as well as in alignment measurement (pre-measurement) subject to the wafer before resist coating similar to the description earlier. In this case, since pre-measurement subject to a wafer is performed in parallel with the series of wafer processing previously described subject to a wafer different from the wafer undergoing pre-measurement, throughput of the whole system is hardly reduced. However, for the first wafer, the time for pre-measurement cannot be overlapped with the series of wafer processing.

By comparing the position actually measured in the pre-measurement and the position actually measured in the post-measurement for the same wafer mark on the same wafer, position measurement error of the wafer mark occurring due to resist coating can be obtained. Accordingly, by correcting the position of the same wafer mark actually measured on wafer alignment subject to the same wafer by exposure apparatus 200 only by the position measurement error obtained above of the wafer mark occurring due to the resist coating, EGA measurement with high precision canceling the measurement error of the position of the wafer mark occurring due to the resist coating becomes possible.

In this case, in both pre-measurement and post-measurement, since the measurement results of the position of the wafer mark are affected by the holding state of the wafer holder, it is preferable to employ the sequence in which pre-measurement and post-measurement are performed on the same wafer using the same measurement device 100a or 100b.

However, one of the measurement devices 100a and 100b may be used exclusively for pre-measurement, and the other may be used exclusively for post-measurement. In this case, at the start-up time of each of the measurement devices 100a and 100b, a reference wafer is mounted on slider 10 for each device and marks on the reference wafer are detected with mark detection system MDS while the position of slider 10 is measured with the first position measurement system 30, and based on the detection results, the grid of the reference wafer is obtained in each of the measurement devices 100a and 100b in the manner similar to the case of wafer $W_0$ previously described. In this case, as the reference wafer, for example, a wafer can be used that has a mark (the mark can be any one of a line-and-space mark, a two-dimensional parallel cross mark, and a box mark) which can be measured by the resolution of mark detection system MDS formed in a specific pitch, e.g. 1 mm pitch, on the entire surface by etching or the like.

Then, the coordinate systems of the first position measurement system 30 in both devices are made even by removing the difference between the grids obtained of the reference wafers. The reason for this is since the grid of the same reference wafer is essentially the same, if there is an error between the grids obtained of the reference wafers, the cause is because there is an error between the reference coordinate systems that set the movement of slider 10 in each of the measurement devices 100a and 100b.

In this case, since the reference wafer is necessary when performing calibration between coordinate systems that set the movement of the sliders of the measurement devices, the scene that requires the reference wafer is only at the startup of the measurement devices, and the number and frequency of the wafers necessary is overwhelmingly smaller than the conventional art, and only the marks on the reference wafer have to be measured in each of the measurement devices and exposure on the reference wafer does not have to be performed. That is, since resist coating or removed is not performed, the reference wafer will not be damaged. The reference wafer may be stored carefully as a prototype. Note that after startup of each of the measurement devices, the reference wafer is basically not required.

In lithography system 2000, instead of the pre-measurement described above, the overlay displacement measurement previously described may be performed on the wafer that has been developed. In this case, one predetermined measurement device of the measurement devices 100a and 100b may be used exclusively for post-measurement, and the other may be used exclusively for overlay displacement measurement. Or, a sequence may be employed in which post-measurement and overlay displacement measurement are performed by the same measurement device 100a or 100b for the same wafer. In the latter case, pre-measurement may also be performed by the same measurement device for the same wafer.

Although it is omitted in the drawings, in lithography system 2000, the one predetermined measurement device of the measurement devices 100a and 100b may be placed on an opposite side to exposure apparatus 200 with respect to C/D 300. In this case, measurement device 100a is suitable for performing the overlay displacement measurement previously described on the wafer that has been developed, when considering the wafer carriage flow. Note that if the individual difference of the holding state of the holders between measurement devices 100a and 100b is hardly a problem, then measurement device 100a may be used for pre-measurement instead of overlay displacement measurement, or may be used for both overlay displacement measurement and pre-measurement.

Other than this, in addition to exposure apparatus 200 and C/D 300, three or more devices of measurement device 100 may be provided, with all devices connected in-line, and of the three measurement devices 100, two may be used for pre-measurement and post-measurement, and the remaining one measurement device may be used exclusively for overlay displacement measurement. Of the former two measurement devices, one may be used exclusively for pre-measurement and the other exclusively for post-measurement.

Note that in the second embodiment and the modified example described above, the case has been described where signal processor 49 processes detection signals of mark detection system MDS equipped in measurement devices 100, 100a, and 100b and sends measurement results only of wafer marks whose waveform of detection signals obtained as the detection results of mark detection system MDS are favorable to controller 60, and controller 60 performs EGA operation using the measurement results of the wafer marks, and as a result, exposure controller 220 performs EGA operation using position information of a part of the position information of the wafer marks selected from a plurality of wafer marks whose waveforms of detection signals obtained as the detection results of mark detection system MDS are favorable. However, the embodiment and the modified example are not limited to this, and signal processor 49 may send to controller 60 measurement results of remaining wafer marks excluding the wafer marks whose waveforms of the detection signals obtained as the detection results of mark detection system MDS are defective. Also, judgment of whether the detection signals obtained as the detection results of mark detection system MDS are favorable or not may be performed by controller 60 instead of the signal processor, and also in this case, controller 60 performs the EGA operation described earlier using only the measurement results of the wafer marks whose detection signals are judged favorable or remaining wafer marks excluding the wafer marks whose detection signals are judged defective. Then, it is desirable that exposure controller 220 performs the EGA operation described earlier using the measurement results of the wafer marks partly selected from the measurement results of the wafer mark used in EGA operation by controller 60.

Note that in the second embodiment and the modified example described above, while the example is described where measurement devices 100, 100a, and 100b are placed in between exposure apparatus 200 and C/D 300 instead of the in-line interface section, this is not limiting, and the measurement device (100, 100a, 100b) may be apart of the exposure apparatus. For example, the measurement device may be installed in the delivery section inside exposure apparatus 200 where the wafers before exposure are delivered. Also, in the case the measurement device (100, 100a, 100b) is installed inside the chamber of exposure apparatus 200 as a part of exposure apparatus 200, the measurement device may or may not have a chamber. Also, in the case the measurement device (100, 100a, 100b) is a part of the exposure apparatus, the measurement device may have a controller, or may not have a controller and can be controlled by the controller of the exposure apparatus. In any case, the measurement device is connected in-line with the exposure apparatus.

Note that in the embodiments above, while the case has been described where the substrate processing device is a C/D, the substrate processing device only has to be a device which is connected in-line with the exposure apparatus and the measurement device, and may be a coating apparatus (coater) that coats a sensitive agent (resist) on a substrate (wafer), a developing apparatus (developer) that develops the substrate (wafer) which has been exposed, or a coating apparatus (coater) and a developing apparatus (developer) which are each connected in-line with the exposure apparatus and the measurement device.

In the case the substrate processing device is a coating apparatus (coater), the measurement device can be used only for the post-measurement previously described, or for the pre-measurement and the post-measurement. In this case, the wafer after exposure is to be delivered to a developing apparatus which is not connected in-line with the exposure apparatus.

In the case the substrate processing device is a developing apparatus (developer), the measurement device can be used only for the post-measurement previously described, or for the post-measurement and the overlay displacement measurement. In this case, the wafer on which the resist is coated in advance at a different place is to be delivered to the exposure apparatus.

In the second embodiment and the modified example described above (hereinafter shortened to the second embodiment and the like), while the case has been described where the exposure apparatus is a scanning stepper, the case is not limiting, and the exposure apparatus may be a static type exposure apparatus such as a stepper or a reduction projection exposure apparatus of a step-and-stitch method that combines a shot area and a shot area together. The second embodiment and the like can furthermore be applied to a multi-stage type exposure apparatus that is equipped with a plurality of wafer stages, as is disclosed in, for example, U.S. Pat. Nos. 6,590,634, 5,969,441, 6,208,407 and the like. Also, the exposure apparatus is not limited to a dry type exposure apparatus previously described that performs exposure of wafer W directly without using liquid (water), and the exposure apparatus may be a liquid immersion type exposure apparatus that exposes a substrate via liquid as is disclosed in, for example, European Patent Application Publication No. 1420298, International Publication WO 2004/055803, International Publication WO 2004/057590, U.S. Patent Application Publication No. 2006/0231206, U.S. Patent Application Publication No. 2005/0280791, U.S. Pat. No. 6,952,253 and the like. Also, the exposure apparatus is not limited to an exposure apparatus used for manufacturing semiconductor devices, and may be, for example, an exposure apparatus for liquid crystals used for transferring a liquid crystal display device pattern onto a square glass plate.

Note that the disclosures of all publications, International Publications, U.S. patent application Publications, and U.S. patents related to exposure apparatuses and the like referred to in the embodiments above are incorporated herein by reference as a part of the present specification.

Semiconductor devices are manufactured through exposing a sensitive object using a reticle (mask) on which a pattern is formed with an exposure apparatus that structures a lithography system according to the embodiments described above and through a lithography step in which the sensitive object that has been exposed is developed. In this case, highly integrated devices can be manufactured at high yield.

Note that other than the lithography step, the manufacturing process of semiconductor devices may include steps such as; a step for performing function/performance design of a device, a step for making a reticle (mask) based on this design step, a device assembly step (including a dicing process, a bonding process, and a package process), and an inspection step.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A measurement device that acquires position information of marks formed on a substrate which is held on a substrate holder provided in an exposure apparatus and to which exposure processing is performed, before the exposure processing is performed, the device comprising:
    a first detection system that detects the marks formed on the substrate;
    a stage that is movable and configured to hold the substrate on a holding member different from the substrate holder;
    a position measurement system capable of acquiring position information of the stage; and
    a controller that obtains position information of each of a plurality of marks provided at each of a plurality of divided areas on the substrate, based on a detection result of the first detection system and the position information of the stage acquired by the position measurement system, the detection result being detected and the position information of the stage being acquired while the substrate is held on the holding member of the stage and before the substrate is held by the substrate holder of the exposure apparatus for the exposure processing, wherein
    the controller obtains, by statistical calculation, a polynomial expression that shows a correction amount from a design position of each of the plurality of divided areas, using the position information of each of the plurality of marks that has been obtained.

2. The measurement device according to claim 1, further comprising:
    a signal processor that processes signals of the marks detected by the first detection system, wherein
    the signal processor judges whether the signals are favorable or not, and provides the controller with a detection result only of the mark whose signal has been judged to be favorable.

3. The measurement device according to claim 1, wherein
    the controller outputs at least a part of the polynomial expression before exposure processing of the substrate by the exposure apparatus is performed, in order to use the at least a part of the polynomial expression in the exposure processing.

4. The measurement device according to claim 3, wherein
    the controller outputs a coefficient of a second-degree or a higher-degree term of the polynomial expression.

5. The measurement device according to claim 1, further comprising:
    a second detection system that detects a height of a surface of the substrate, wherein
    the controller acquires height distribution information of the surface of the substrate based on a detection result of the second detection system and the position information of the stage acquired by the position measurement system.

6. The measurement device according to claim 5, wherein
    the controller outputs the height distribution information before exposure processing of the substrate by the exposure apparatus is performed, in order to use the height distribution information in the exposure processing.

7. An exposure apparatus, comprising:
    a substrate stage that is movable and configured to hold a substrate on a substrate holder; and
    a controller that controls the substrate stage based on a correction amount acquired using the polynomial expression obtained by the measurement device according to claim 6 and the height distribution information, wherein
    the substrate for which the correction amount has been acquired is held on the substrate holder and is exposed with an energy beam.

8. A lithography system, comprising:
    the measurement device according to claim 6; and
    an exposure apparatus that performs exposure processing to the substrate held on the substrate holder, based on the height distribution information and the correction amount.

9. An exposure apparatus, comprising:
    a substrate stage that is movable and configured to hold a substrate on a substrate holder; and
    a controller that controls the substrate stage based on a correction amount acquired using the polynomial expression obtained by the measurement device according to claim 1, wherein
the substrate for which the correction amount has been acquired is held on the substrate holder and is exposed with an energy beam.

10. A lithography system, comprising:
the measurement device according to claim 1; and
an exposure apparatus that performs exposure processing to the substrate held on the substrate holder, based on the correction amount.

11. The measurement device according to claim 1, wherein
obtainment of the position information of the plurality of marks formed on the substrate is performed to the substrate before being coated with a sensitive agent.

12. A measurement device that acquires position information of marks formed on a substrate which is held on a substrate holder provided in an exposure apparatus and to which exposure processing is performed, before the exposure processing is performed, the device comprising:
a first detection system that detects each of a plurality of marks provided at each of a plurality of divided areas formed on the substrate;
a stage that is movable and configured to hold the substrate on a holding member different from the substrate holder;
a position measurement system capable of acquiring position information of the stage; and
a controller that obtains position information of each of the plurality of marks, based on a detection result of the first detection system and the position information of the stage acquired by the position measurement system, the detection result being detected and the position information of the stage being acquired while the substrate is held on the holding member of the stage and before the substrate is held by the substrate holder of the exposure apparatus for the exposure processing, wherein
the controller obtains, by statistical calculation, arrangement information that includes nonlinear arrangement information of the divided areas, using the position information of each of the plurality of marks that has been obtained.

13. The measurement device according to claim 12, wherein
the controller outputs the arrangement information before exposure processing of the substrate by the exposure apparatus is performed, in order to use the arrangement information in the exposure processing.

14. The measurement device according to claim 12, further comprising:
a second detection system that detects a height of a surface of the substrate, wherein
the controller acquires height distribution information of the surface of the substrate based on a detection result of the second detection system and the position information of the stage acquired by the position measurement system.

15. The measurement device according to claim 14, wherein
the controller outputs the height distribution information before exposure processing of the substrate by the exposure apparatus is performed, in order to use the height distribution information in the exposure processing.

16. An exposure apparatus, comprising:
a substrate stage that is movable and configured to hold a substrate on a substrate holder; and
an exposure controller that controls the substrate stage based on information regarding the substrate acquired by the measurement device according to claim 12, wherein
the substrate for which the information has been acquired is held on the substrate holder and is exposed with an energy beam.

17. A lithography system, comprising:
the measurement device according to claim 12; and
an exposure apparatus that holds the substrate on the substrate holder, and performs exposure processing of the substrate based on information regarding the substrate acquired by the measurement device.

18. The measurement device according to claim 12, wherein
obtainment of the position information of the plurality of marks formed on the substrate is performed to the substrate before being coated with a sensitive agent.

19. A measurement device that acquires position information of marks formed on a substrate which is held on a substrate holder provided in an exposure apparatus and to which exposure processing is performed, before the exposure processing is performed, the device comprising:
a first detection system that detects the marks formed on the substrate;
a stage that is movable and configured to hold the substrate on a holding member different from the substrate holder;
a position measurement system capable of acquiring position information of the stage; and
a controller that obtains position information of each of a plurality of marks provided at each of a plurality of divided areas on the substrate, based on a detection result of the first detection system and the position information of the stage acquired by the position measurement system, the detection result being detected and the position information of the stage being acquired while the substrate is held on the holding member of the stage and before the substrate is held by the substrate holder of the exposure apparatus for the exposure processing, wherein
the controller outputs the position information of the plurality of marks from which nonlinear arrangement information of the divided areas can be calculated by statistical calculation.

20. The measurement device according to claim 19, wherein
the controller outputs the position information of the plurality of marks before exposure processing of the substrate by the exposure apparatus is performed, in order to use the position information of the plurality of marks in the exposure processing.

21. The measurement device according to claim 19, further comprising:
a second detection system that detects a height of a surface of the substrate, wherein
the controller acquires height distribution information of the surface of the substrate based on a detection result of the second detection system and the position information of the stage acquired by the position measurement system.

22. The measurement device according to claim 21, wherein
  the controller outputs the height distribution information before exposure processing of the substrate by the exposure apparatus is performed, in order to use the height distribution information in the exposure processing.

23. An exposure apparatus, comprising:
  a substrate stage that is movable and configured to hold a substrate on a substrate holder; and
  an exposure controller that controls the substrate stage based on information regarding the substrate acquired by the measurement device according to claim 19, wherein
  the substrate for which the information has been acquired is held on the substrate holder and is exposed with an energy beam.

24. A lithography system, comprising:
  the measurement device according to claim 19; and
  an exposure apparatus that holds the substrate on the substrate holder, and performs exposure processing of the substrate based on information regarding the substrate acquired by the measurement device.

25. The measurement device according to claim 19, wherein
  obtainment of the position information of the plurality of marks formed on the substrate is performed to the substrate before being coated with a sensitive agent.

26. A measurement method of acquiring position information of marks formed on a substrate which is held on a substrate holder provided in an exposure apparatus and to which exposure processing is performed, before the exposure processing is performed, the method comprising:
  detecting the marks formed on the substrate, with a first detection system;
  holding the substrate on a holding member different from the substrate holder and moving the substrate, with a stage comprising the holding member;
  acquiring position information of the stage, with a position measurement system; and
  obtaining position information of each of a plurality of marks provided at each of a plurality of divided areas on the substrate, based on a detection result of the first detection system and the position information of the stage acquired by the position measurement system, the detection result being detected and the position information of the stage being acquired while the substrate is held on the holding member of the stage and before the substrate is held by the substrate holder of the exposure apparatus for the exposure processing, wherein
  a polynomial expression that shows a correction amount from a design position of each of the plurality of divided areas is obtained by statistical calculation, using the position information of each of the plurality of marks that has been obtained.

27. The measurement method according to claim 26, wherein
  whether signals of the marks detected by the first detection system are favorable or not is judged, and a detection result only of the mark whose signal has been judged to be favorable is used in the obtaining the position information.

28. The measurement method according to claim 26, wherein
  at least a part of the polynomial expression is output before exposure processing of the substrate by the exposure apparatus is performed, in order to be used in the exposure processing.

29. The measurement method according to claim 28, wherein
  a coefficient of a second-degree or a higher-degree term of the polynomial expression is output.

30. The measurement method according to claim 26, wherein
  the obtaining the position information of the plurality of marks formed on the substrate is performed to the substrate before being coated with a sensitive agent.

31. An exposure method, comprising:
  outputting at least a part of the polynomial expression to the exposure apparatus, by the measurement method according to claim 26; and
  performing exposure processing to a substrate held on the substrate holder with the exposure apparatus, using the at least a part of the polynomial expression that has been output.

32. The measurement method according to claim 26, wherein
  a height of a surface of the substrate is detected by a second detection system, and
  height distribution information of the surface of the substrate is acquired based on a detection result of the second detection system and the position information of the stage acquired by the position measurement system.

33. The measurement method according to claim 32, wherein
  the height distribution information is output before exposure processing of the substrate by the exposure apparatus is performed, in order to be used in the exposure processing.

34. An exposure method, comprising:
  outputting the height distribution information by the measurement method according to claim 32; and
  performing exposure processing to a substrate held on the substrate holder with the exposure apparatus, using the height distribution information that has been output.

35. A measurement method of acquiring position information of marks formed on a substrate which is held on a substrate holder provided in an exposure apparatus and to which exposure processing is performed, before the exposure processing is performed, the method comprising:
  detecting a plurality of marks provided at each of a plurality of divided areas formed on the substrate, with a first detection system;
  holding the substrate on a holding member different from the substrate holder and moving the substrate, with a stage comprising the holding member;
  acquiring position information of the stage, with a position measurement system; and
  obtaining position information of each of the plurality of marks, based on a detection result of the first detection system and the position information of the stage acquired by the position measurement system, the detection result being detected and the position information of the stage being acquired while the substrate is held on the holding member of the stage and before the substrate is held by the substrate holder of the exposure apparatus for the exposure processing, wherein arrangement information that includes nonlinear arrangement information of the divided areas is obtained by statistical calculation, using the position information of each of the plurality of marks that has been obtained.

36. The measurement method according to claim 35, wherein the arrangement information is output before exposure processing of the substrate by the exposure apparatus is performed, in order to be used in the exposure processing.

37. The measurement method according to claim 35, wherein the obtaining the position information of the plurality of marks formed on the substrate is performed to the substrate before being coated with a sensitive agent.

38. An exposure method, comprising:

calculating the arrangement information by the measurement method according to claim 35; and performing exposure processing to a substrate held on the substrate holder with the exposure apparatus, using the arrangement information.

39. The measurement method according to claim 35, wherein a height of a surface of the substrate is detected by a second detection system, and height distribution information of the surface of the substrate is acquired based on a detection result of the second detection system and the position information of the stage acquired by the position measurement system.

40. The measurement method according to claim 39, wherein the height distribution information is output before exposure processing of the substrate by the exposure apparatus is performed, in order to be used in the exposure processing.

41. An exposure method, comprising:

outputting the height distribution information by the measurement method according to claim 39; and performing exposure processing to a substrate held on the substrate holder with the exposure apparatus using the height distribution information that has been output.

42. A measurement method of acquiring position information of marks formed on a substrate which is held on a substrate holder provided in an exposure apparatus and to which exposure processing is performed, before the exposure processing is performed, the method comprising:

detecting the marks formed on the substrate, with a first detection system;

holding the substrate on a holding member different from the substrate holder and moving the substrate, with a stage comprising the holding member;

acquiring position information of the stage, with a position measurement system; and obtaining position information of each of a plurality of marks provided at each of a plurality of divided areas on the substrate, based on a detection result of the first detection system and the position information of the stage acquired by the position measurement system, the detection result being detected and the position information of the stage being acquired while the substrate is held on the holding member of the stage and before the substrate is held by the substrate holder of the exposure apparatus for the exposure processing, wherein the position information of the plurality of marks, from which nonlinear arrangement information of the divided areas can be acquired by statistical calculation, is output.

43. The measurement method according to claim 42, wherein the position information of the plurality of marks is output before exposure processing of the substrate by the exposure apparatus is performed, in order to be used in the exposure processing.

44. The measurement method according to claim 42, wherein the obtaining the position information of the plurality of marks formed on the substrate is performed to the substrate before being coated with a sensitive agent.

45. An exposure method, comprising:

obtaining position information of the plurality of marks, by the measurement method according to claim 42; and performing exposure processing to a substrate held on the substrate holder with the exposure apparatus, using the position information of the plurality of marks.

46. The measurement method according to claim 42, wherein a height of a surface of the substrate is detected by a second detection system, and height distribution information of the surface of the substrate is acquired based on a detection result of the second detection system and the position information of the stage acquired by the position measurement system.

47. The measurement method according to claim 46, wherein the height distribution information is output before exposure processing of the substrate by the exposure apparatus is performed, in order to be used in the exposure processing.

48. An exposure method, comprising:

outputting the height distribution information by the measurement method according to claim 46; and performing exposure processing to a substrate held on the substrate holder with the exposure apparatus using the height distribution information that has been output.

* * * * *